United States Patent [19]
Doggett et al.

[11] Patent Number: 5,148,595
[45] Date of Patent: Sep. 22, 1992

[54] METHOD OF MAKING LAMINATED ELECTROSTATIC PRINTHEAD

[75] Inventors: David E. Doggett, Boulder Creek; Brian J. Dahlquist, Palo Alto, both of Calif.

[73] Assignee: Synergy Computer Graphics Corporation, Santa Clara, Calif.

[21] Appl. No.: 678,416

[22] Filed: Apr. 4, 1991

Related U.S. Application Data

[63] Continuation-in-part of Ser. No. 516,007, Apr. 27, 1990, abandoned.

[51] Int. Cl.$^5$ .............................................. H05K 3/34
[52] U.S. Cl. ...................................... 29/840; 29/592.1; 346/155
[58] Field of Search .................. 29/825, 600, 830; 346/155, 76 PH

[56] References Cited

U.S. PATENT DOCUMENTS

| | | | |
|---|---|---|---|
| 3,235,942 | 2/1966 | Howell et al. | 29/592.1 |
| 3,267,485 | 8/1966 | Howell et al. | 346/155 X |
| 3,578,946 | 5/1971 | Colello | 29/825 X |
| 3,693,185 | 9/1972 | Lloyd | 396/155 X |
| 3,718,936 | 2/1973 | Rice, Jr. | 29/830 X |
| 3,903,594 | 9/1975 | Koneval | 346/155 X |
| 4,415,403 | 11/1983 | Bakewell | 346/155 X |
| 4,920,363 | 4/1990 | Hack | 346/155 |

*Primary Examiner*—Carl J. Arbes
*Attorney, Agent, or Firm*—Skjerven, Morrill, MacPherson, Franklin & Friel

[57] ABSTRACT

In a printhead for an electrostatic printer, the printhead styli are formed on a monolithic substrate, such as a printed circuit board material. Each stylus has its own driver circuit incorporated into one or more integrated circuit die which are mounted directly on the monolithic substrate, and electrically connected to traces formed on the printed circuit board. The styli are the ends of the traces as formed on the edge of the substrate. The integrated circuit die are connected to the traces by wire bonding or TAB bonding. The printhead is implemented in monoscan, biscan, triscan, and various other configurations. To fabricate the printhead, the printed circuit board material is ground to a precise thickness and conductive traces are photolithographically etched in copper foil laminated thereto. Using adhesives, the printhead is laminated together including supporting side plates, and in some embodiments multiple substrates, which are laminated together directed or by spacers therebetween.

23 Claims, 52 Drawing Sheets

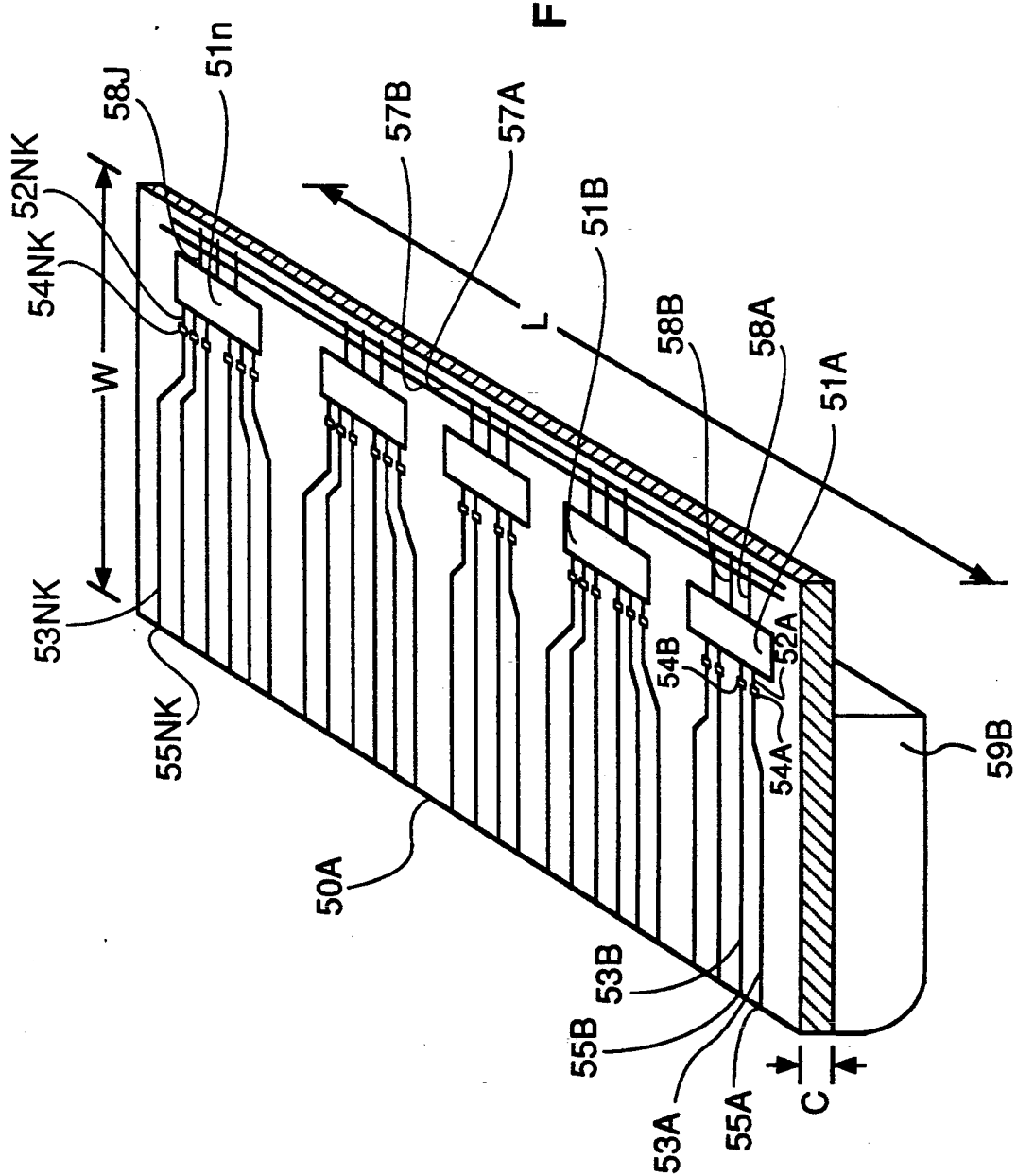

FIG. 5(b)

- O1
- O2 — DATA IN/OUT
- O3
- O4 — DIR
- O5
- O6
- O7 — NCTL
- O8
- O9 — PCTL
- O10
- O11
- O12 — VDD
- O13
- O14
- O15 — LE
- O16
- O17
- O18 — CLK
- O19
- O20 — BLK
- O21
- O22
- O23 — D
- O24
- O25
- O26 — VPP (-250)
- O27
- O28
- O29 — GND (-500)
- O30
- O31 — DATA IN/OUT
- O32

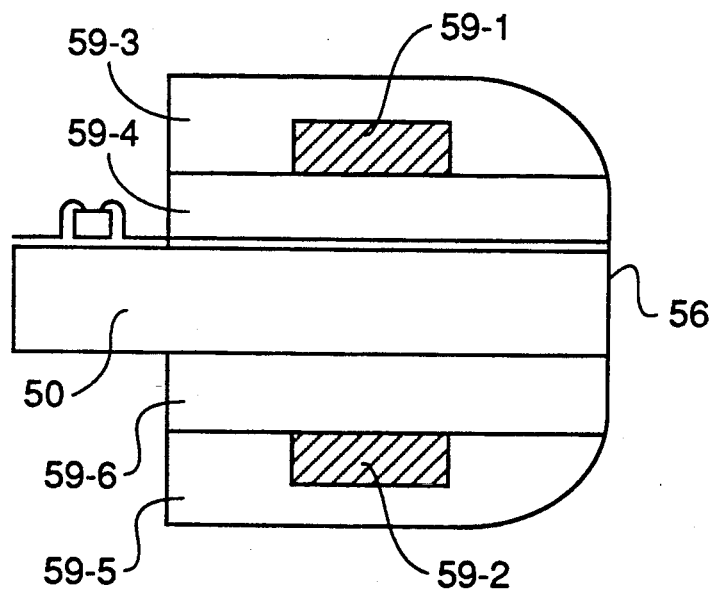

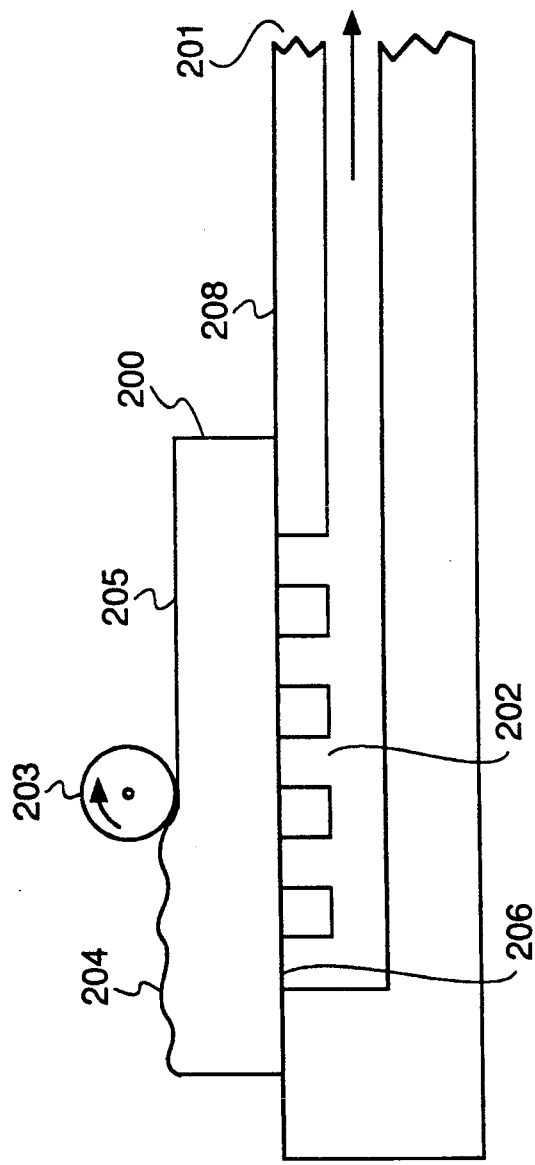
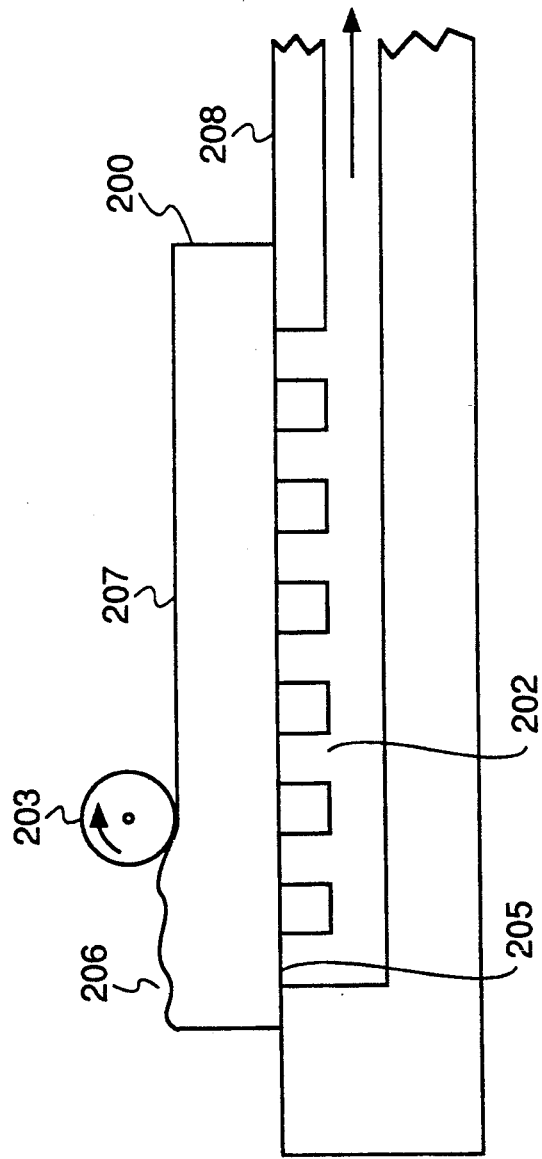

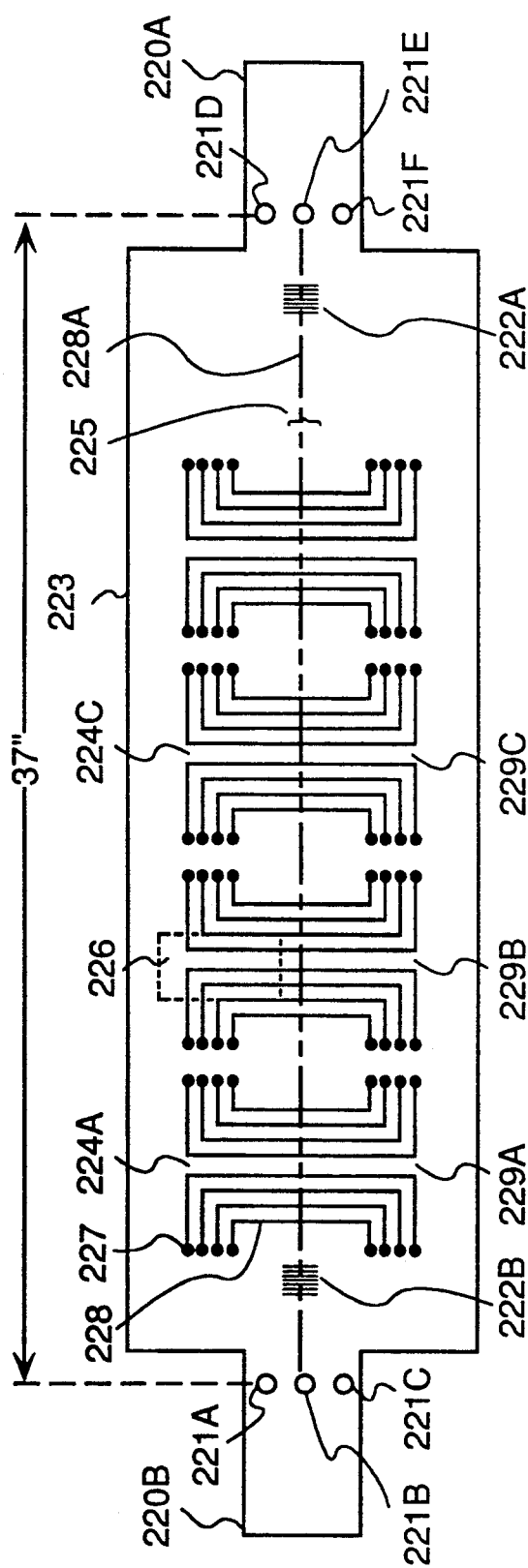
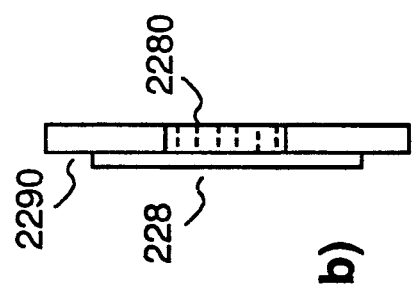
FIG. 22(a)
FIG. 22(b)

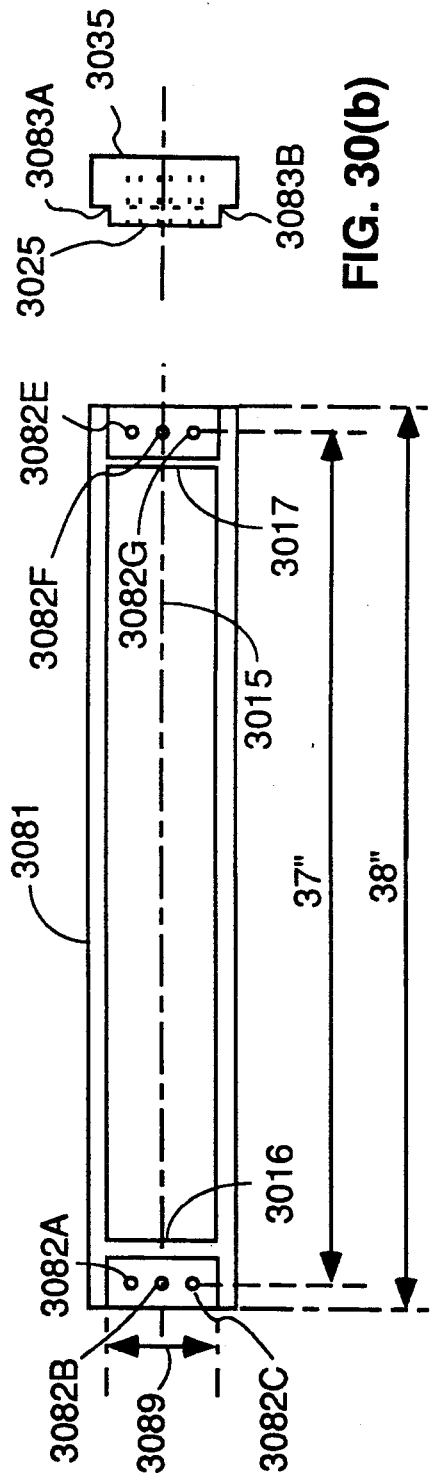
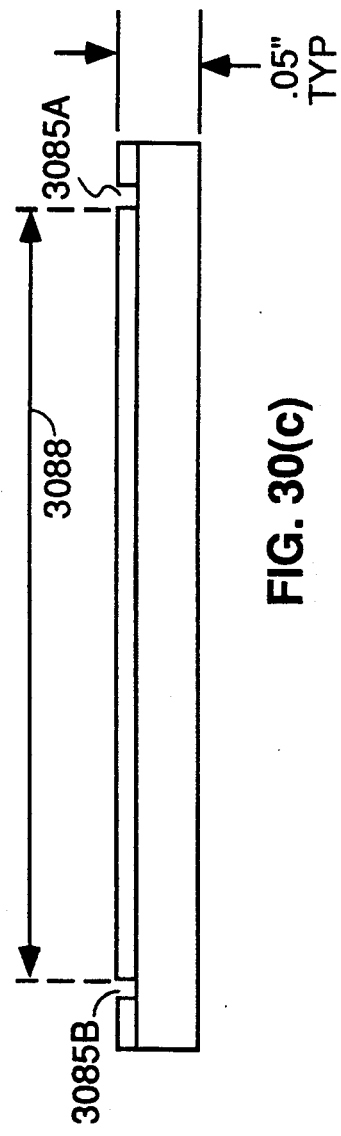
FIG. 30(a)
FIG. 30(b)
FIG. 30(c)

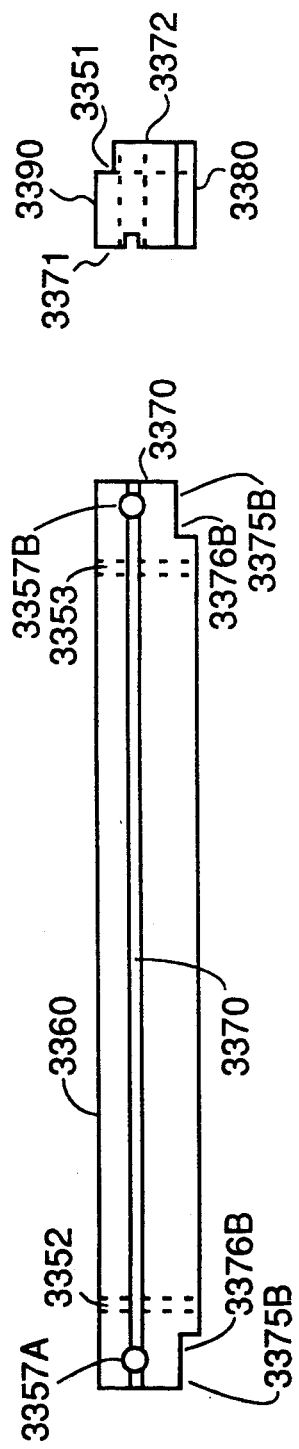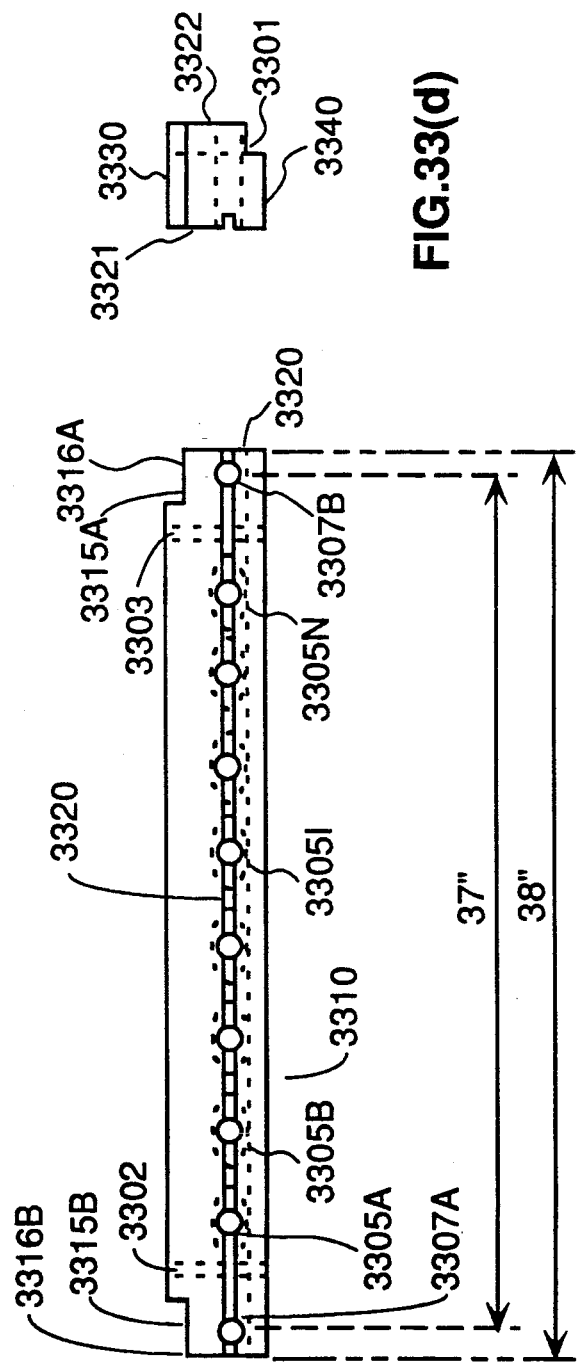
FIG.33(a) FIG.33(b) FIG.33(c) FIG.33(d)

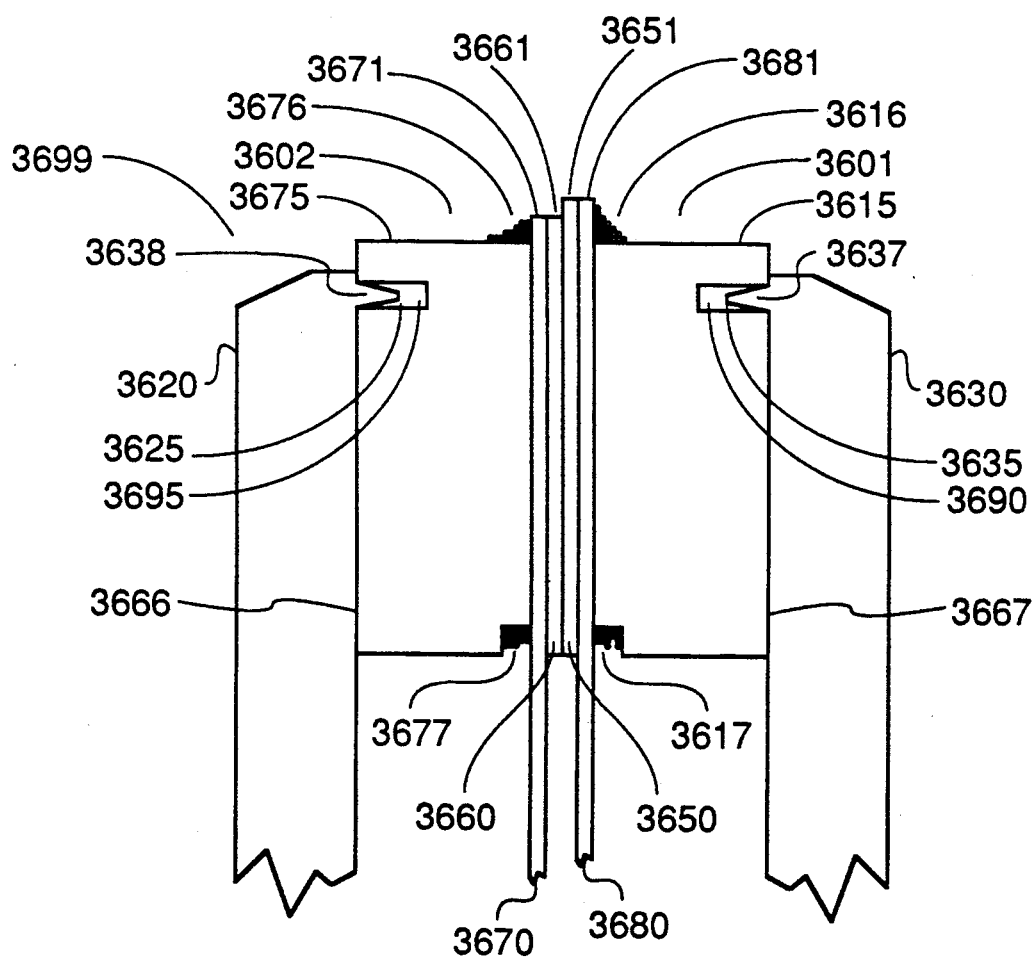

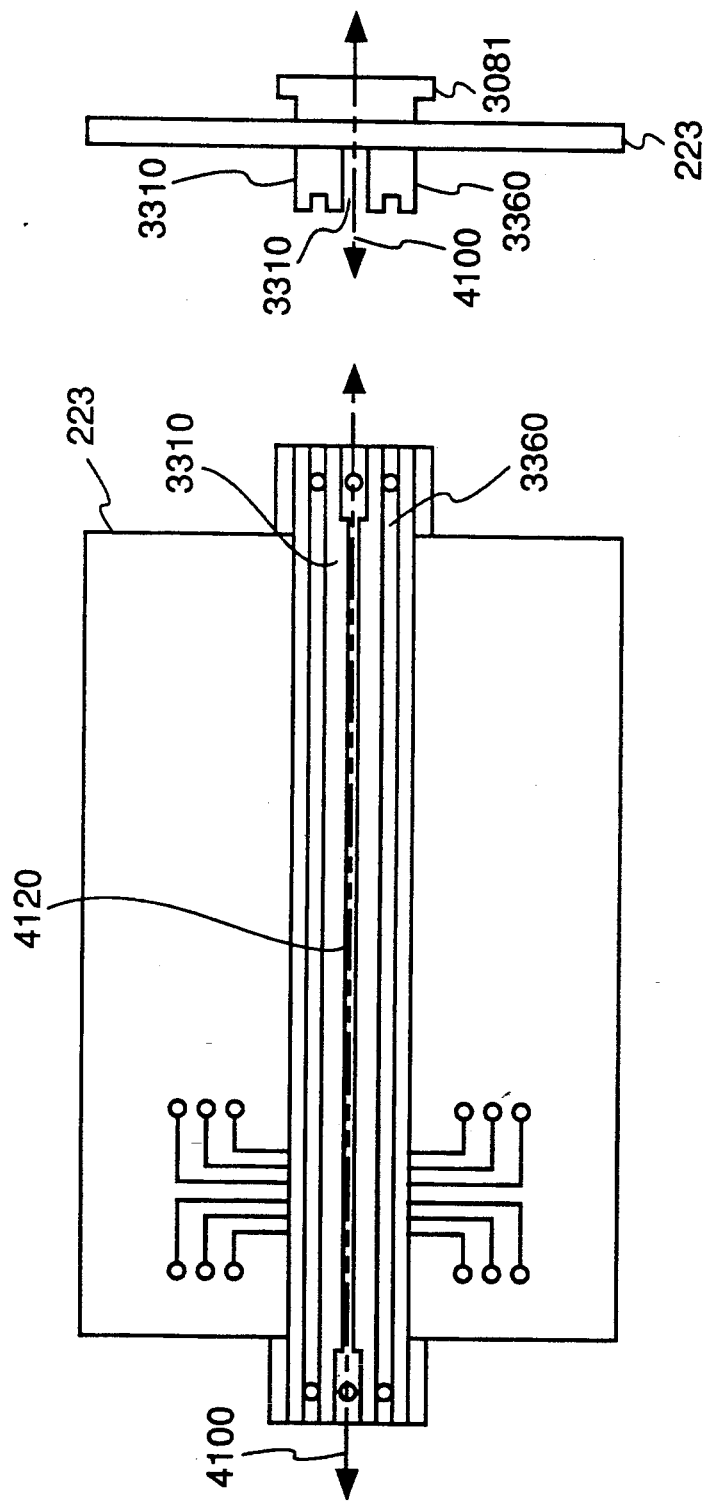

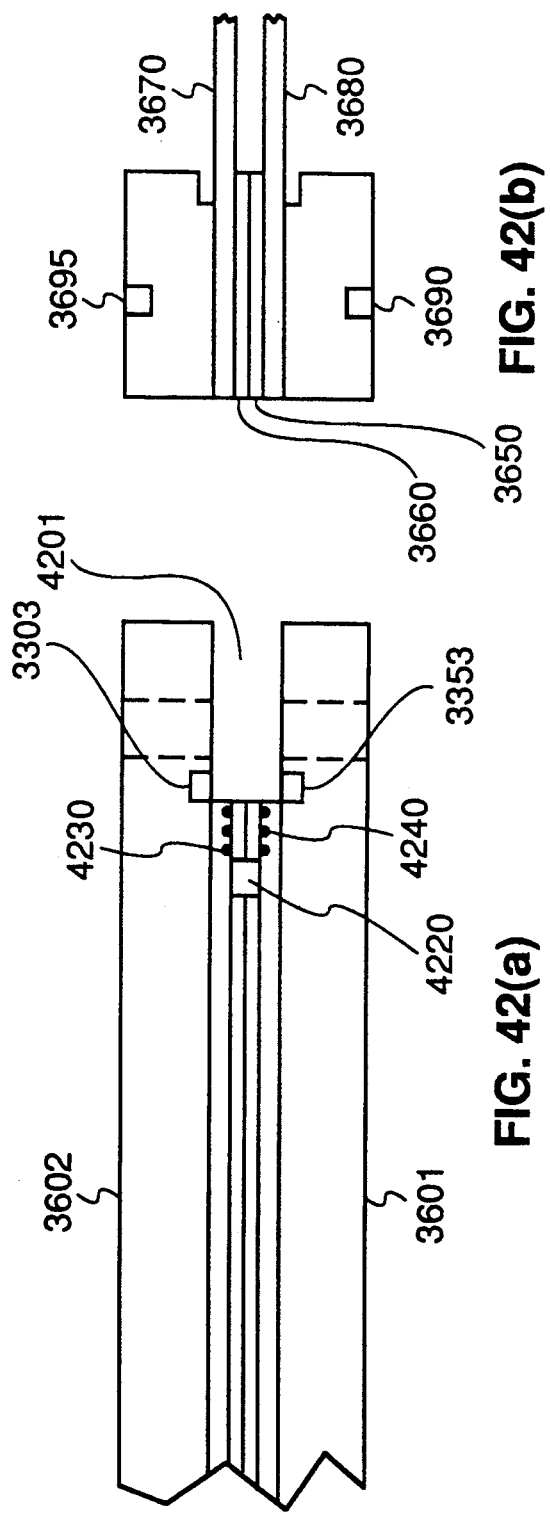

METHOD OF MAKING LAMINATED ELECTROSTATIC PRINTHEAD

CROSS REFERENCE TO RELATED APPLICATION

This application is a continuation-in-part of copending and commonly owned U.S. patent application Ser. No. 07/516,007, filed Apr. 27, 1990, entitled "Electrostatic Printhead", now abandoned.

BACKGROUND OF THE INVENTION

1. Field of the Invention

This invention relates to high voltage electrostatic printers used for printing high definition graphics and more particularly to a unique electrostatic printhead with the driver circuitry incorporated in the printhead close to the styli, and to a method to manufacture such a printhead.

2. Description of the Prior Art

In high voltage electrography an electrode 10 (called a stylus, see FIG. 1(a)) is positioned in a spaced apart relationship, a selected distance (typically 7 to 10 microns) from the exposed surface of a dielectric coating 12C of a print medium 12. When a sufficient voltage V (for example, 600 volts) is impressed between electrode 10 and media 12, an electrical breakdown of the air in gap 11 will occur and charge will flow across gap 11 and deposit on the surface of dielectric coating 12C of medium 12. Medium 12 typically consists of a dielectric layer 12C located on the surface of a conductive layer 12B (not necessarily present) which in turn is formed on the base layer 12A. Base layer 12A can be any material on which a print is to be formed such as paper or polyester film for example, and may or may not be electrically conductive.

FIG. 1(b) depicts a typical prior art printhead 20 with styli 21-1 through 21-k through 21-K (where K is a selected integer representing the total number of wires in sheet 22 and k is an integer given by $1 \leq k \leq K$, wire sheet 22 (with the ends of the wires 27-1 to 27-K in wire sheet 22 forming the styli 21-1 through 21-K), support block 23 surrounding and holding styli 21-1 to 21-K, and support plates 24a, 24b fixed to, supporting and holding block 23. An end surface 23a is formed by polishing the assembly to form the finished recording head with the ends of the wires 27-1 through 27-K exposed, forming styli 21-1 through 21-K. Wire sheet 22 (typically composed of thousands of parallel wires) is sectioned into m groups (such as group 25) of N wires each (where N is a selected integer shown in FIG. 2 as ten (10) but more typically a larger number such as 64, 128, 256, or 512) for connection to multiplexing circuitry (not shown). Such multiplexing circuitry is described in U.S. Pat. No. 3,653,065 issued to Brown. To print, medium 26, on which images are to be formed, is moved as shown past end surface 23a of printhead 20 such that medium 26 is kept in a spaced apart relationship to end surface 23a as described before.

Where coloration is desired on print medium 26 at a particular location, the stylus opposite this location is energized to a high voltage and charge is deposited on layer 12C of print medium 26. This charge image is subsequently toned in a manner well known in the art to produce the desired coloration.

The width of gap 11 (see FIG. I(a)) between stylus 10 (which is the end 21-k of one of the wires 27-k in wire sheet 22) and dielectric 12C is typically maintained by the surface roughness of the medium 12, although spacing can be accomplished through the use of spacer particles as taught in U.S. Pat. No. 3,711,859, issued to Brown, et al. The spatial distribution of the charge deposited on the surface of dielectric 12C approximates the shape but typically is larger than the exact cross-sectional area of the tip of stylus 10. A stylus with a circular cross-section thus forms a round area of charge distribution which becomes a round printed dot upon subsequent toning, while a stylus with a rectangular cross-section will tend to form a rectangular printed dot upon toning of dielectric layer 12C.

To control this charge deposition, a high voltage switch 14 (FIG. 1(a)) is provided between stylus 10 and voltage source 15. Another switch 16 is provided between conductive multiplexing counter electrode 13 and a second voltage source 17 of opposite polarity to voltage source 15. If each voltage source delivers approximately one half the required voltage to effect printing then switch 14 and switch 16 (typically high voltage transistors) must be turned on simultaneously to deposit charge on medium 12. If either switch 14 or switch 16 is left open, charge is not deposited.

The above described multiplex printing method can be avoided if a high voltage switch is supplied to each wire 27-1 through 27-K (FIG. 1(b)) and a voltage is supplied to each switch that is independently capable of effecting printing so that the voltage of each stylus end 21-1 through 21-K is independently controlled. In an electrostatic printer using one switching transistor for each stylus the number of switching transistors is equal to the number of styli and can become very large for printheads that are long or for printheads that have many styli per unit lengths. If individual transistors are used in such a printhead the printhead can become very expensive. A typical printhead used in electrostatic printers of the prior art is 36 inches (90 centimeters) long and uses 14,400 styli (K=14,400), spaced 400 styli per inch, to achieve a resolution of 400 dots per inch. Thus, 14,400 high voltage transistors would be required; this could be prohibitively expensive. Accordingly, in the prior art, a single switching transistor has been connected to a plurality of styli in the printing head to reduce the number of switching transistors required. In the prior art, a corresponding plurality of multiplexing counter electrodes (not shown) has also been provided, each such counter electrode being adjacent a selected number of styli 21-k, . . . , 21-(k+N), where N is as previously defined. Each counter electrode is energized in sequence so that a line of selected charge deposition is formed on the print medium only when all the counter electrodes have been sequentially energized. Each styli switching transistor 14 (see FIG. 1(a)) connects one voltage source 15 to a plurality of styli but only one of the plurality of styli is adjacent any particular counter electrode 13. Thus a given styli switching transistor, when turned on, applies a voltage to all styli connected to it but only the single stylus 10 adjacent the counter electrode 13, which is energized, has a sufficient voltage difference between it and the media to enable the air in gap 11 to brake down and conduct such that stylus 10 applies a charge to the adjacent medium 12. Any or all styli switching transistors 14 are capable of being activated each time a single counter electrode 13 is activated by turning on counter electrode switching transistor 16.

Multiplexing of the type described above is made possible by the fact that only a very short time (typically less than 100 microseconds) is required to place enough charge on medium 12 such that the resultant tone damage will possess sufficient optical density. While short printing pulses are possible, such a system places requirements on the conductivity of the print media layers 12A and 12B that narrows its operating environmental range, and increases the cost of the media.

In the structure and method described above, a portion of the voltage required to print on medium 12 is applied to base layer 12A by a sliding ohmic contact referred to earlier as counter electrode 13. The other portion of the required voltage is applied to stylus 10 which is a short distance from dielectric 12C so that the resultant electric field across medium 12 is about 600 volts which is sufficient to cause printing.

Other multiplexing systems utilize capacitive coupling through the dielectric layer 12C and into the conductive layers 12A or 12B in order to provide that portion of the voltage that would normally be supplied by the voltage on electrode 13 by ohmic connection to the base layer 12A. In this configuration (see FIG. 1(c)) the counter electrodes 13A and 13B are mounted adjacent to the styli. Multiplexing still functions in exactly the same manner as described above. This prior art is illustrated in U.S. Pat. No. 4,271,417 to Blumenthal et al., U.S. Pat. No. 3,653,065 to Brown, and U.S. Pat. No. 3,979,760 to Taduchi.

The systems as described above are difficult to fabricate because such styli arrays have 14,400 wires for a 36 inch head that has a resolution of 400 dots per inch. The prior art multiplexed printheads (see FIG. 1(b)) are typically fabricated from wires 27-1 to 27-K surrounded by to Rutherford et al. for a discussion on fabrication of these prior art styli array printheads. See also U.S. Pat. No. 4,131,986 to Esciva et al., U.S. Pat. No. 3,693,185 to Lloyd, and U.S. Pat. No. 3,624,661 to Shebanow and Borelli. Such printheads are often hand wired; it takes a worker up to 80 hours to wire each printhead, so each printhead is quire expensive to manufacture. In a single pass color printer there can be four printheads (sometimes called "charging units") per printer, one charging unit for each color to be printed, thus multiplying the cost.

Those skilled in the art have attempted other approaches to constructing printheads. In one approach, the traces electrically connecting together the styli in each styli group are photolithographically formed on one side of the printed circuit board, and type styli are formed on the other side. See U.S. Pat. No. 4,163,980 to Angelbeck et al. for a description of one embodiment of this approach and U.S. Pat. No. 3,903,594 to Koneval. This approach has been used to make small (eleven inches long) printheads incorporating two stylus arrays with a resolution of 100 dots per inch (dpi). The resulting printhead has a resolution of 200 dpi. Constructing such multiplexed printed circuit printheads is especially difficult because in order to make connections between styli of the different multiplexing groups, very small diameter holes have to be formed in the substrate. In addition, the traces that connect the styli groups generally run parallel for long distances undesirably increasing lead capacitance, and finally the print styli need to be as thick as they are wide.

A result of the above-described prior art is that a plurality of styli in each printhead are electrically connected together (multiplexed). Because of the large number of styli in each group, each styli group has high capacitance, and so requires a high power driver circuit (previously referred to as switching transistors) to bring each stylus in the group up to the desired voltage in the short times allowed as previously discussed. Typically, the driver circuits required to drive the high capacitance printheads have an output current capability of 100 milliamps and must operate at 400 volts to have adequate operating margin.

The use of multiplexing technology introduces a set of printing artifacts that do not occur if the printhead has one high voltage switch connected to each individual stylus. The terms used to describe these prior art artifacts are terms such as "nib (styli) group boundary striations", "ghosting", and "flaring". Nib group boundary striations are undesirable variations in the print density which occur when the printer is printing a large solid area and it is believed are caused by the styli in the center of each multiplexing group competing for charging current with their neighbors. A multiplexing group consists of the styli adjacent one counter electrode, (such as counter electrode 13 in FIG. 1(a)). The styli on the ends of each group have access to a larger reservoir of the charge induced on the substrate by counter electrode 13. The styli in the center of the group must compete with their simultaneously charging neighbors for this finite amount of charge in the conductive layer of the print medium 12. The effect is to provide higher charging currents to styli at the ends of each multiplexing group. Thus there is a higher amount of charge deposited on the print medium by the styli at the ends of each group. This results in, undesirably, printing of a light area on the medium at the center of each styli group and a dark area on the medium at the edges of the group.

Ghosting is caused by energized styli that are not adjacent the energized counter electrode nevertheless discharging to the medium and creating an undesirable charge image on the medium. In this case, the voltage in the print medium supplied by the counter electrode is conducted laterally over a large enough distance to reach non-adjacent, energized styli.

Flaring causes undesirable dot size print variation on the medium and is thought to be associated with high printhead capacitance. Flaring is believed to be an uncontrolled discharge of electrons flowing across the stylus-medium air gap, resulting in charge being deposited on the medium surface in areas other than desired. This dot size print area change results in a color density variation.

The prior art printheads exhibit other deficiencies. Due to the many lateral interconnections on the PCB (printed circuit board) the head extends a large distance below the media (i.e. has a high aspect ratio). The PCB multiplexed head must have many connections to connect the drive transistors to the styli. The electronics for the printheads (i.e. the multiplexing circuitry) is relatively expensive and complex due to the multiplexing feature. Since each printhead is a wire sheet, it is difficult to properly align the thousand of wires in the sheet, and hence the styli.

Various head configurations are known in the art. In configurations known as "monoscan", the styli are in a single row and the styli are necessarily very close together. In a high resolution printhead, i.e. 400 dots per inch or more, high voltage is often impressed on one stylus and not on the next stylus, so therefore electric current often arcs from stylus-to-stylus due to the closeness of adjacent styli. Over a period of time, arcing damages or erodes the face of each stylus, affecting print quality negatively because the printed dot size changes as the cross-sectional area of each stylus changes with this erosion.

Therefore, the industry has developed biscan (two rows of styli), triscan (three rows of styli) and quadscan (four rows of styli) printheads, so as to better space apart the styli, with the styli in each row staggered in relation to those in the other rows, so that the rows taken together can print across the width of the printhead with the desired density. This reduces or eliminates the arcing problem. Heads of these types can be seen in U.S. Pat. Nos. 4,419,679 to Rutherford, 4,165,514 to Ishima, 4,163,980 to Angelbeck et al., 4,131,986 to Esciva et al., and 3,958,251 to Borelli.

In a biscan head, conventionally, a time delay is provided electronically between a first set of data which is intended to control the first styli row and a second set of data intended to control the second styli row so that the printed dots in the two rows correctly interleave to form a complete image. Similar types of delays are employed with quadscan printheads. Such a time delay method is termed buffering and requires a type of memory in order to store the bits to be printed until the paper has moved into proper position.

Therefore prior art printheads suffer from the deficiencies of high cost, printing defects, complexity, and the need for expensive media.

SUMMARY OF THE INVENTION

This invention overcomes certain of the above described problems of the prior art. In accordance with the present invention, one driver circuit is provided for each stylus in an electrostatic printing head. The use of a single driver circuit per stylus allows each stylus to discharge for a relatively long period of time, thus allowing the media parameters to be relaxed and the cost of the media to be reduced. The styli are formed on a monolithic substrate, and the driver circuits and their associated logic circuitry are formed as parts of integrated circuit die mounted on the styli substrate, thereby reducing the length of the leads between the driver circuits and the styli and thus reducing the capacitance associated with each lead. Each integrated circuit die is mounted directly on the substrate without use of a conventional integrated circuit package in one embodiment. The styli are formed by well known photolithographic processes on the surface of inexpensive PCB material such as fiber glass epoxy substrate material available from many vendors.

The styli substrate material must provide high electrical resistance to styli that are closely spaced (e.g. on the order of 0.0025 inch between conductive styli traces). Also the styli substrate should not degrade rapidly in the presence of the discharge that occurs when a stylus transfers charge to the print media. Glass epoxy laminate material identified commercially as FR4 and available from several vendors performs adequately.

In accordance with the present invention, the styli are formed at the edge of the insulating substrate and comprise the ends of conductive, spaced apart traces formed on the surface of the substrate. Each stylus is a narrow rectangle in cross-section, formed in one embodiment as described in copending patent application, incorporated herein by reference, Ser. No. 07/345,152, filed Apr. 28, 1989, now abandoned entitled "Electrostatic Printer Head Structure and Styli Geometry." Thus, the traces are relatively wide but thin. This stylus shape, coupled with the long write times permitted by the single driver circuit per stylus, enables printing by sweeping out rectangular (preferably square) dots. This is an improvement over the round dots of the prior art because it provides for a better dynamic range of color as is described in copending patent application Ser. No. 07/345,327, filed Apr. 28, 1989 M-815 issued as U.S. Pat. No. 5,062,002 entitled "Single Pixel Gray Level Control in a Color Electrostatic Plotter", incorporated by reference herein.

The conductive trace connecting each stylus to the appropriate integrated circuit is 0.5 inch or less (1.2 cm. or less) to 2 inches (5 cm.) in length. A typical length is one inch (2.5 cm.) or less. This is much shorter than in the prior art and thus substantially reduces the capacitance associated with each stylus. Each driver circuit typically provides a current on the order of one to ten microamps. Because of the low styli current requirement, the drive transistors can be made particularly small. The small device size of the integrated circuit transistors also reduces capacitance. Each driver circuit provides a 250 volt push-pull drive capability in one embodiment, without the need for electronic components other than those in the integrated circuit die.

The present invention therefore provides numerous advantages over the prior art, including:

Reducing the need for high current to the driver transistors, and thus reducing the power supplied to the printhead. The printhead has less capacitance than the prior art device due to the short traces and thus uses less charging current.

Allowing a long pulse length to the styli, since there is no multiplexing of styli, and thus allowing lower voltage on the styli by charging the medium over a longer time, or alternatively allowing higher print speed for a given voltage.

Reducing flaring at the styli tips as a result of lower printhead capacitance.

Improving print quality by eliminating nib group boundary striations.

Permitting use of other than the standard but expensive electrographic print media. With the present invention it is possible, due to the long write times, to reduce the conductivity of the conductive layer in the media, thereby reducing media cost.

Permitting use in a printhead of a substrate with traces and styli produced by inexpensive photolithography techniques instead of the expensive prior art wire bundle arrays and conventionally multiplexed printed circuit board printheads.

Eliminating the need for a series of multiplexed counter electrodes by using only one counter electrode for the entire printhead.

Reducing manufacturing cost over the prior art, since the electronics used in the present invention can be integrated circuit semiconductor devices costing very little per driver circuit.

Improving the accuracy of trace location on the substrate.

In accordance with one embodiment of the present invention, an electrostatic printer uses a 36 inch (90 cm) wide printhead having 14,400 print styli together with 14,400 driver circuits. The driver circuits are in integrated circuit (IC) form; each IC includes, for example, sixty-four (or some other convenient number) of driver circuits. Each IC also includes logic and serial-to-parallel converters.

Various head configurations are possible in accordance with the invention as described below.

BRIEF DESCRIPTION OF THE DRAWINGS

FIG. 2 shows a perspective view of one embodiment of the invention.

FIGS. 5(a), 5(b) show pin assignments for integrated circuits of two embodiments of the invention.

FIG. 6(c) shows a modification of the embodiment of FIG. 6(a).

There is no FIG. 18.

FIGS. 19(a), 19(b), 19(c), and 19(d) show steps to fabricate a printhead substrate.

FIGS. 20(a), 20(b), 20(c), and 20(d) show steps to fabricate another embodiment of a printhead substrate.

Figure 21:
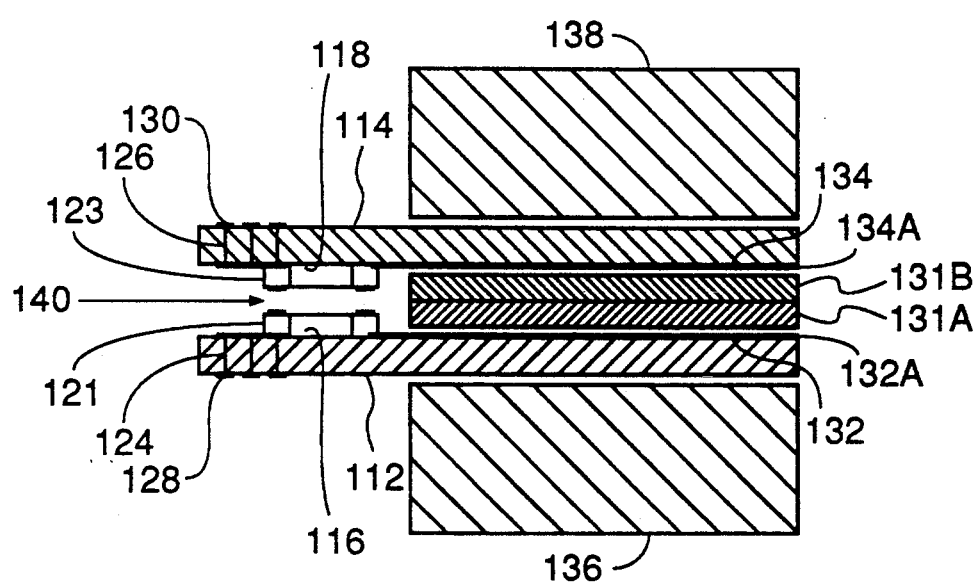

FIG. 21 shows an additional printhead embodiment.

FIGS. 22(a) and 22(b) show respectively a plan and a side view of traces on a printhead substrate.

Figure 23:
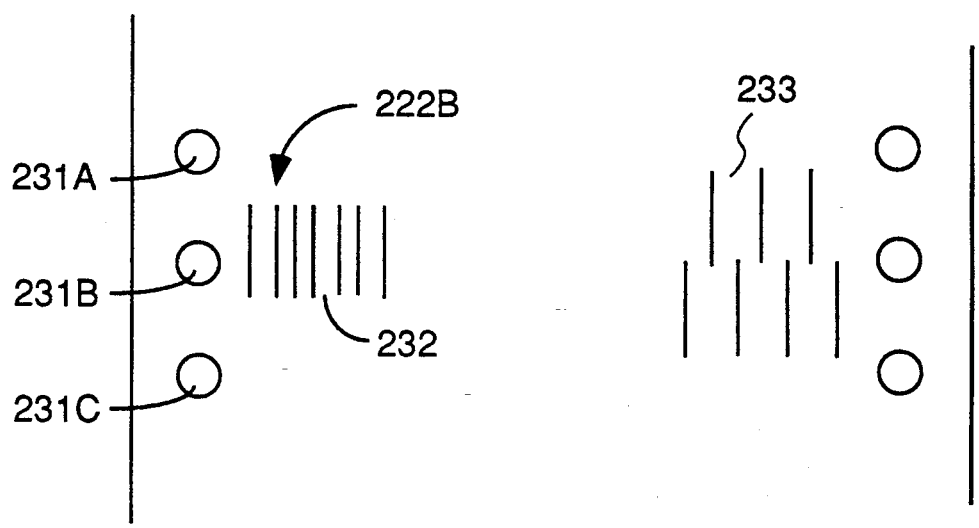

FIG. 23 shows alignment traces on a printhead substrate.

Figure 24:
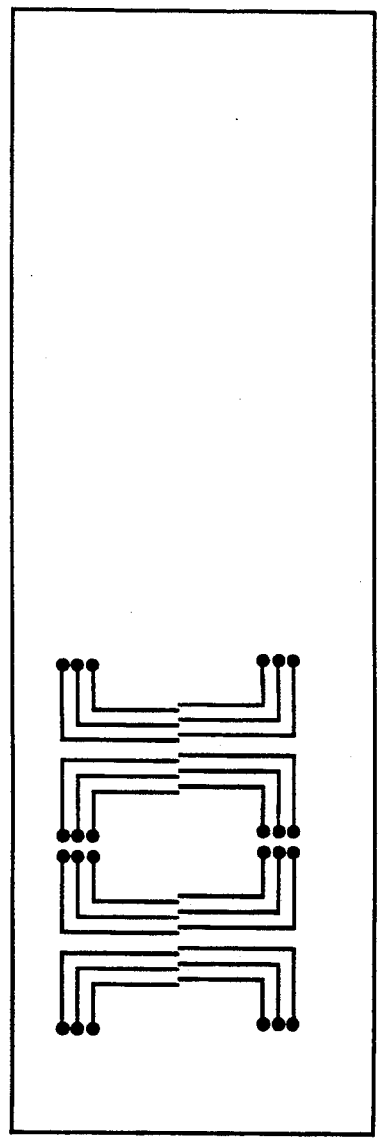

FIG. 24 shows traces on a printhead substrate.

Figures 25A, 25B:
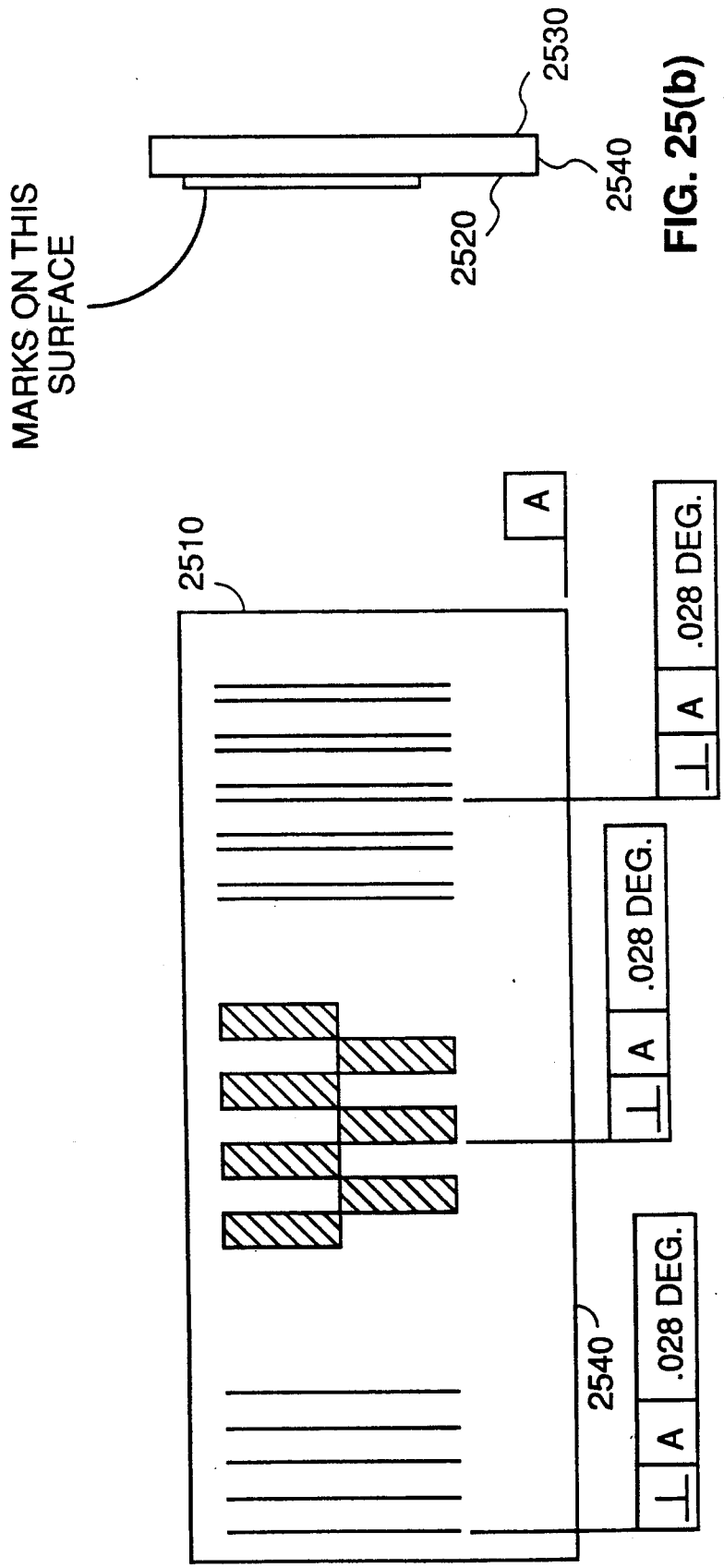
Figure 25C:
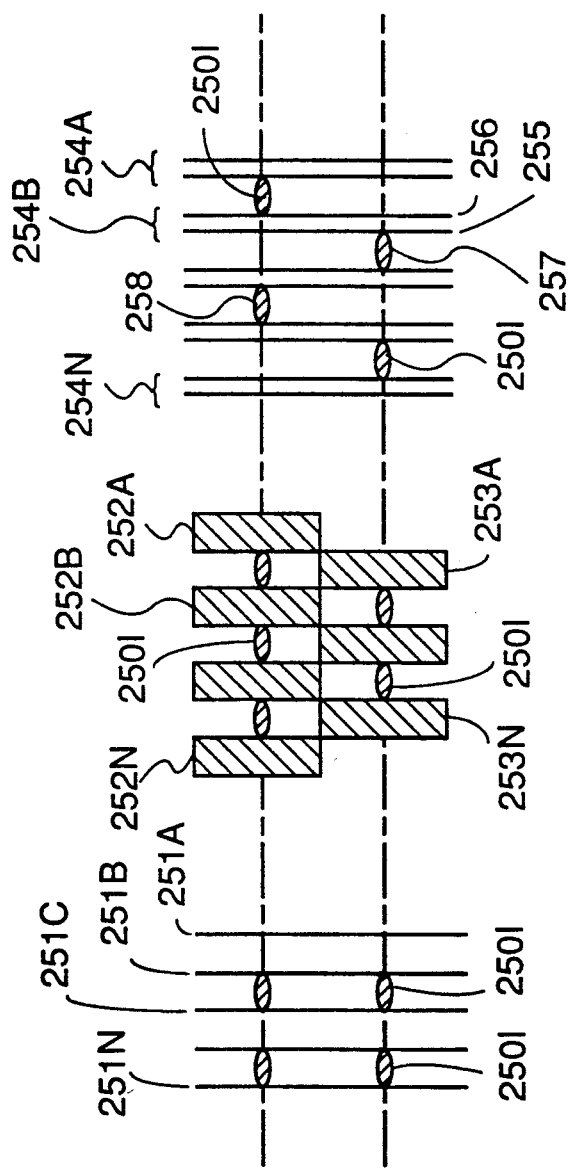

FIGS. 25(a), 25(b), and 25(c) show views of a reticle for printhead fabrication.

FIGS. 26(a), 26(b), 26(c), 26(d), 26(e), and 26(f) show various stylus etching flaws.

Figure 27B:
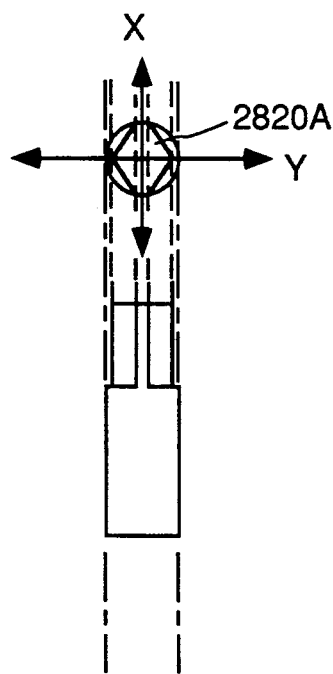
Figure 27A:
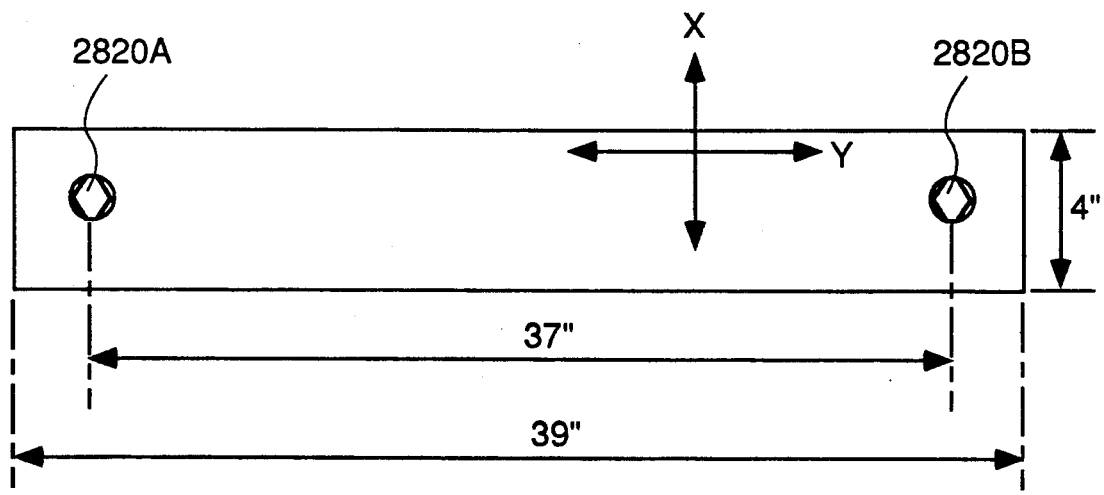

FIGS. 27(a), 27(b) show respectively a plan and side view of a fixture for fabrication of a printhead.

Figure 28:
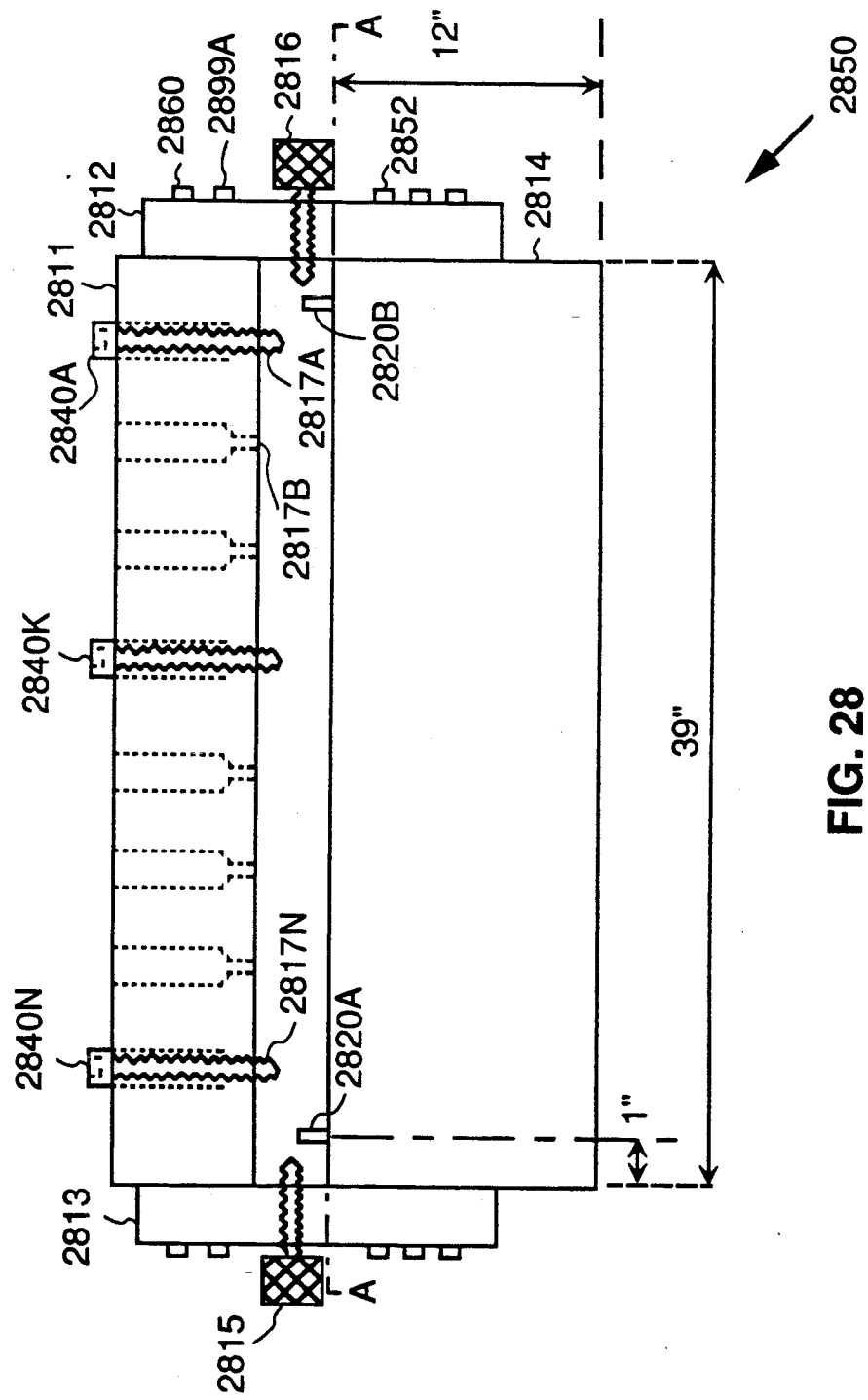

FIG. 28 shows a fixture for fabrication of a printhead. There is no FIG. 29.

FIGS. 30(a), 30(b), and 30(c) show three views of a fixture for fabrication of a printhead.

Figure 31A:
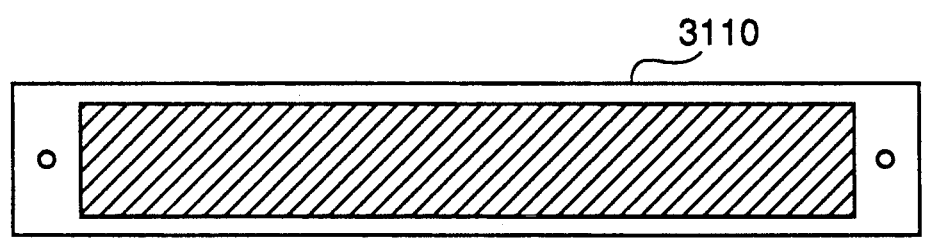
Figure 31B:
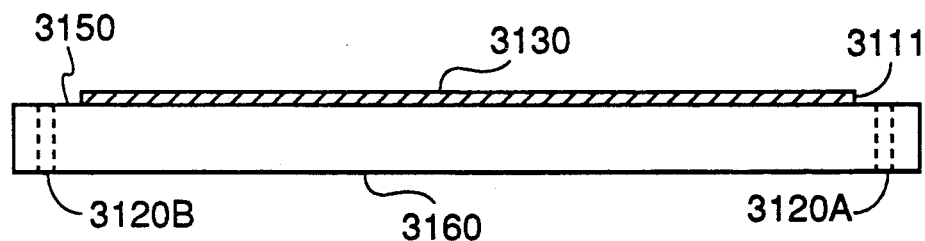

FIGS. 31(a), 31(b) show two views of a fixture for fabrication of a printhead.

Figure 32A:
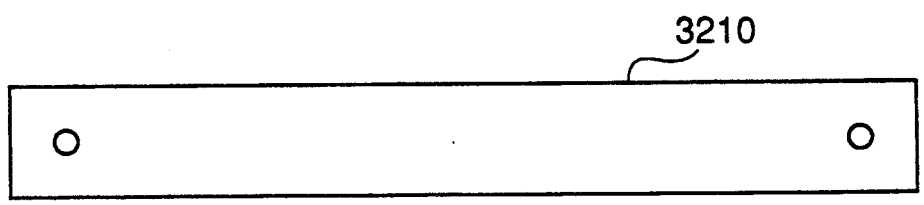
Figure 32B:
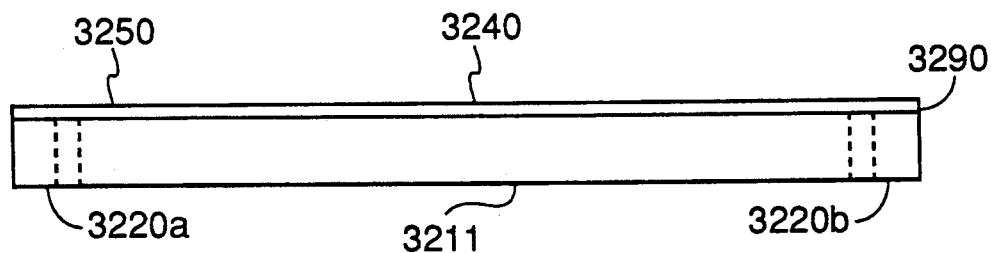

FIGS. 32(a), 32(b) show two views of a fixture for fabrication of a printhead.

FIGS. 33(a), 33(b), 33(c), and 33(d) show four views of a fixture for fabrication of a printhead.

Figure 34A:
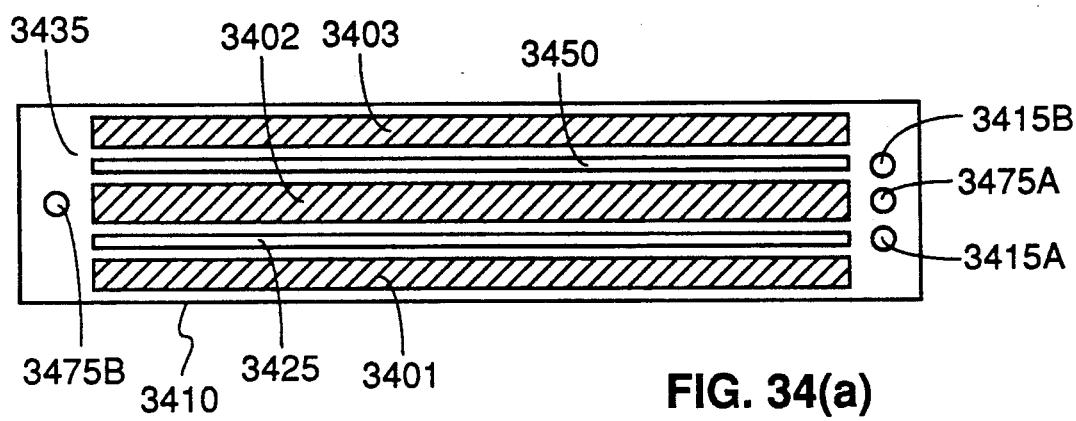
Figure 34B:
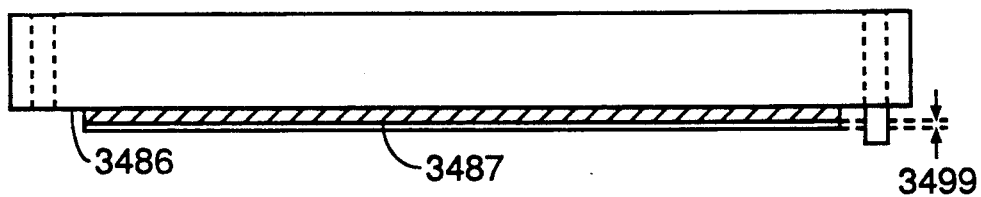

FIGS. 34(a), 34(b) show two views of a fixture for fabrication of a printhead.

Figures 35A, 35B:
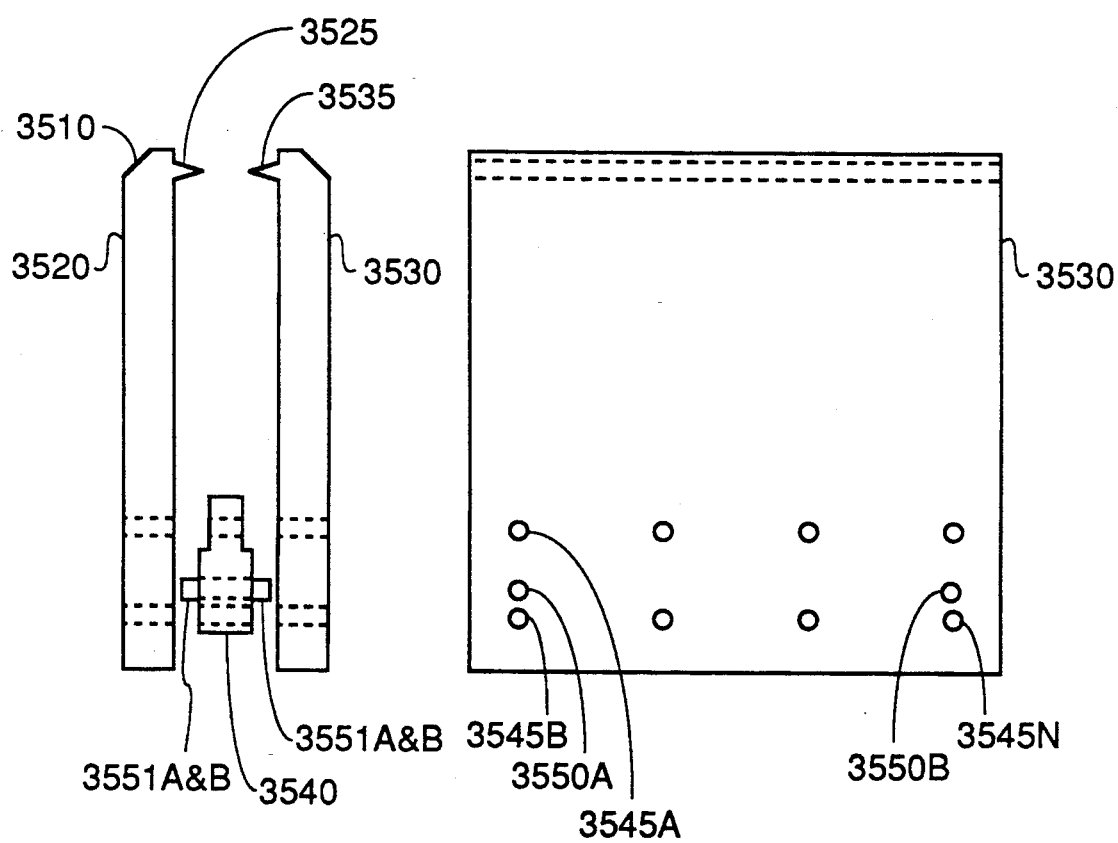

FIGS. 35(a), 35(b) show two views of a fixture for fabrication of a printhead.

FIG. 36 shows a fixture for fabrication of a printhead.

Figure 37B:
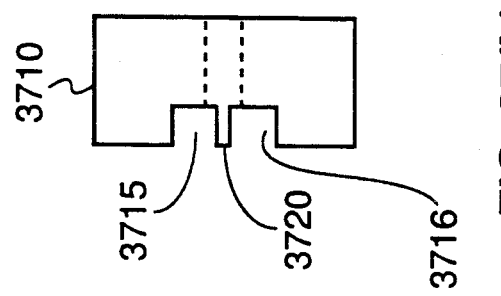
Figure 37A:
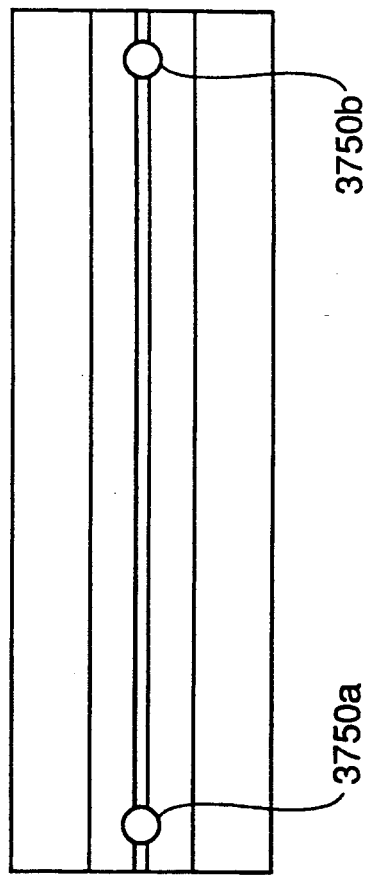

FIGS. 37(a), 37(b) show a fixture for fabrication of a printhead.

Figure 38B:
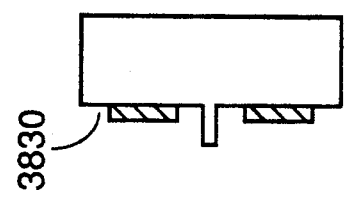
Figure 38A:
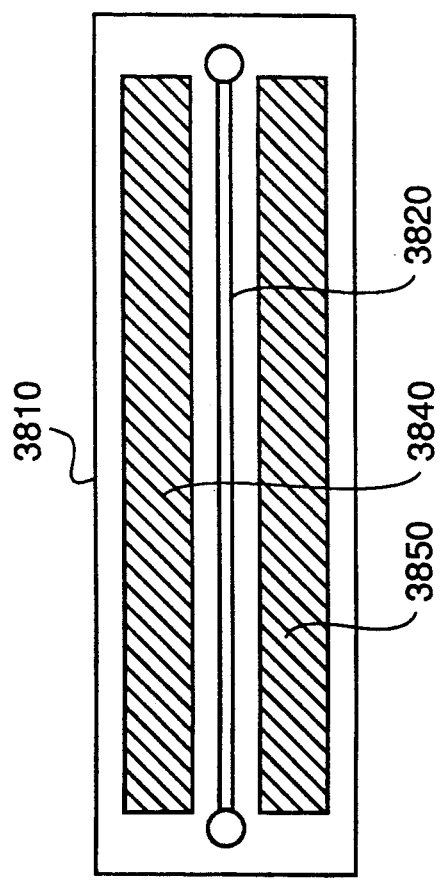

FIGS. 38(a), 38(b) show a fixture for fabrication of a printhead.

Figure 39:
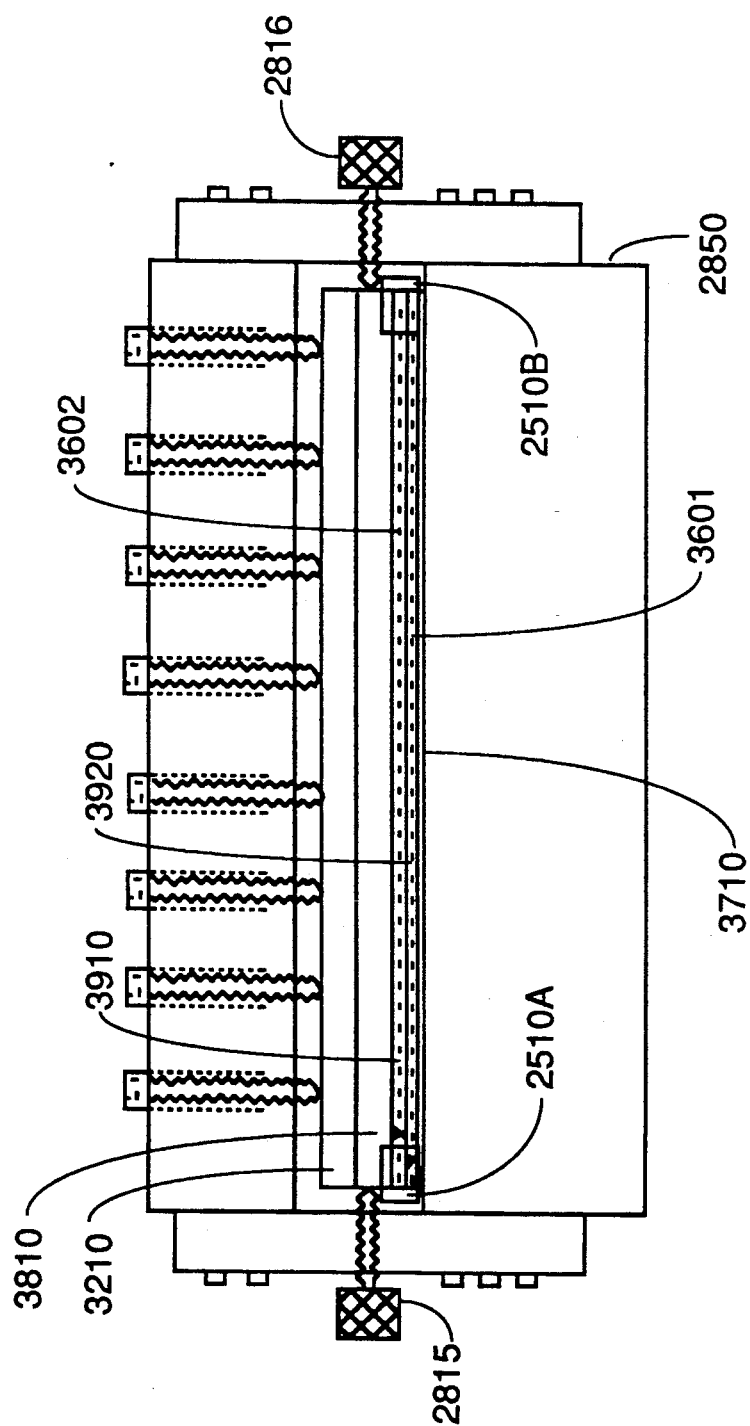

FIG. 39 show a fixture for fabrication of a printhead.

Figure 40B:
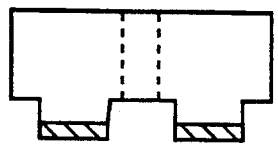
Figure 40A:
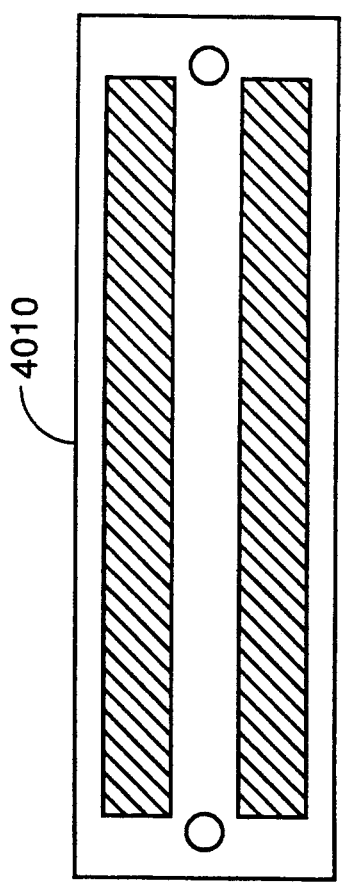

FIGS. 40(a), 40(b) show a fixture for fabrication of a printhead.

FIGS. 41(a), 41(b) show two views of a printhead lamination.

FIGS. 42(a), 42(b) show two views of a printhead lamination.

Figure 43:
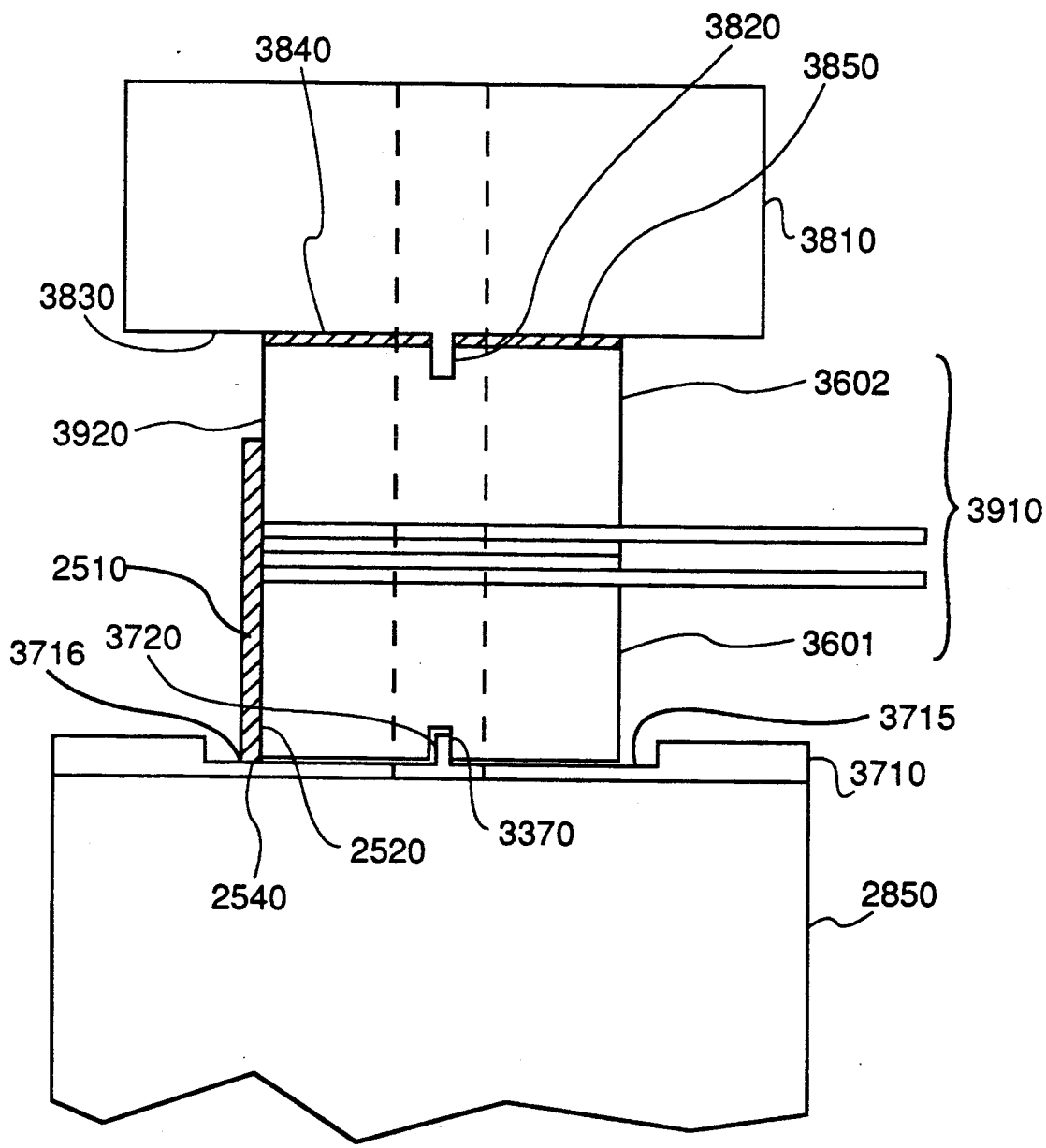

FIG. 43 shows a printhead lamination.

Figure 44B:
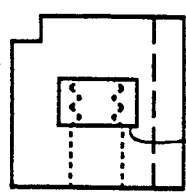
Figure 44A:
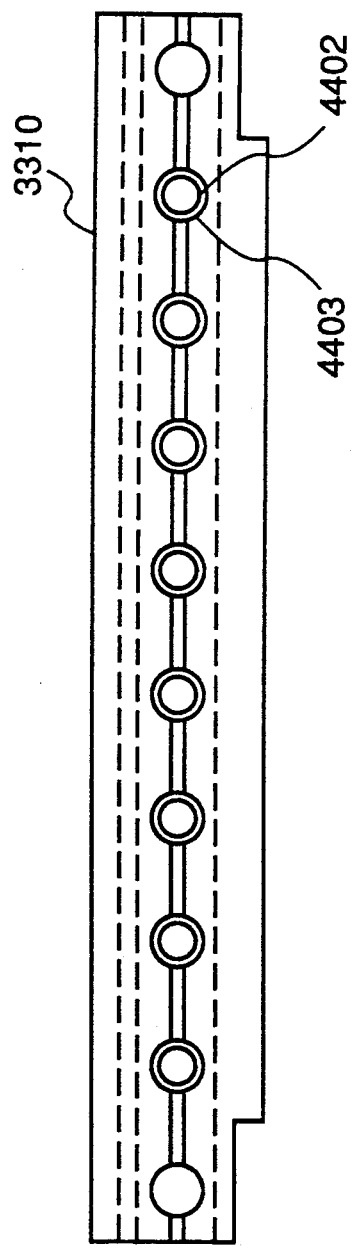

FIGS. 44(a), 44(b) show two views of a support plate.

Figure 45:
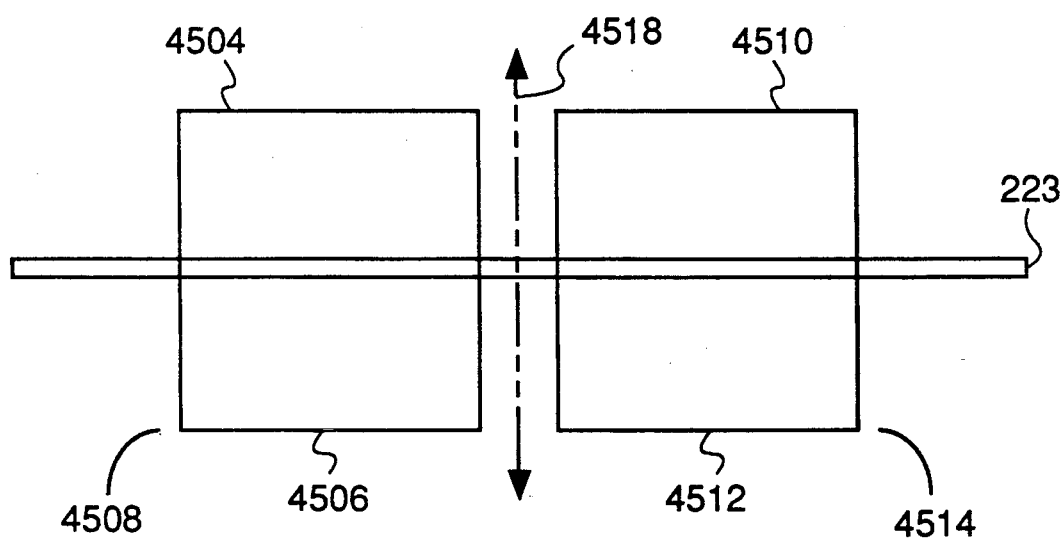

FIG. 45 shows cutting of a laminated printhead.

Identical reference numerals in various figures denote similar or identical structures.

DETAILED DESCRIPTION OF THE INVENTION

In accordance with the present invention, the printhead (as partially shown for instance in perspective view FIG. 2) is formed on a substrate 60 which is conventional glass epoxy printed circuit board material (such as FR-4) or other similar insulating material known in the art of printed circuit board manufacture.

Electrically conductive traces of which representative traces 53A and 53B are labelled, are formed on substrate 50. Traces such as traces 53A and 53B are of uniform width and are preferably, copper, or alternatively nay other appropriate conductive material such as nickel, gold, beryllium, chrome, molybdenum, or aluminum, and are formed onto substrate 50 by well known methods such as photolithography or electroprinting or any other method that can form traces of high quality on a substrate. In the event the traces are photolithographically produced by exposure of a photo resist with subsequent etching, the base metal is placed on the substrate by well known methods such as lamination or by deposition (such as by sputtering or vacuum evaporation) or formed by thick film processes on a ceramic substrate material.

Each IC such as 51A is arranged on substrate 50 and conventionally has input and output pads which are connected to the driver circuits which are formed on IC 51A (not shown). Leads 52 connect the output pads to the conductive traces 53A, 53B, etc., the ends of which form the styli 55A, 55B, etc. Leads 58 connect the input pads to the input signal lines 57A, 57B, etc. Leads 52 and 58 can be formed by any one of a number of conventional bonding techniques such as wire bonding or tape automated bonding (TAB) which is not shown.

Figure 1A:
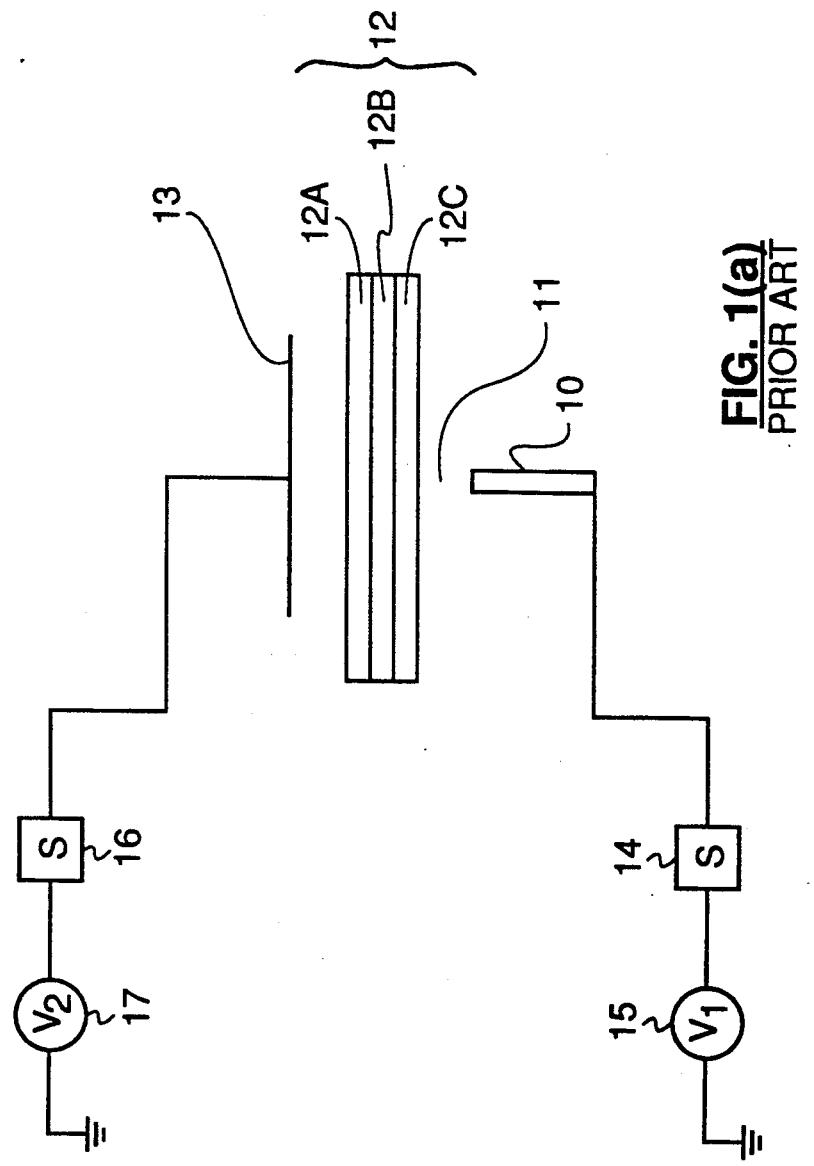
FIGS. 1(a) and 1(c) show the relationship in the prior art of the print medium to the stylus and the counterelectrode.
Figure 1B:
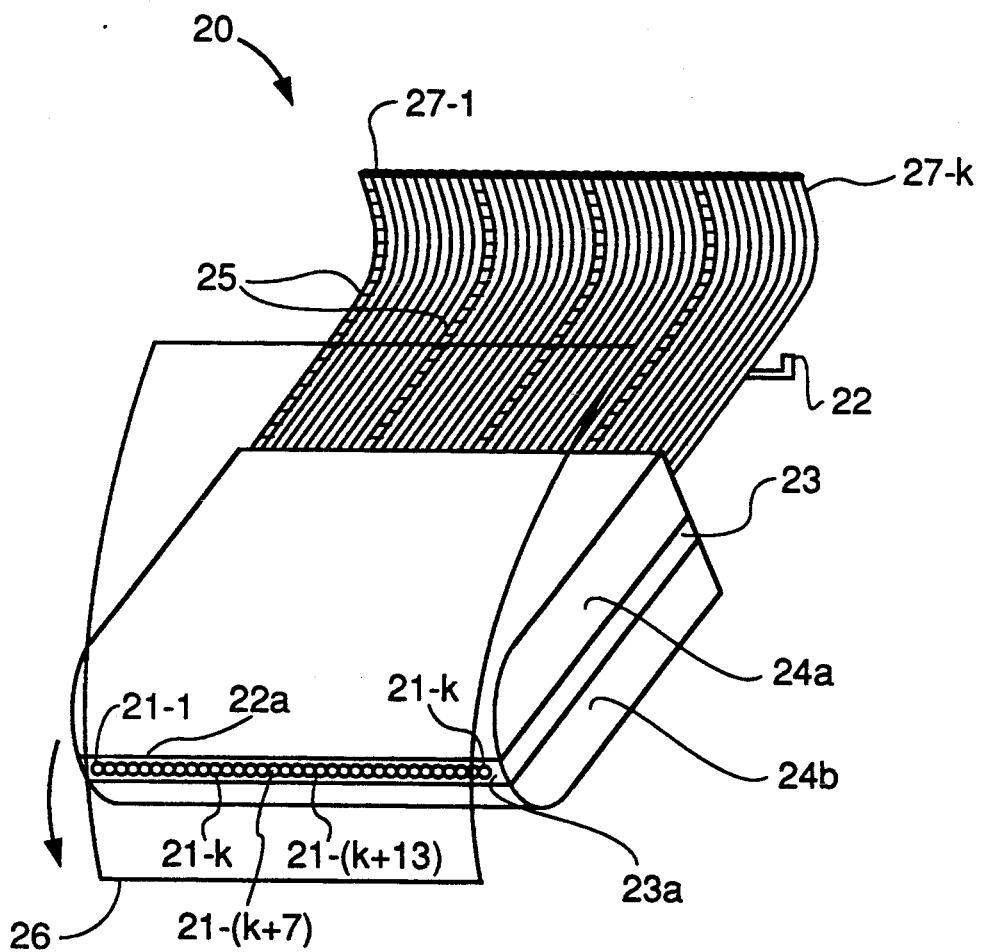
FIG. 1(b) shows a prior art printhead.
Figure 1C:
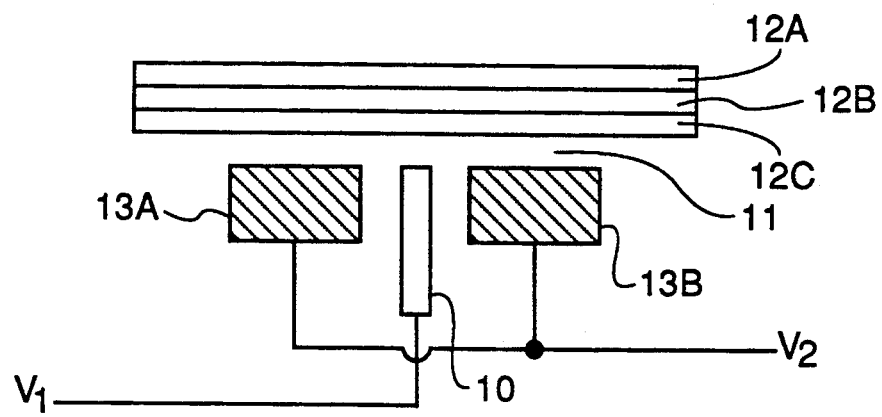
Figure 3A:
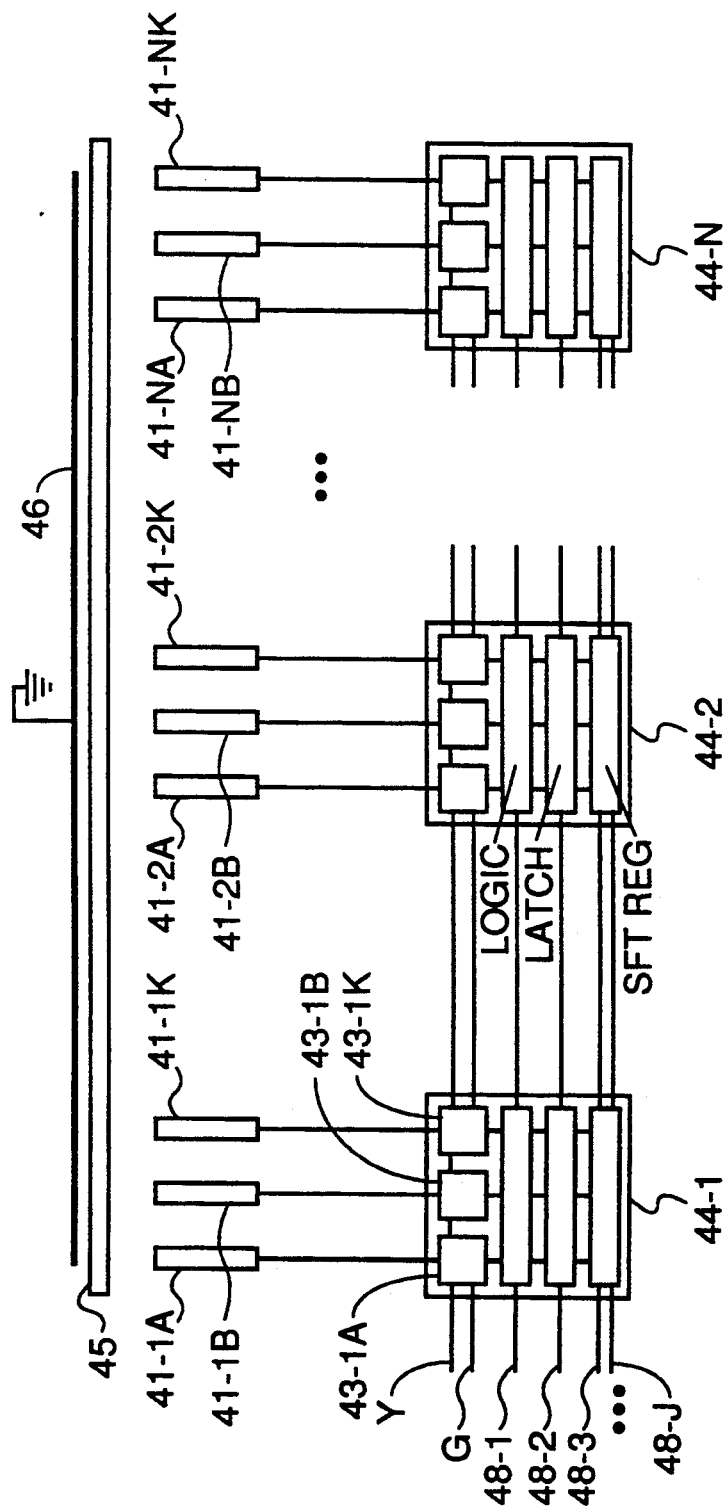
FIGS. 3(a), 3(b) show schematically the circuitry used to activate the styli in a printhead.

FIG. 3(a) depicts in schematic form a printhead in accordance with the present invention. Styli 41-1A, 41-1B, ...,41-NK are each connected to a corresponding driver circuit 43-1A, 43-1B, ...,43-NK (where N is equal to the number of IC's and K is equal to the number of styli per 1C). A group of driver circuits such as 43-1A, 43-1B, ...,43-1K are grouped into one integrated circuit 44-1. Each driver circuit 43-1A, 43-1B, ...,43-NK, is connected to voltage source V, ground source G, and respectively to control lines 48-1, 48-2, ...,48-J. Medium 45 is in close proximity with styli 41-1A, 41-1B, ...,41-NK as described above. Because each stylus 41-1A through 41-NK is driven by a single uniquely corresponding driver circuit 43-1A through 43-NK which drives only that stylus, a single (non-multiplexed) backplate 46 is provided to electrically ground the back of medium 45, thus providing a return path for the charging current.

Figure 3B:
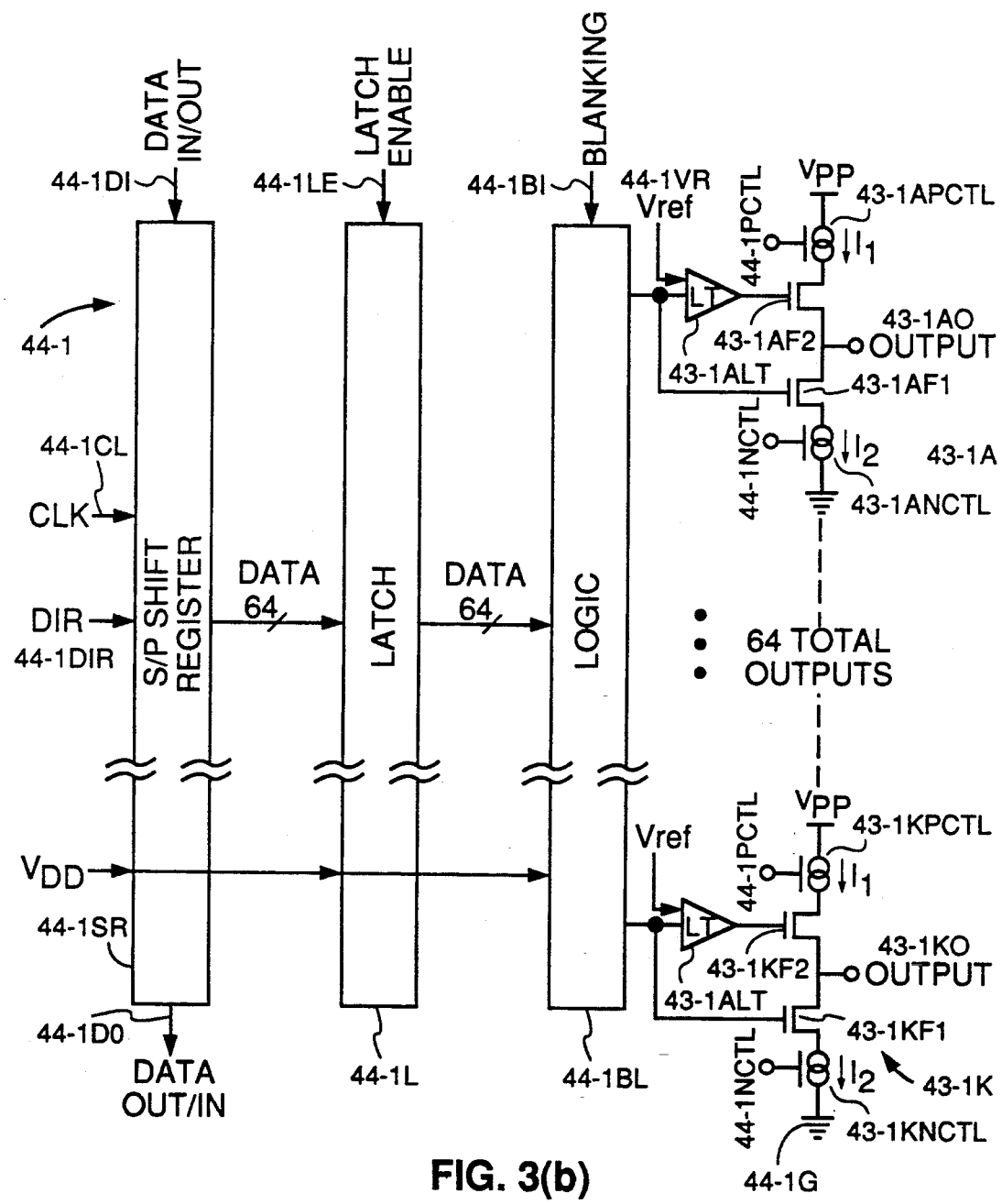

Each IC 44-1 through 44-N of FIG. 3(a) has the structure shown schematically in FIG. 3(b). IC 44-1 is a high voltage device having sixty-four (or some other convenient number K) driver circuits 43-1A, ..., 43-

1K. Each driver circuit such as 43-1A includes preferably two field effect transistors (FETs). One FET 43-1AF1 is an N-channel device; the second FET 43-1AF2 is a P-channel device.

Each driver circuit 43-1A through 43-1K is triggered by an input signal provided to the driver circuit at the serial input line from a graphics data source, not shown (i.e., the controller of the electrographic printer).

Each IC 44-1 through 44-N includes:

1. One serial input/output data line (Data In/Out) 44-1DI. The input data bit shift occurs at the high to low transition of the clock (CLK) for all serial to parallel converter shift register 44-1SR stages.

2. One serial output/input data line (Data Out/In) 44-1DO. The output data represents the input data delayed by K (for example 64) cycles and is the output of the bit shift register 44-1SR.

3. One clock input line (CLK) 44-1CL for clocking the data into and out of the serial to parallel converter 44-1SR on the high to low transition of the clock signals.

4. One latch input signal line (Latch Enable, LE) 44-1LE. The Latch Enable positive true is used to parallel load the latch driving the Blanking Logic driver once the correct data has been shifted into the IC 44-1.

5. One blanking input signal line (Blanking, BLK) 44-1B. Blanking positive true is used to hold all styli in the no-print state, where the output equals Vpp (see below).

6. One high voltage power line (Vpp) providing about +250 volts relative to the ground line 44-1G and biased at −300 volts relative to chassis ground.

7. One twelve (12) volt power line (VDD) (for the logic circuitry) providing +12 volts relative to the ground line, and biased at about −538 volts relative to chassis ground.

8. One ground line (GND) 44-1G, biased at about −550 volts relative to chassis ground.

9. One current control line (PCTL) 44-1PCTL which is the current source control for the output drivers. One current control line (NCTL) 44-1NCTL which is the current sink control for the output drivers. The output current source and sink levels reflect the currents supplied to PCTL and NCTL respectively.

10. One shift register direction line (DIR) 44-1DIR to control the direction of the data flow through the shift register.

11. A number of data output lines (such as 64) 43-1AO, . . . ,43-1KO. Each data output line 43-1AO, . . . ,43-1KO drives a single stylus respectively 41-1A, . . . ,41-1K (see FIG. 3A), so no stylus multiplexing is required. All K styli maintain approximately equal current source and sink values as determined by the PCTL (44-1PCTL) and NCTL 44-1NCTL) signals which drive reference circuits 43-1APCTL, . . . ,43-1KPCTL and 43 1ANCTL, . . . ,43-1KNCTL respectively. Each output line 43-1AO, . . . ,43-1KO is driven to Vpp if the state of the output latch 44-1L is a "zero" and is driven to the ground line voltage if the state of the output latch 44-1L is a "one", when the BLANKING control input (44-1B) is low.

Figure 4:
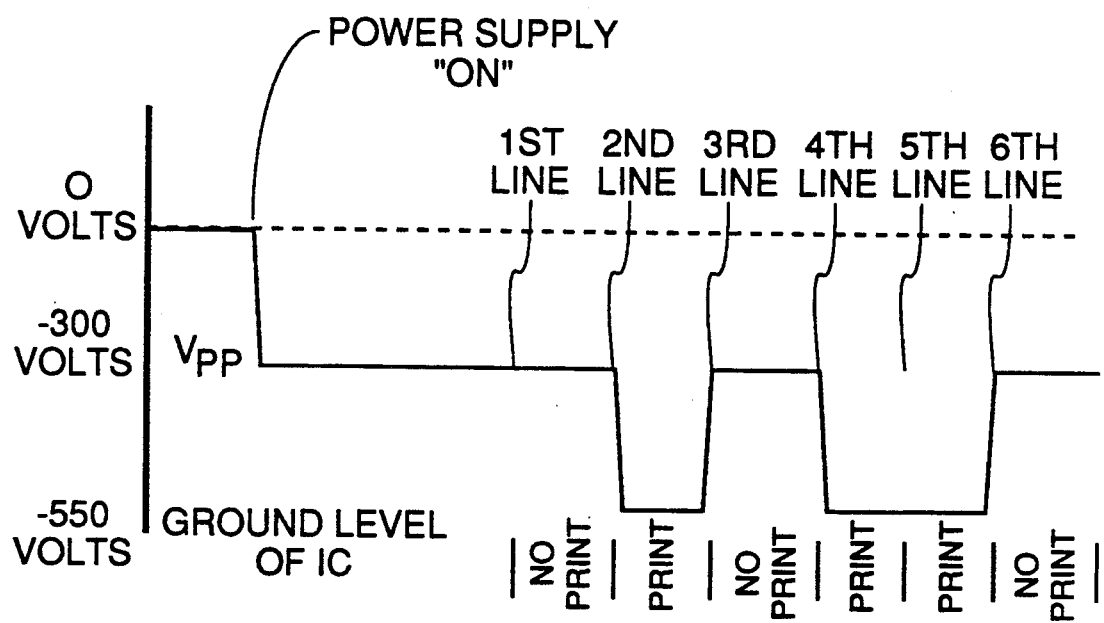
FIG. 4 shows the waveform of the outputs of integrated circuit used in one embodiment of the invention.

FIG. 4 depicts a typical waveform for one data output line such as 43-1AO during printing. Data fed into the IC during the time before printing of the first line determines that 43-1AO will remain at the approximately −250 V bias level during the printing of the first line. While the first line is being printed, data is again fed into the IC to ready the logic for the printing of the second line. The data fed into the IC for the second line determines that 43-1AO will shift to the print voltage of approximately −550 V during the printing of the second line. The rest of the transitions occur as described above.

The architecture of each IC 44-1 through 44-N is identical and is a low voltage serial to high voltage parallel converter with push-pull output.

The serial to parallel converter shift register 44-1SR (FIG. 3(b)) forms a temporary line buffer. Once the line data is stored in shift register 44-1SR, the line data may be loaded into parallel output latch 44-1L. The transfer of data bits from the shift register to the latch typically occurs at the beginning of the next print line.

Parallel output latch 44-1L holds the value present in shift register 44-1SR for printing by the styli. Latch 44-1L transparently loads whatever value is present at the shift register (44-1SR) output when Latch Enable 44-1LE is high.

The blanking logic 44-1BL disables all printing by forcing all the styli into the no-print state. The blanking signal 44-1B can be totally asynchronous but is preferably asserted at the end of a printing cycle. Blanking can be used to reduce the length of the printed spot in the direction of paper motion to compensate for spot size growth that is a result of the size of the styli and the voltage placed on the styli. By using blanking before the start of a printed line and at the end of a printed line, the size of the generally rectangular printed spot can be modified.

The IC's 44-1, . . . ,44-N are preferably a custom design from Supertex Inc., Sunnyvale, Calif. Other IC's having circuitry as shown are used in other embodiments.

Figure 5A:
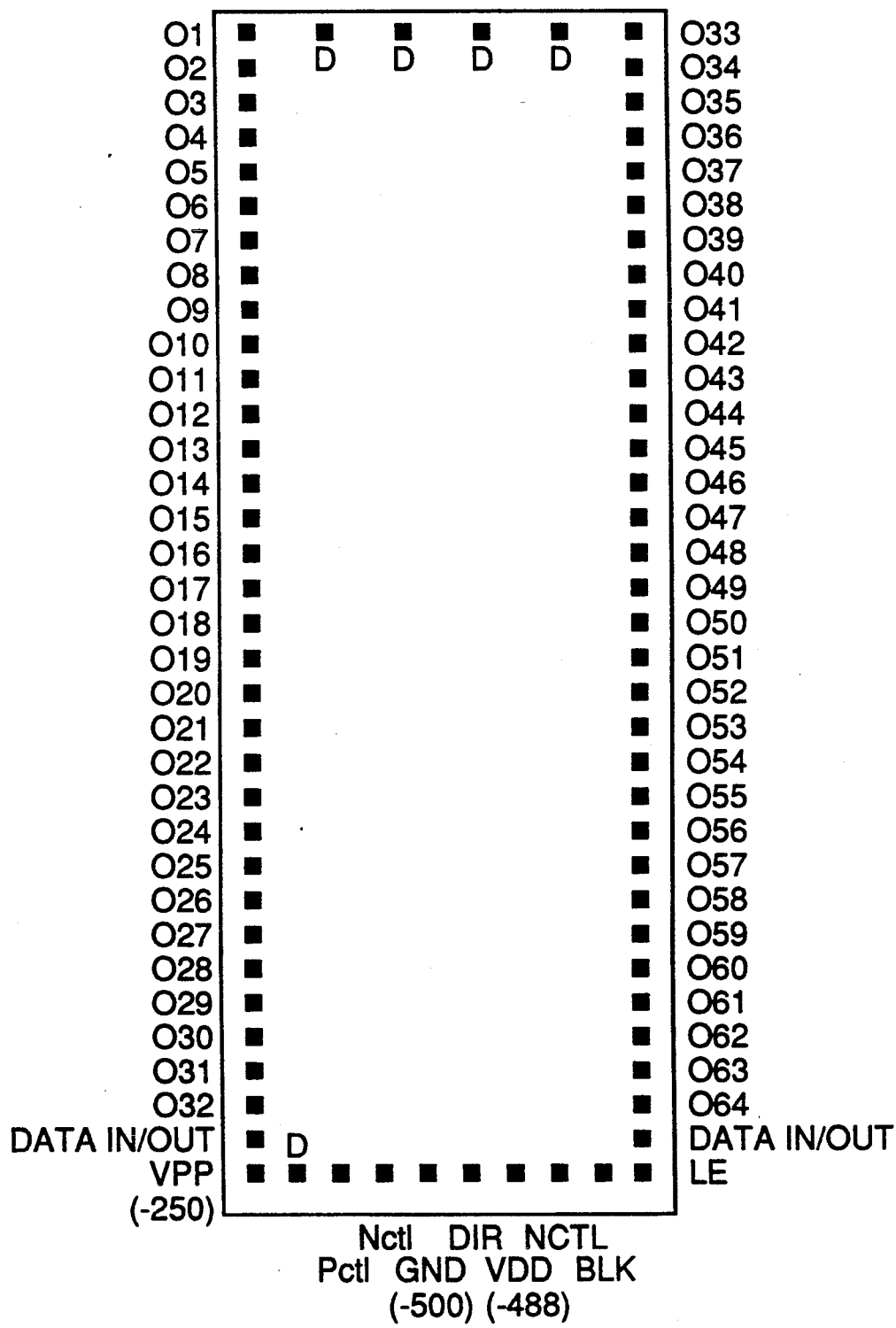

The bonding pad layout for IC's such as 44-1 . . . ,44-N for a sixty-four output line configuration is shown in FIG. 5(a). The stylus output pads are designated 01, 02, . . . ,064. Four dummy pads labeled "D" produce an approximately symmetrical bond pattern for use by interconnection techniques such as TAB.

In another embodiment IC's 44-1, . . . ,44-N each have only 32 stylus output lines. See FIG. 5(b) for the bonding pad layout of this embodiment. The stylus output pads are designated 01, 02, . . . ,032.

For each IC such as 44-1, (see FIG. 3(b)) one shift register direction line (DIR) 44-1DIR is provided to reverse the direction of data movement through shift register 44-1SR in response to clocking signal 44-1CL. This enables the same chip to be used for a monoscan embodiment or either web of a biscan head embodiment as well as any other embodiment. Monoscan and biscan heads are described in detail below. In such a biscan head the two webs are of identical construction but are assembled so that, if data is fed into the same end of the two webs, the flow of data through the IC's will be opposite in direction. When a low signal is provided on direction line (DIR), data is shifted from 43-1A to 43-1K; when DIR is high, data is shifted from 43-1K to 43-1A.

Each driver circuit 43-1A through 43-1K includes two current control circuits 43-1APCTL and 43-1ANCTL through 43-1KpCTL and 43-1KNCTL each consisting of a programmable source and sink respectively. Current source 43-1APCTL, for example, is a current source for the P-channel FET 43-1AF2, and the second current sink 43- 1ANCTL is a current sink for the N-channel FET 43-1AF1. These programmable currents are controlled by a reference input PCTL (44-1PCTL) and NCTL (44-1NCTL). The current control circuits consist of a one to one current mirror and an internal series resistance. The current flow through the current mirror and thus the current through 43-1APCTL and 43-1ANCTL, is determined by an external reference voltage divided by the internal resistance. In this manner the output current level of the FETs can be set by varying the external voltage reference. In the case of PCTL this voltage is referenced to the VPP supply and in the case of the NCTL this voltage is referenced to the ground line.

The current sources 43-1APCTL, . . . ,43-1KPCTL are programmed to provide a particular current level to, respectively, P-channel FETs 43-1AF2, . . . ,43-1KF2 by control line 44-1PCTL, to which they are connected in parallel. Similarly, the current sources 43-1ANCTL, . . . ,43-1KNCTL are programmed to provide a particular current level to respectively N-channel FETs 43-1AF1, . . . ,43-1KF1 by control line 44-1NCTL, to which they are connected in parallel. Thus signals on control line 44-1NCTL simultaneously program all current sources 43-1ANCTL, . . . ,43-1KNCTL, and signals on control line 44-1PCTL simultaneously program all current sources 43-1APCTL, . . . ,43-1KPCTL.

Each driver circuit 43-1A, through 43-1K is in one embodiment capable of no more than 1 milliamp output current; however the current sources 43-1APCTL and 43 1ANCTL through 43-1KPCTL and 43-1KNCTL provided for each driver circuit (such as 43-1A) further limit the output current of the driver circuit (at output 43-1AO) to ten microamps. This beneficially 1) protects the styli from possible electrical damage; 2) increases the protection of the device in case of a system fault; and 3) controls voltage wave shape. The current sources 43-1ApCTL, 43-1ANCTL, etc. thus provide the driver circuits 43-1A, . . . ,43-1K with high impedance with regard to the styli 41-1A, . . . ,41-1K (see FIG. 3(a)). This allows waveform control and provides some protection against short circuits between styli.

A voltage level translator (LT) such as 43-1ALT is provided in each driver circuit such as 43-1A to convert the output signals of blanking logic 44-1BL to a voltage level usable by the P-channel FET 43-1AF2. The N-channel FET 43-1AFI does not require a voltage translator because blanking logic 44-1BL provides the correct voltage for N-channel FET 43-1AFI to operate.

Various embodiments of the invention having different printhead configurations and including the above described circuitry are described below.

Monoscan Embodiment

One embodiment in accordance with the present invention is a printhead having one row of styli formed on a monolithic substrate, with the IC's (having one driver circuit for each stylus) mounted preferably on the same surface of the substrate. Because the printhead has only one row of styli, it is called a "monoscan" printhead.

Figure 6A:
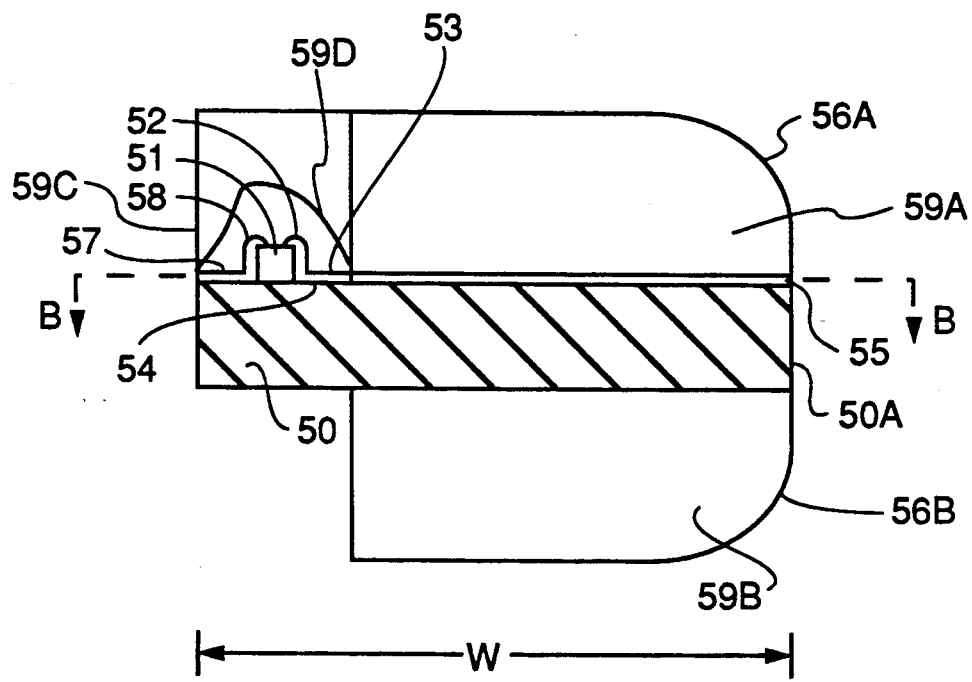
FIG. 6(a) shows a cross-sectional side view of one embodiment of the invention.

As seen in cross-section in a side view in FIG. 6(a), this embodiment includes a substrate 50 on which is mounted a row of IC devices one of which is IC 51. Each of the IC devices such as IC 51 is connected by wires such as wire 52 by connection technologies known in the art such as wire bonding or TAB bonding (not shown) to traces such as trace 53 at bonding pads such as pad 54. Both traces 53 and bonding pads 54 are formed by means well known in the art of printed circuit board manufacturing on substrate 50. The traces such as trace 53 are preferably copper or nickel, typically about 0.002 to 0.010 inch (0.13 mm to 0.25 mm) wide. The trace width and spacing are a function of the printing resolution desired, taking into account such parameters as dot growth, interstylus arcing, etc. Each trace such as trace 53 terminates at one stylus such as 55 which is formed by the end of trace 53 where trace 53 ends at edge 50A of substrate 50. A second set of traces such as 57 on substrate 50 is similarly connected by wire 58 to IC 51. This second set of traces such as trace 57 connects the driver circuits in IC 51 to the input lines as shown in FIG. 6(b) which is a view along line B—B of FIG. 6(a).

Figure 6B:
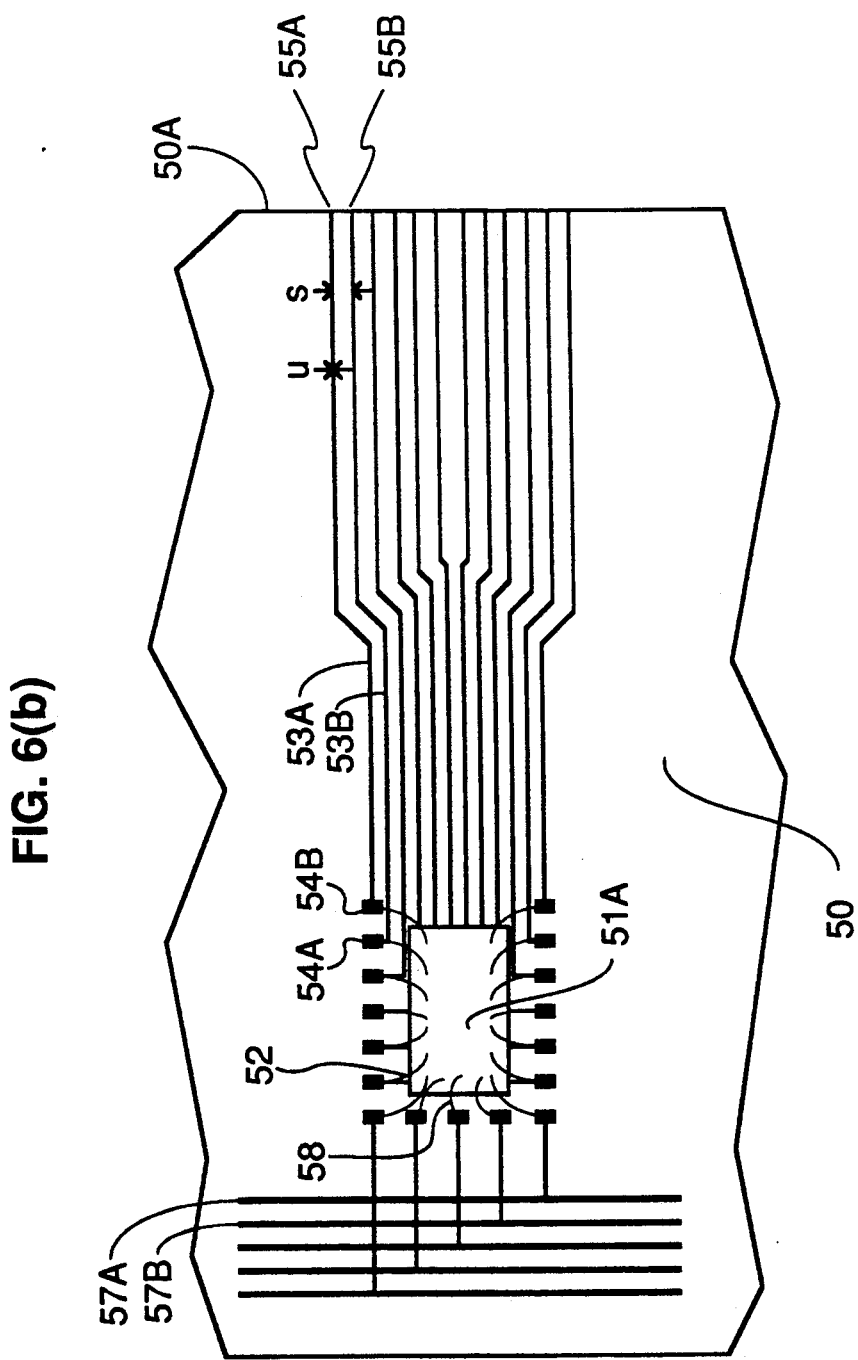
FIG. 6(b) shows a top view of the structure of FIG. 6(a).

Shown in FIG. 6(b) are substrate 50, traces 53A, 53B, etc., bonding pads 54A, 54B, etc., and styli 55A, 55B, etc. as well as input line traces 57A, 57B, etc. and interconnections 52, and 58. As shown in FIG. 6(b) in one embodiment each trace has a width U of 2 mils and a gap S between adjacent traces of 3 mils.

As shown in FIG. 6(a), substrate 50 has a thickness C of about 0.030 inches (0.8 mm), and a length (not shown) from about 0.08 inch (2 mm) upwards, depending on the width of the image to be printed. Thirty-six inches (900 mm) is a typical length. Substrate 50 typically has a width W of about 3 inches (76 mm). The dimensions of the substrate are a matter of design choice, and not critical to the invention. To provide mechanical stability, substrate 50 is laminated with an adhesive between support plates 59A, 59B, which are pieces of suitable insulating material, such as FR-4, ceramic, or metal with electrical insulation on the side of the metal plate in contact with the printed circuit conductive trace side of substrate 50. In one embodiment, (see FIG. 6(c)) each support plate is respectively a piece of steel 59-1, 59-2 laminated by epoxy and so embedded between two pieces of FR-4 material 59-3, 59-4 and 59-5, 59-6. Each piece of steel 59-1, 59-2 is about 0.250 inch (6.2 mm) thick and the FR-4 pieces 59 3, . . . ,59-6 are each about 030 inch (0.8 mm) thick. The edges 56 of the support plates that form the top of the head are preferably curved to allow the media to produce a wrap around the head in actual operation, but they may have any other convenient shape and may be shaped so as to form a flat head, if desired. Similar support plates are used in other embodiments of the invention described below. The complete printhead typically has a total thickness of about 0.25 to 1 inch (0.6 cm to 2.5 cm).

Removable protective cover 59C is provided over the IC's 51. Cover 59C is made of any convenient material, such as plastic. In one embodiment, once assembled and tested, the IC's and traces are conventionally potted with a silicone resin and an overcoat of epoxy resin 59D (see FIG. 6(a)). This potting procedure may also be used in conjunction with the other embodiments described below, in addition to or in place of a cover such as cover 59C.

FIG. 2 shows an isometric view of the monoscan printhead of FIGS. 6(a) and 6(b). Included are substrate 50; IC's 51A, 51B, . . . ,51N; traces 53A, 53B, . . . ,53NK; bonding pads 54A, 54B, . . . ,54NK; styli 55A, 55B, . . . ,55NK; input line traces 57A, 57B, etc.; interconnections 52A, 52B, . . . ,52NK; interconnection 58A, 58B, . . . ,58J; as well as support plate 59B, and dimensions W, C, and L. Upper support plate 59A is not shown, for simplicity.

Biscan Two-sided Embodiment

This embodiment (shown in FIG. 7) is a biscan head with two rows of styli, one row formed on each side of a substrate, and IC's having the driver circuits for the styli on each surface being mounted on that same surface. The substrate, as in the prior art biscan printhead, thus separates the two rows of styli.

Figure 7:
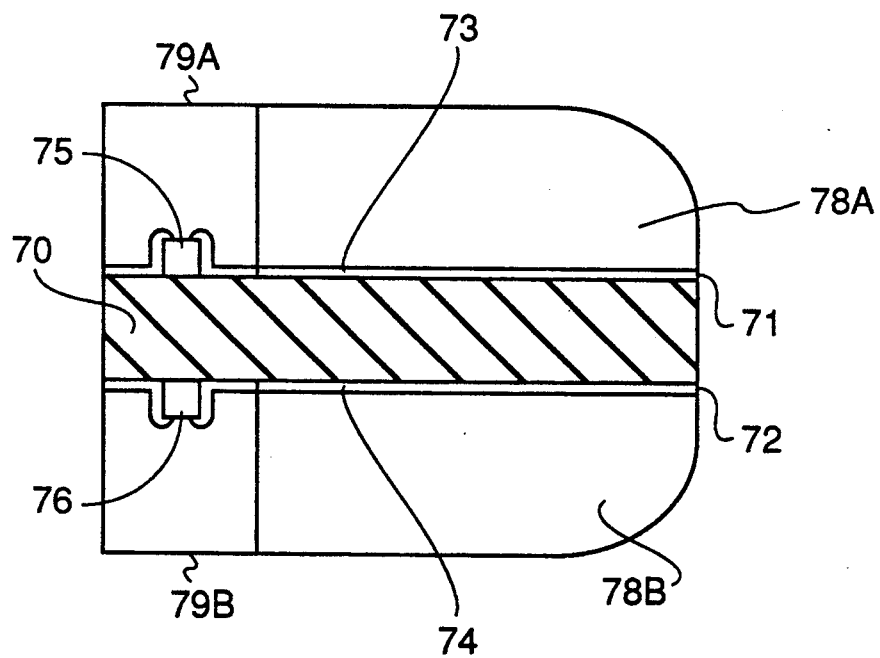
FIG. 7 shows a cross-sectional side view of a second embodiment of the invention.

This embodiment thus has two rows of styli such as 71, 72, one row formed on each side of the substrate 70 as shown in a cross-sectional view from the side in FIG. 7. This embodiment permits wider spacing between adjacent traces and styli and the IC's and so is easier to fabricate than the monoscan printhead since only half the traces such as 73 and half the IC's such as 75 are on one side of the substrate 70. Again, as with the above described monoscan embodiment, substrate 70 is laminated between support plates 78A, 78B to provide mechanical stability. Two covers 79A, 79B are provided for protection. Substrate 70 is of a thickness typically about 0.005 to 0.030 inch (0.13 mm to 0.76 mm.). The styli formed on the two substrate surfaces are a defined distance apart; a preferred defined distance is a multiple of the stylus-to-stylus distance. For a 400 DPI (dots per inch) that distance is 0.0025 inch (0.063 mm). Therefor the distance from the styli of one row to the styli of the other row (or other rows in the case of tri-scan or quad-scan heads) would be a multiple of 0.0025 inches (0.06 mm). This distance should be maintained accurately so that the styli are all a fixed distance apart to a fraction of the stylus-to-stylus distance. For a 400 DPI head this stylus row-to-stylus row distance should be accurate to ±0.0005 inch (0.13 mm) or better. In this embodiment, since the two stylus rows are formed on either side of a single substrate, the alignment of the stylus rows is greatly facilitated. When the stylii are produced photolithographically, for example, the stylus row alignment can be accomplished easily with great precision by aligning the respective artworks and exposing both rows simultaneously.

Biscan Embodiment, Recessed

Figure 8:
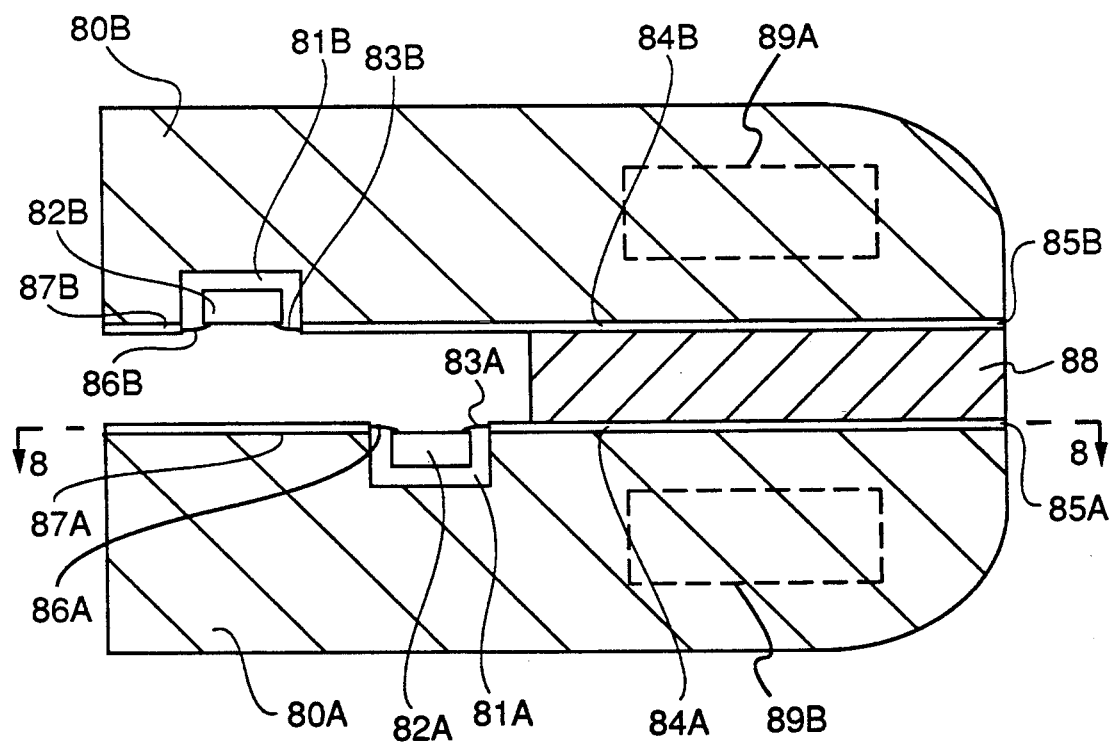
FIG. 8 shows a cross-sectional side view of a third embodiment of the invention.

This embodiment shown in FIG. 8 is a biscan head including two substrates. One row of styli is formed on a surface of the first substrate; the second row of styli are formed on a surface of the second substrate. The IC's associated with each row of styli are located in recesses in the respective substrate surfaces. This allows spacer 87 to be very thin which means that styli row 85A and 85B are close together, reducing the need for buffering electronics. The two substrates are fastened together with the insulating spacer 87 between them, so that the two substrate surfaces with the IC's and styli are approximately co-planar.

This embodiment, as shown in cross-sectional view from the side in FIG. 8, includes two substrates 80A, 80B, each of which as described above typically is printed circuit board material (e.g., FR-4) or a ceramic material or other material. In this embodiment the substrates are preferably thicker than in the first two embodiments, preferably 0.12 to 0.25 inch thick (0.3 cm to 0.6 cm). The thick substrates 80A and 80B can in turn be created by laminating thin printed circuit boards to a thicker substrate, similar to the structure shown in FIG. 6(a). Each substrate 80A, 80B has a slot (or recess) 81A, 81B cut into it by well known means such as grinding or milling. The slots are wide enough to accommodate the IC's.

The IC's such as IC's 82A, 82B are placed in the slots 81A, 81B and are bonded by TAB (or wire bonding, not shown) as at 83A, 83B to the traces such as 84A, 84B and also bonded by TAB as at 86A, 86B to the input lines such as 87A, 87B on the substrate 80A and 80B. In one embodiment, each IC such as 82A is suspended in a slot 81A by the TAB bonds 83A, and so does not physically rest on the substrate 80A. Traces such as 84A are formed on the surface of the substrate 80A by conventional etching as described above. The two substrates 80A, 80B are laminated together by an adhesive with an insulating spacer 87 between them. Spacer 87 is 0.005 to 0.030 inch (0.13 mm to 0.76 mm) thick (or more) and with its thickness accurate to a fraction of the stylus-to-stylus distance, as described above, and is of FR-4, ceramic, or similar material. Spacer 87 must be thicker than the height of the TAB bonds such as 83A, 83B (or wire bonds, not shown) so that the bonds are not crushed when the two substrates 80A, 80B are fixed together. The two rows of styli such as 85A, 85B are the ends of traces such as 84A and 84B. Note that in FIG. 8, IC slots 81A, 81B are offset so as to provide greater clearance for the TAB bonds such as 83A, 83B.

Figure 9:
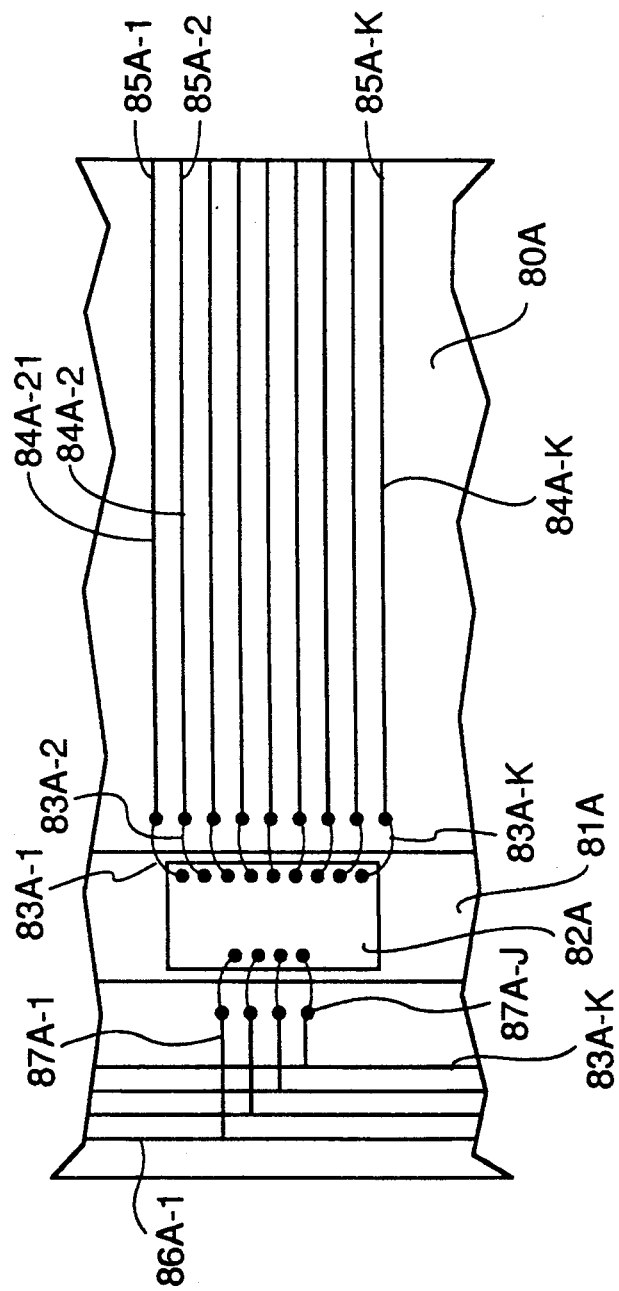
FIG. 9 shows a top view of the structure of FIG. 8.

A partial view through line 8-8 in FIG. 8 is shown in FIG. 9. Shown are substrate 80A; slot 81A; IC 82A; wire bonds 83A-1, 83A-2, ..., 83A-K; traces 84A-1, 84A 2, ..., 84A-K; styli 85A-1, 85A-2, ..., 85A-K; input lines 86A-1, 86A-2, ..., 86A-J; and pads 87A-1, 87A-2, ..., 87A-J. IC 82A has a different arrangement of input and output pads than shown in the previous embodiments such as that of FIG. 6(b), since only the sides of IC 82A are accessible for bonding due to the location of the IC's such as IC 82A in the slot 81A. The IC bonding pad layout for the embodiment of FIGS. 8 and 9 is shown in FIG. 5(b).

In this embodiment, since the substrates 80A, 80B are preferably relatively thick, they advantageously also serve as support plates and provide their own dimensional and thermal stability. This stability facilitates the accurate alignment of the stylus rows, which is accomplished mechanically during head assembly.

Biscan Embodiment with Steps

Figure 10:
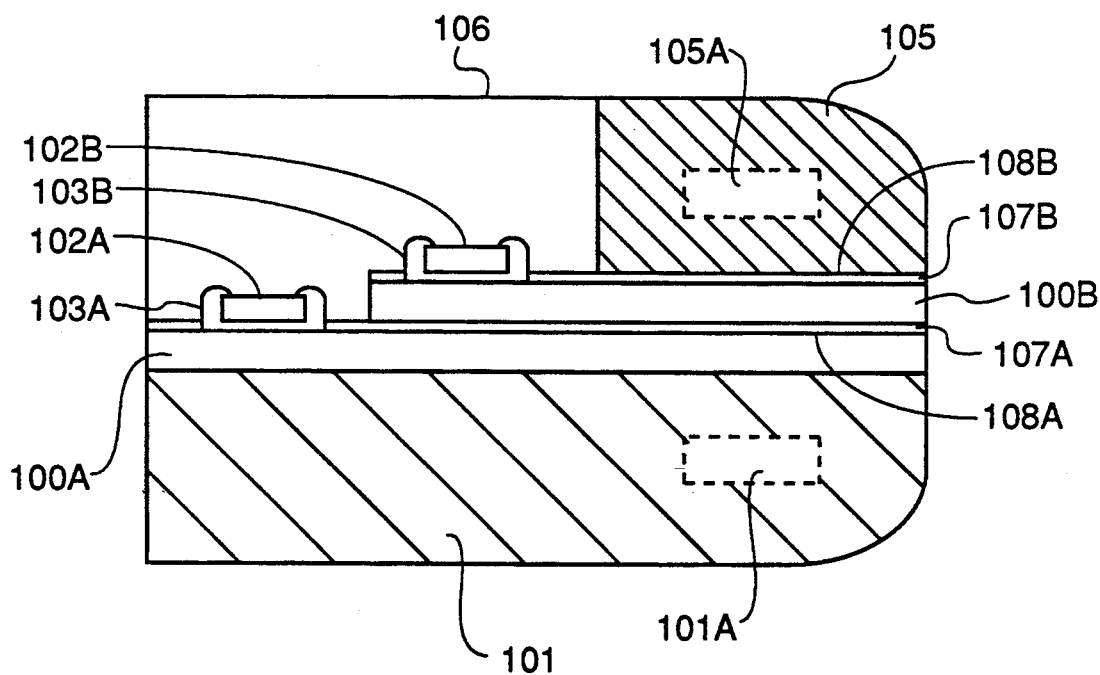
FIGS. 10 through 17 show cross-sectional side views of additional embodiments of the invention.

This embodiment shown in FIG. 10 is a biscan head in which the first row of styli are formed on a first substrate which is fastened to a thick temperature stable support plate, and the IC's associated with those styli are also mounted on the first substrate. A second substrate on which is formed a second row of styli is laminated to the first substrate. The IC's associated with the second row of styli are mounted on the second substrate. The second substrate thus acts as a spacer between the two rows of styli. A thick top plate is then fastened to the second substrate. The thick support plates, one or both made of thick, structural glass epoxy laminate with in one embodiment a buried reinforcement made of steel or similar metal 105A, provides dimensional and thermal stability to the printhead. Such reinforcement can be added to any of the structural side plates in any of the embodiments described herein.

This embodiment is shown in FIG. 10 in a side cross-sectional view, and is fabricated as follows. Styli formed by the ends of the traces, the traces, and input lines to the IC's are formed by well known means on substrates 100A and 100B as in the above described embodiments. Substrate 100A is laminated to a thick bottom plate 101. The IC's such as 102A are TAB or wire bonded such as 103A to the substrate 100A, as described above. Then substrate 100B, typically about 0.005 to 0.030 inch (0.13 mm to 0.76 mm) thick with thickness requirements as described above for the spacer member 87 (FIG. 8), is laminated to a thick top plate, 105. A second row of IC's such as 102B are attached by TAB or wire bonding 103B to the second level substrate 100B. Top and bottom plates 105 and 101 are typically about, 0.25 inch (0.6 cm) thick and is made of ceramic, FR-4, electrically insulated steel, or other suitable insulating material. The two assemblies are then laminated together. Thus, the thick bottom plate 101 and the thick top plate 105 provide mechanical and thermal stability to the printhead allowing alignment of the stylus rows. In one embodiment steel reinforcements 105A, 101A are buried in respectively top plate 105 and bottom plate 101 to provide further stability.

In an alternate means of fabrication, first substrate 100A is laminated to the thick bottom plate 101, then the traces and pads are formed on substrate 100A. Then the second level substrate 100B is laminated to the top surface of the first substrate 100A, and the traces and IC connect pads are formed on the second level substrate 100B. Thus, the thick bottom plate 101 also provides dimensional stability in terms of thermal expansion during fabrication, so the printed circuitry (i.e., the traces and bonding pads) on the two substrates 100A, 100B is kept in registration during fabrication. Cover 106 is provided. The two rows of styli such as 107A, 107B are at the end of the traces such as 108A, 108B.

Triscan or Quadscan Embodiment with Steps

The above-described biscan embodiment with steps is extendable to a triscan printhead having an additional substrate layer consisting (as shown in a side cross sectional view in FIG. 11) of a third substrate 100C having a third row of styli such as 107C formed on it at the end of traces such as 108C and a row of IC's such as 102C between the second substrate 100B and the thick top plate 105. The embodiment shown in FIG. 11 otherwise is similar to the embodiment shown in FIG. 10. A cover (not shown) is provided over the IC's such as 102A, 102B, 102C as in the previous embodiments. This embodiment has the advantage of further spacing apart both the styli and the IC's and traces, or conversely allowing a higher density of printing.

An additional layer substrate with styli is added to make a quadscan head, or even more layers may be added as desired.

Stepped Embodiment with Multilevel Wire Bonds

An alternative approach to the location of the IC's is used in conjunction with the stepped embodiments described above (i.e., the fourth and fifth embodiments.) In this embodiment, all the IC's are located on the first substrate, and electrically connected to the various rows of styli.

Figure 12:
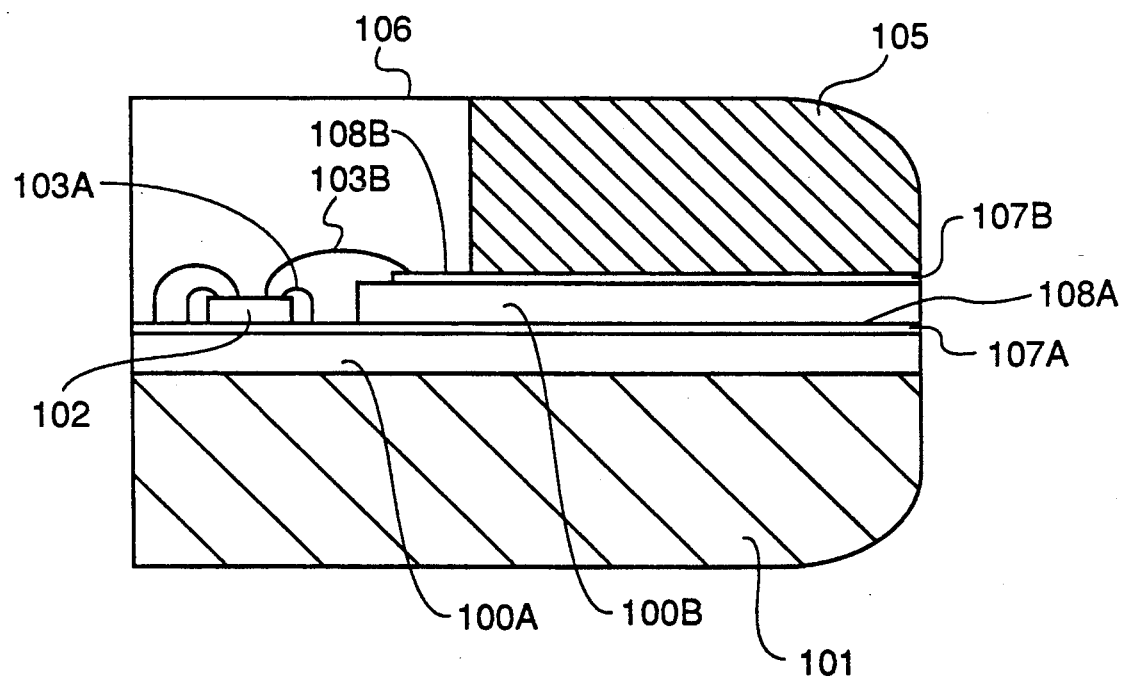

As shown in a cross-sectional view from the side in FIG. 12, in this embodiment only one row of IC's such as IC 102, located on the first substrate 100A, provides the driver circuits for all (two or three or more) levels of substrate 100A, 100B by TAB or wire bonding (such as 103A, 103B) the IC's such as IC 102 to the various traces 108A, 108B on substrates 100A and 100B respectfully. This embodiment simplifies the fabrication process by having the IC's such as 102 all on one level and also reduces the difference between the longest and shortest trace lengths. The other elements shown in FIG. 12 are the same as in FIG. 10. An advantage of this embodiment is a narrower printhead (i.e., shorter traces), thus desirably reducing printhead capacitance.

Additional Biscan Embodiments

Figure 13:
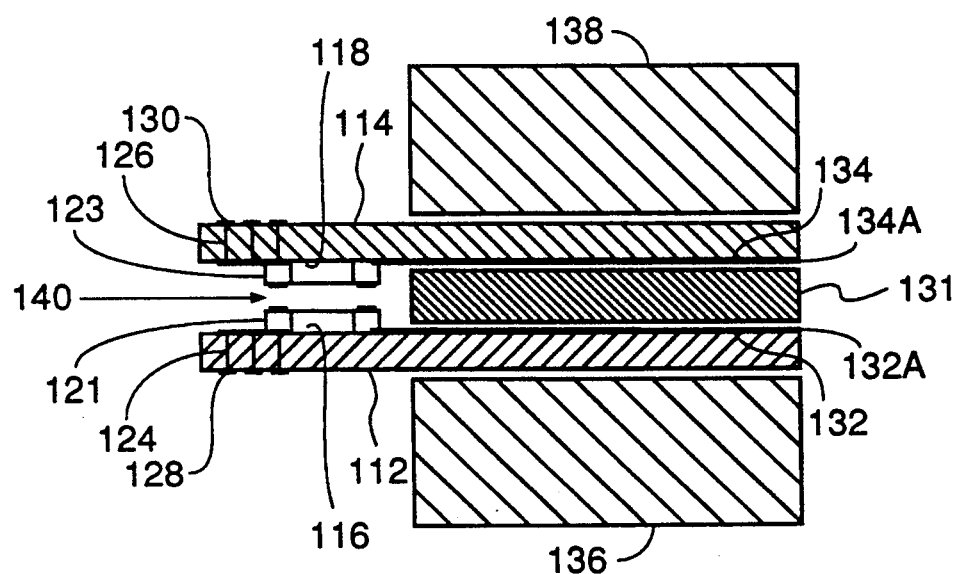

An additional biscan embodiment is shown in FIG. 13. In this embodiment, two substrates are laminated together face-to-face separated by a spacer.

As shown in FIG. 13 in a side cross sectional view, two substrates 112, 114, each of which as described above typically is a printed circuit board or other insulating material, are provided. Each substrate 112, 114, has IC's 116, 118 bonded to one surface respectively by TAB bonds 121, 123. The TAB bonds 121, 123 which connect to the power lines and control lines 128, 130 are connected by holes such as 124, 126 plated respectively though substrates 112, 114 to bonding pads conventionally located around the bonded device. Spacer 131 is bonded to substrate 112 and to substrate 114, over the traces 132, 134 formed on respectively substrate 112 and substrate 114. Spacer 131 is preferably about 0.1 inch (2.5 mm) thick. Substrates 112 and 114 are respectively laminated to support plates 136, 138 as described above. This embodiment has the advantage that the substrate 112, 114 thickness does not determine the spacing between the two rows of styli 132A, 134A formed by the ends of traces 132, 134, because a high accuracy spacer 131 determines this spacing. The gap 140 between the substrates may be filled with epoxy.

Another biscan embodiment (see FIG. 14) is similar to that of FIG. 13, except that IC's such as 116, 118 are wire bonded 120, 122 to traces 132, 134, control lines 128, 130 and to bonding pads 121, 123 associated with conductively plated holes 124, 126.

In another biscan embodiment, two substrates are laminated together face-to-back with a spacer between them. This embodiment, as shown in FIG. 15, is otherwise similar to that of FIG. 14, except that spacer 131 is laminated to the surface of substrate 114 on which traces 134 are formed, and to the backside of the second substrate 112. This embodiment has the advantage that the spacer 131 can be one-half the thickness of that of the embodiment of FIG. 14, which reduces the stylus row-to-stylus row distance and thereby reduces the data buffering requirements.

Figure 16:
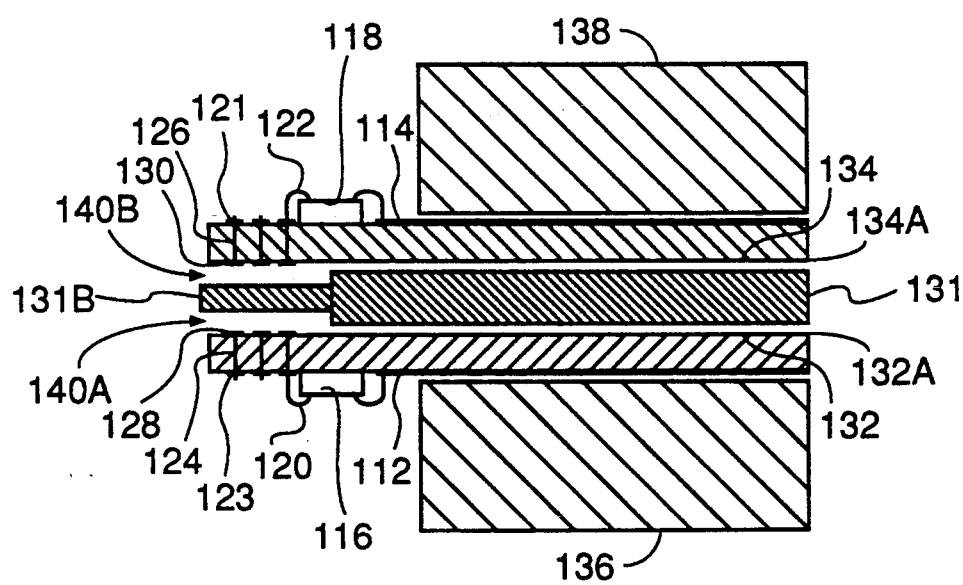

In another biscan embodiment, two substrates are laminated together back-to-back and further separated by a spacer. As shown in FIG. 16, substrate 112 has IC's such as 116 attached to its surface by TAB or wire bonding 120. As described above, the bonds 120, 122 bonded to bonding pads 121, 123 are connected by conductively plated holes 124, 126 through respectively substrate 112 and substrate 114 to control lines 128, 130. Spacer 131 is laminated to the back sides of both substrates 112, 114. Support plates 136, 138 are laminated respectively to substrates 112, 114. In this embodiment, spacer 131 includes a thinner portion 131B between the through-plated holes 124, 126. The gaps 140A, 140B are filled with epoxy or similar material.

Figure 17:
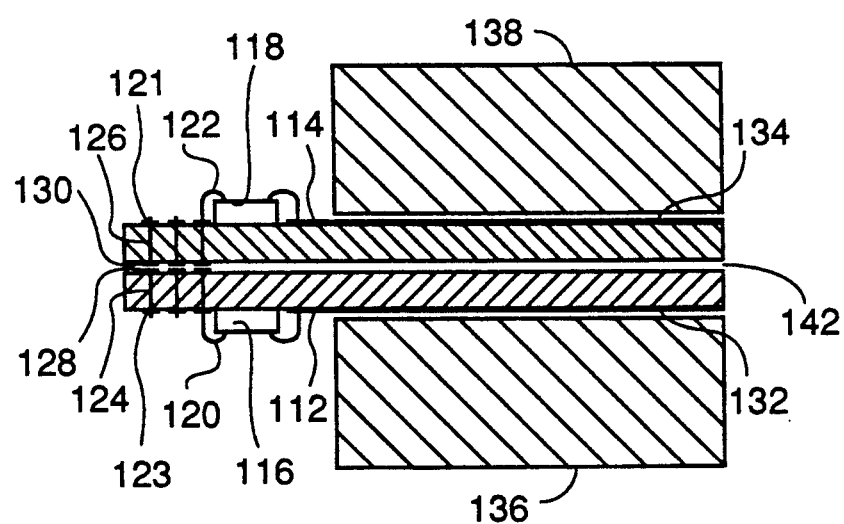

In another biscan embodiment, two substrates are laminated together back-to-back with no spacer between them. As shown in FIG. 17, substrate 112 is laminated to substrate 114. IC's 116, 118 are provided respectively on substrates 112, 114. IC's 116, 118 are TAB or wire bonded 120, 122 to bonding pads 121, 123 on respectively substrates 112, 114. As shown, TAB or wire bonds 120, 122 are connected by conductively plated holes 124, 126 respectively to control lines 128, 130. Support plates 136, 138 are provided as shown.

METHOD OF MAKING PRINTHEADS

An objective of the various printheads described above is to provide a printhead having accurate dimensions. Important dimensions include the head-to-head length accuracy (typically accurate to ±0.002 inch) and, for multiple styli row printheads, the spacing accuracy between spaced apart rows of styli (traces) which is typically ±0.0005 inch. For multiple styli row printheads, each row of styli must be of the same length to within a fraction of ±0.0002 inch for the various styli in the multiple rows to be in accurate registration after printhead assembly. Conventional printed circuit board material cannot be used directly to produce a multiple styli row printhead where the thickness of the PCB material will directly determine the distance between the spaced apart rows of styli. This is because conventional PCB material has excessive thickness variance, preventing achievement of the desired spaced apart distance tolerances. In order to obtain accurate dimensionality with respect to the distance between spaced apart rows of styli, the conventional PCB material is machined to achieve high thickness accuracy (less than ±0.0005 inch variance). Variation in the distance between adjacent styli and in the width of the styli traces is also important, but these dimensions are determined by (in one or more embodiments) a photolithography process which is highly accurate and reproducible.

As described above, conventional laminated printed it board material is inaccurate in thickness (having usually more than ±0.005 inch variance). To overcome this problem, the printed circuit board material substrate is machined, such as by grinding, to an accurately determined thickness. In one embodiment, the substrate is first laminated with aluminum-backed, 5 microns thick copper foil. This foil material is commercially available from several manufacturers such as Gould Incorporated, Foil Division of Eastlake, OH and Metalverken Foils of Vasteras, Sweden. The 5 micron copper is formed on a thick (approximately 40 micron) aluminum carrier sheet during the manufacturing of such foil. This copper/aluminum foil is laminated on both sides of the substrate so that when the aluminum backing sheet is removed during photolithographic processing, the copper foil remains bonded to the surface of the PCB. One embodiment utilizes PCB material with only one side laminated with aluminum/copper foil. However if only one side is laminated, the completed metal/PCB laminated sheet will not be flat, due to the differential expansion between the aluminum/copper foil and the epoxy glass PCB substrate.

The following describes a process to achieve the desired thickness accuracy of the PCB substrate. First a stable flat metal surface is provided as a reference surface in the machine which will be used to grind the PCB substrate. Then the substrate is fixed to this stable, flat surface. It is important to bond the substrate tightly and uniformly to this surface by either providing slots in the reference surface and holding the substrate to the reference surface by a vacuum applied to the slots (i.e., a vacuum chuck), or to adhere the substrate to the reference surface using wax or some other removable adhesive material.

The exposed (backside) substrate surface is then ground flat which creates a uniform thickness between the reference surface and the backside of the PCB material. Various grinding techniques may be used, such as conventional surface grinding or Blanchard grinding.

After grinding, the substrate is removed from the reference surface and cleaned by solvents, detergents, or other cleaning agents conventionally used in PCB photolithography processing. If wax is used as a temporary adhesive, the cleaning process removes all traces of the wax. An advantage of using vacuum slots in the reference surface for holding the substrate is that the PCB material does not become contaminated with adhesive. The protective aluminum layer is then removed by etching or other means conventionally used in PCB manufacturing, and the remaining copper layer on the frontside surface is processed by conventional PCB photolithography etching techniques to define the stylus array. This produces a single sided etched styli array with thickness accuracy of ±0.0002 inch.

Figure 19A:
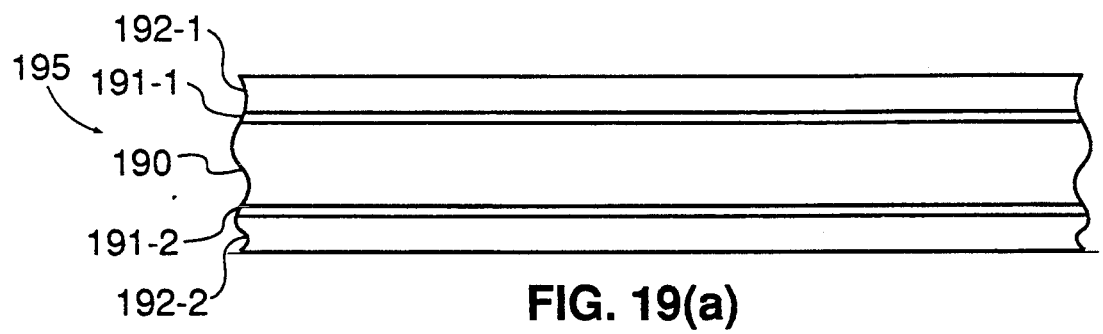
Figure 19B:
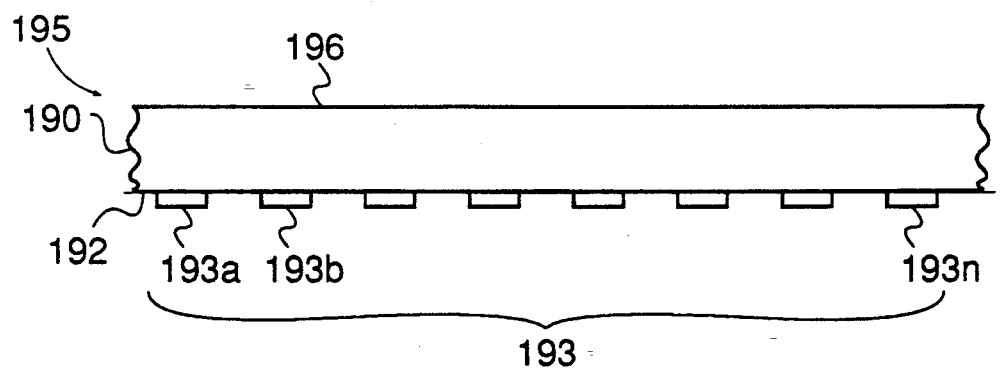

In another embodiment (see FIG. 19(a)), aluminum/copper foil (192-1 and 191-1) and aluminum copper foil (192-2 and 191-2) are laminated to substrate 190 to form PCB laminate 195. Subsequent processing entirely removes both aluminum layers 192-1 and 192-2, leaving the copper foil layers 191-1 and 191-2 laminated on both sides of the substrate. The laminate is then etched on both sides by conventional photolithography to completely remove the copper from surface 196 and to define the styli traces 193 on the other side (see FIG. 19(b)). This leaves the substrate 190 with traces 193 defined on only one side and with no metallization (copper layer) on surface 196.

Figure 19C:
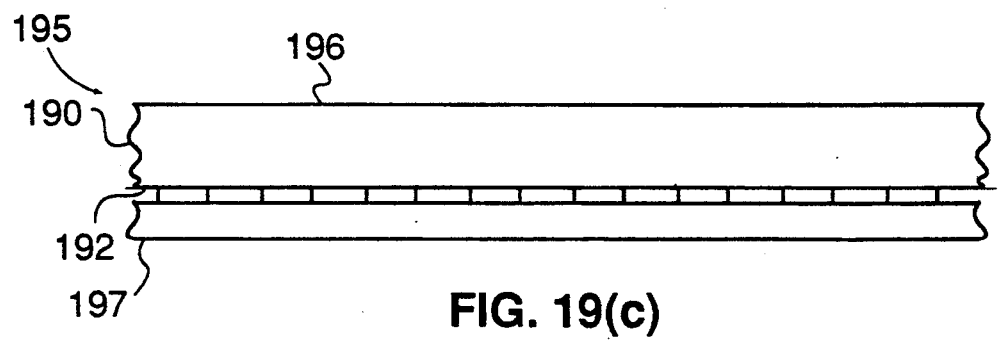

In order to grind surface 196 of substrate 190 as previously described, traces 193 on surface 192 of substrate 190 must be protected from being scratched or otherwise damaged during the subsequent grinding. In FIG. 19(c), a protective coating 197 of uniform thickness (±0.0001 inch) is applied to the surface 192 of substrate 190. Many materials may be used for the coating 197. In one embodiment a polymer coating having the desired degree of thickness uniformity is obtained using dry film photoresist, which is easily applied by commercially available laminating equipment and is also easily removed with commercially available stripping equipment. This equipment is commonly found in photolithography process facilities.

Figure 19D:
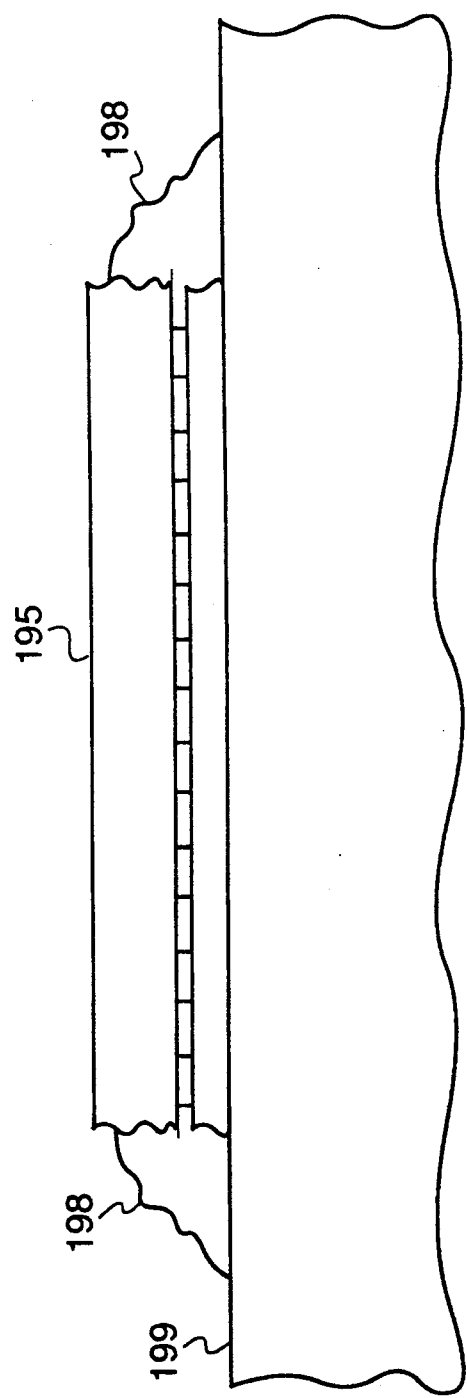

After the traces 193 are protectively coated (see FIG. 19(d)), the trace side of the substrate 190 is fastened to reference surface 199 as described above by either vacuum or by an adhesive 198 (i.e. wax) and is ground to the desired thickness as described above.

In another embodiment shown in FIG. 20(a), a double-sided substrate is fabricated which has the necessary thickness accuracy. Printed circuit board material 200 having no foil layers thereon is held with surface 206 in contact with reference surface 208 of vacuum holddown chuck 201 by vacuum applied through slot array 202. Grinding wheel 203 is moved across surface 204 to accurately grind surface 205. Grinding of substrate 200 can be accomplished by any of several grinding methods, including conventional surface grinding, Blanchard grinding or sanding. Substrate 200 is then removed from the vacuum chuck 201 and inverted. Surface 205 is then held in contact with reference surface 208 of vacuum chuck 201 and surface 206 is ground to produce surface 207 (FIG. 20(b)). This produces an unlaminated PCB material with thickness accuracy of about ±0.0002 inch. In this process the printed circuit material substrate is unlaminated and the grinding thereby creates an open structured surface. This surface could become contaminated if adhesives (as previously described) are used for attachment. This contamination if not completely removed may cause poor adhesion of the foil laminate.

Figure 20C:
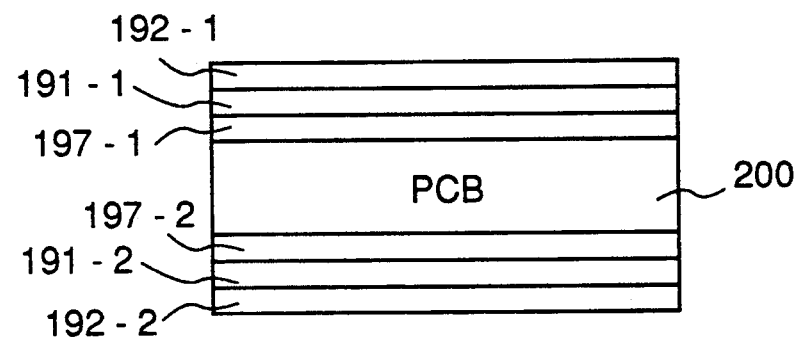

In FIG. 20(c), the ground PCB material is laminated with aluminum/copper foil carrier sheets 191-1, 192-1, and 191-2, 192-2 on both sides of the ground substrate 200 using epoxy prepreg sheets 197-1 and 197-2 as the adhesive. These adhesive sheets (known as type 106) produce an epoxy layer 0.002 inch thick. Prepreg epoxy is advantageously easy to handle and provides a uniformly distributed accurately thick epoxy layer. Any number of conventional adhesives, both prepreg and liquid, well known in the printed circuit industry, may also be used. Adhesive layers 197-1, 197-2 are thin and as accurate in thickness as possible. The use of the ground substrate 200 and thin adhesive layers 197-1, 197-2 results in a double sided printed circuit board with a finished thickness accuracy of ±0.005 inch or better.

Figure 20D:
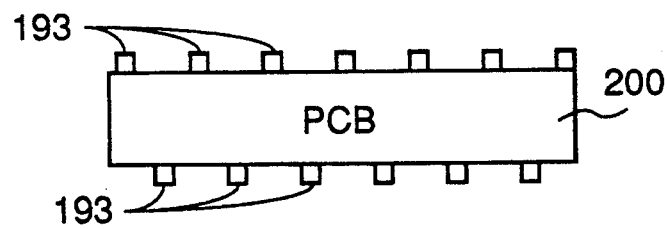

FIG. 20(d) shows PCB 208 that is processed to remove the aluminum carrier, and traces 193 are formed by conventional photolithographic processes on both sides of substrate 200.

The techniques described above allow head assemblies to be made where the spacing between two spaced apart rows of styli is controlled solely by the thickness of the intervening PCB material. In some embodiments this material is the substrate on which the styli traces are formed (as when two styli arrays are laminated back-to-back) or the spacer material can be a shim (spacer) placed between two styli arrays that are laminated face-to-face.

The length accuracy of each stylus array assures that two arrays can be accurately registered to each other to produce a bi-scan array. The overall length accuracy of a first completed head assembly to a second completed head assembly, both used in a single pass electrostatic printer, needs to be accurate to about ±0.002 inch for the print images to align with sufficient accuracy so as to avoid undesirable imaging artifacts. Because each stylus array is produced photolithographically from a stable and accurate artwork master, the resultant etched styli array will retain much of that inherent accuracy. However, during etching and other processing, length changes can 34 occur which affect the overall length accuracy of the array.

In order to minimize these effects, the following head assembly method is used. Each PCB substrate has formed on it two opposing stylus arrays etched on the same side of the substrate. The ends of the styli of the two arrays can be very close together, or even formed continuously to form a single trace. Variations between adjacent styli or a variation in overall length between the two styli array patterns which occur either in the artwork or in processing will cancel out when the two patterns are cut apart and subsequently laminated either face-to-face or back-to-back. If the patterns are laminated face-to-back, then the errors will not cancel.

During the cutting of the substrate to separate the two styli arrays, small errors may be introduced in the dimensions of the separated styli arrays either locally or in terms of overall length. To minimize this effect, it is advantageous to laminate two, separate, thick stabilizing plates to each stylus array before the two patterns are cut apart. Using this technique it is possible to produce styli arrays with length accuracies of better than ±0.0002 inch over 36 inches.

In order to laminate a bi-scan head accurately, care is taken to ensure that no stress is placed on one styli array substrate portion that is not also placed on the second styli array substrate portion. Differential stress causes one or the other substrate portions to be a different dimension or shape. The resulting error causes misregistration between the two styli arrays when they are laminated together to form the final bi-scan head assembly.

The following description of the lamination process of the head of FIG. 21 is applicable to other head embodiments herein described. The head of FIG. 21 is identical to that of FIG. 13, except that the spacer 131 of FIG. 13 is in FIG. 21 formed of two parts, spacer 131A and spacer 131B.

One embodiment of a styli array PCB substrate 223 is shown in FIG. 22(a). The substrate has two sets each of three holes 221A, 221B, 221C, and 221D, 221E, 221F to provide coarse alignment of the substrate to the laminating fixture (described below). In between the two sets of alignment holes, styli array area 225 is located together with other connecting traces 228. Connecting traces 228 connect styli array area 225 to bonding pads 227 so that ICs such as 226 can be mounted to the substrate in the various locations 224A, 224B, ... and 229A, 229B, ... during assembly. Also etched into the substrate are special alignment trace patterns 222A and 222B. FIG. 22(b) is a side view of the structure of FIG. 22(a).

Alignment traces 222B are further shown in FIG. 23 together with an alternative pattern of traces 233. The alignment traces 222A, 222B are spaced away from the stylus array 225 so as not to affect the printing operation of the styli. Alignment traces 222A, 222B are in a fixed, accurate position in reference to the styli array 225 and so serve as targets whereby the two styli arrays 225 can be brought into proper registration by observing the position of the alignment traces. These alignment traces can be in various configurations such as straight trace pattern 232, or they can be staggered as is trace pattern 233. The advantage of the straight trace pattern 232 is that the traces are composed of single continuous lines and there will be no error introduced by the artwork generator in creating them. If multiple staggered traces 233 are used there is some intrinsic error in the placement of the multiple lines caused by the artwork generator. This error is usually very small, on the order of ±0.0001 inch with most artwork generators. The accuracy that the laminating process is intended to achieve from all sources is ±0.0002 inch. Therefore any small errors, such as that produced by inaccurate artwork generation could be significant.

The final fabricated head has two rows of positionally interleaved styli. The styli of one row are directly between the styli of the second row at a distance of one half the pitch of the styli in either row. For a 400 dot per inch (dpi) head this offset results in a stagger of 0.0025 inch between adjacent styli row-to-row. This stagger and the accuracy of the stagger alignment is important in making bi-scan heads. A method to accomplish the accurate matching of the two styli arrays (which are formed into half heads during the lamination process as described above) is to form the two styli arrays on a single PCB substrate. Upon cutting the single PCB substrate 223 (FIG. 22(a)) along line 228A, two identical styli array substrates are created. Because the ends of the traces were cut from continuous traces, when the separate styli array PCBs are laminated the resulting bi-scan head will have styli that maintain registration along the entire length of the head.

Because the spaced apart styli in the final head are staggered, the two halves of styli array PCB 223 may be exposed so that the traces of the two halves have the eventual stagger built into the artwork as shown in FIG. 24. Because the stagger is only 0.0025 inch it is also possible to create straight traces that connect one side of the PCB to the other as in FIG. 22(a), and during the lamination process to offset the two half heads mechanically by 0.0025 inch to produce the required stagger. The method of FIG. 24 adds to the total error the error contribution from the artwork generator, as discussed above, to the two styli arrays, but simplifies the lamination process. If the alignment traces are straight, then no artwork caused error will occur in their positions from one half of the PCB to the other half.

The method of viewing the alignment traces of the two half heads to determine their relative position is described hereinafter. After the single PCB has been cut along line 228A and the two PCB halves have been formed into half heads, the complete head is produced by accurately aligning the two half heads so as to produce a single biscan head assembly. When the single PCB 223 is cut along line 228A so as to create two sets of styli arrays, the alignment traces are also cut so as to create two sets of alignment target styli. When the half heads are brought together to form a complete head and the alignment traces are viewed by microscope in order to align the two half heads, the two alignment trace sets are relatively far apart. If viewed at high magnification, the two sets are at opposite ends of the field of view of the microscope, making them difficult to align visually.

To overcome this problem a transparent (glass) reticle with vertical indicia that extend between the two sets of alignment marks is used. The reticle is laid up against the head being laminated. A microscope is used to view simultaneously the reticle and the alignment trace ends behind it. One half head is moved laterally until the proper registration is obtained. During this adjustment each alignment trace set 222A and 222B, is compared to the reticle independently and the head position is adjusted to produce a "best fit" whereby any variations in the traces are averaged by visual inspection with both the reticle and alignment mark sets simultaneously. When the alignment marks are in the same "best fit" relationship on both ends of the head, the head is in alignment.

Such a glass reticle is shown in part in FIG. 25(a) and in side view in FIG. 25(b). The lines on the reticle are shown in greater detail in FIG. 25(c) and consists of three independent sets of lines. The first set is lines 251A through 251N which are thin lines having a center-to-center distance of 0.0025 inch and a line width of 0.0002 inch. These lines 241A, . . . , 251N define a gap 0.0023 inch wide between which either staggered or unstaggered alignment traces can be viewed such as styli 250I. A second set of lines 252A through 252N are associated with a third set of lines 253A through 253N. These two sets of lines are staggered 0.0025 inch with respect to each other and are 0.0025 inch wide. This set of lines allows viewing of staggered alignment traces only. The third set of lines 254A through 254N consists of line pairs. These are pairs of line 0.0002 inch wide on 0.0005 inch centers. Each line pair is then replicated on 0.0025 inch centers. This creates 0.0018 inch gaps between line pairs, which gaps are used to view either staggered or unstaggered alignment traces. This particular reticle pattern was intended to allow a test of each reticle pattern to determine which pattern is best. All the lines on this reticle are perpendicular to the bottom edge of the glass, 90° ±0.028°, see FIG. 25(a).

The use of a reticle allows the viewer to align each half head by placing the alignment traces between the lines or within the spaces of the thick lines of the reticle. Further, the reticle allows the viewer to place a series of these alignment traces into a "best fit" alignment whereby any variations in the traces are averaged. This method of alignment is further enhanced because the alignment is performed about the centroid of the trace and does not align to any one edge. Most trace errors are not due to errors in absolute trace placement but rather to trace width variation caused by variations in etching parameters due to the nature of etching technology. Maximum accuracy is obtained by symmetrically placing alignment traces between two lines, thus placing the centroid of the trace width in the center of the space.

Figure 26C:
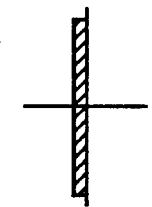
Figure 26F:
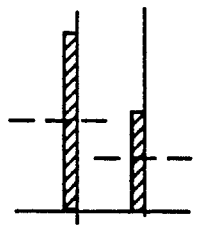
Figure 26B:
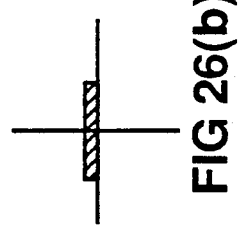
Figure 26E:
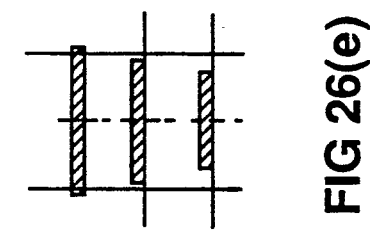
Figure 26A:
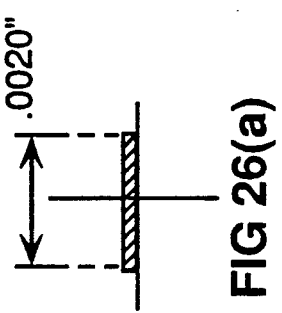
Figure 26D:
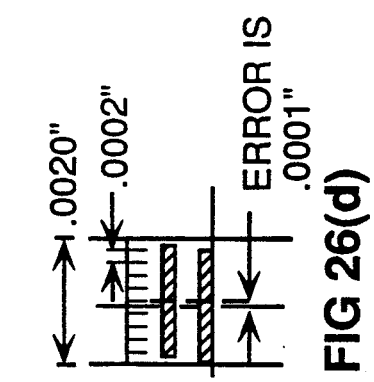

This principle is shown in FIG. 26(e) which shows an optimum alignment of traces of unequal width. FIG. 26(f) shows edge alignment and the resulting error due to width variation of the trace. FIGS. 26(a), 26(b), and 26(c) show the various alignment trace widths that result from etching variations. FIG. 26(d) shows the sensitivity of the double line portion of the reticle (see 251A through 251N of FIG. 25(c)) to styli positional variation.

The laminating fixture 2850 used for prototype production of a 36 inch long head assembly is shown in FIG. 28. The fixture 2850 includes an aluminum bottom block 2814, which is 39 inches long, 12 inches high, and 4 inches thick. The top surface 2830 of block 2814 is flat to a tolerance of ±0.002 inch. Two dowels 2820A, 2820B (each star-shaped in cross-section) are set into surface 2830 as shown in FIG. 27(a) which is a top view of FIG. 28 through line AA. These dowels 2820A, 2820B allow accurate alignment in the X direction but allow for limited adjustment in the Y direction, which is desired for aligning half heads. The dowels 2820A, 2820B are shown from the side in FIG. 27(b) and as installed (FIG. 28) they are aligned so that the adjustable direction lies along the 39 inch dimension. The dowels 820A, 2820B are located on 37±0.002 inch centers. This matches the distance from holes 221A through 221C to 221D through 221F respectively in FIG. 22(a).

The laminating fixture (FIG. 28) also includes a top plate 2811 which measures 4 inches by 4 inches by 39 inches long. Top plate 2811 is spaced 2.5 inches above bottom plate 2814 and held in position over bottom plate 2814 by two side plates 2812 and 2813, which are each 4 inches by 2 inches by 12.5 inches long and are each secured by 6¼20 screws 2852 to bottom plate 2814 and by 4¼20 screws 2860 to top plate 2811.

Each of side plates 2812, 2813 also holds one adjusting screw 2815 and 2816 located 1.025 inch above surface 2830 and having a fine pitch thread such as ⅜40 so that they are capable of adjusting the side-to-side position of the top half head to within less than 0.0001 inch. Top plate 2811 also defines a series of tapped and counter-bored holes 2817A through 2817N that accept a standard screw such as a ¼20 cap head screw 2840A through 2840N. The exposed ends of screws 2840A, . . . , 2840N put pressure on the bottom plate 2814 via the laminating plates and laminates installed in fixture 2815, and so provide the laminating pressure. Use of screws 2840A through 2840N to provide the laminating pressure is illustrative. The top plate 2811 and the bottom plate 2814 are rigidly held apart so that when the laminating screws 2840A, . . . , 2840N apply pressure to the bottom plate 2814 they will not change position and thereby reduce the laminating pressure.

Laminating fixture 2850 of FIG. 28 provides a stable platform for the lamination of the PCB substrate to the spacer, the lamination of the PCB/spacer assembly to the sideplates, and the lamination of two half head assemblies to produce the completed head. Lamination fixture 2850 controls the spacing variation between the two spaced apart staggered styli arrays on the two half heads so that the spacing is determined primarily by the thickness accuracy of the spacers or specially ground PC board rather than by the thickness of the laminating adhesive layers. Laminating fixture 2850 provides rigid, uniform pressure which insures a thin, uniform adhesive layer.

The process of lamination using fixture 2850 described above is as follows for the printhead embodiment as previously described in reference to FIG. 21.

In order to prevent contamination of the surfaces to be laminated, they are first cleaned, and then placed in a clean environment. Cleaning is accomplished with a high quality solvent such as acetone or propanol. In addition, to insure that registration accuracy of the head lamination can be attained, fixture 2850 and all head components are kept in a temperature controlled environment (±2 deg. C.) during lamination. All head components and materials should be allowed to temperature equilibrate to the environment temperature. Laminating fixture 2850 has a large thermal mass and therefore will not change temperature quickly. If components or materials are laminated before they reach the temperature of fixture 2850, a temperature gradient will occur during lamination which can result in dimensional errors.

To start the lamination process (see FIG. 30(a)) spacer 3081 is prepared by running a bead of epoxy on surface 3025, along line 3015 from point 3016 to point 3017. FIG. 30(b) is an end view of the structure of FIG. 30(a); FIG. 30(c) is a side view of the structure of FIG. 30(a). Spacer 3081 is placed on surface 2830 (see FIG. 28) of laminating fixture 2850 such that the surface 3035 of spacer 3081 is in intimate contact with surface 2830 of laminating fixture 2850 and such that dowels 2820A and 2820B protrude through holes 3082B and 3082F of spacer 3081. Epoxy adhesive (Hysol 9430) mixed with 5% Cab-O-Sil is used for lamination in one embodiment. Cab-O-Sil is a fumed silica product used to increase the viscosity of the epoxy adhesive and available from the Cabot Corp., Cab-O-Sil Division, of Tuscola, Ill. This epoxy mixture is commercially available in a premixed, degassed and frozen form from Andpak Inc. of San Jose, Calif. This frozen epoxy mixture is brought to room temperature prior to use, and has a cure time of approximately 24 hours. The quantity of adhesive used is the minimum necessary so that during lamination it spreads to cover the area of the spacer 3081 defined by the adhesive relief grooves 3085A and 3085B (see FIG. 30(c)) together with adhesive reliefs 3083A and 3083B. Control of the amount of adhesive distribution may be by a pneumatic dispensing system, although that is not required to obtain good results.

Styli array PCB substrate 223 (see FIG. 22(a)) is placed on top of spacer 3081 such that the etched traces are facing toward the spacer 3081 and such that dowels 2820A and 2820B protrude through holes 221B and 221E in PCB substrate 223. Laminating plate 3110 (FIG. 31(a)) is placed in the laminating fixture 2850 with dowels 2820A and 2820B protruding through holes 3120A and 3120B. Laminating plate 3110 is placed such that surface 3130 thereof is in contact with the back surface 2880 of PC board 223.

Laminating plate 3110 is a metal plate approximately 1 inch thick and 2 inches wide. Rubber sheet 3111 is attached to one side of plate 3110. See side view, FIG. 31(b). The rubber sheet 3111 equally distributes the laminating forces to the stylus array PC board. This rubber sheet 3130 is about 0.062 inches thick. The width and length of the rubber sheet, and so its bearing surface, equals the width and length of the epoxy bearing area of spacer 3081 which is dimension 3088 long and dimension 3089 wide (FIG. 30). This assures that the laminating pressure is distributed only over the area to be laminated. Surface 3150 is flat to ±0.002 inches.

Pressure plate 3210 (FIG. 32(a)) is placed over laminating plate 3110 of FIG. 31 so that surface 3240 (see side view FIG. 32(b)) is in contact with surface 3160 of laminating plate 3110. Screws 2840A, ..., 2840N (FIG. 28) are tightened down so that they are in contact with surface 3211. Pressure plate 3210 applies even pressure over surface 3160 of laminating plate 3110. This is accomplished because of the stiffness of plate 3210 and by rubber sheet 3250 (similar to the above described rubber sheets) which extends over the entire surface 3290 of pressure plate 3210. Holes 3220A and 3220B allow partial penetration for dowels 2820A and 2820B (FIG. 28). All metal components of the laminating fixture and laminating plates are 6061-T6 aluminum except for the screws.

Screws 2840A, ..., 2840N are ¼20 Allen head screws. A torque wrench is used to tighten all screws to a torque of 50 in-lbs. This torque together with the pitch of the ¼20 screws result in a downward pressure on the laminating plate which in turn presses on all of the other components of the laminating stack. The resultant pressure on the adhesive interface creates an adhesive film that is very thin (only about 0.0002 inch thick) and uniform in thickness. After the laminating stack has been tightened, it must set for a time that is necessary to effect a cure of the particular adhesive used. In one embodiment where Hysol 9430 epoxy is used, the cure time is 24 hours. The screws are then released and pressure plate 3210 and laminating plate 3110 removed.

The assembly process next laminates two sideplates onto the previously laminated spacer/PC board assembly. Sideplates 3310 and 3360 are shown in FIGS. 33(a), (c). Sideplates 3310, 3360 are of thick PC board material which in one embodiment is 0.250 inch thick. Sideplates 3310, 3360 also may have additional stabilizing material or other mechanical mounting components embedded within, as described above.

Each sideplate 3310, 3360 has narrow grooves 3320 and 3370 machined into surface 3321 and 3371 respectively. Grooves 3320 and 3370 are 0.040 inch wide and 0.075 inch deep. Grooves 3320 and 3370 mate with a machined bosses 3425 and 3450 (FIG. 34(a)) on boss plate 3410 and other plates described later to insure that sideplates 3320 and 3370 remain straight during lamination. The straightness accuracy of grooves 3320 and 3370 is ±0.005 inch. In addition grooves 3320 and 3370 are machined with the sideplate 3310, 3360 in an unstressed state to insure that during lamination there will be no stress induced in the sideplate 3310, 3360. If, for instance, grooves 3320 and 3370 are bowed, the boss plate 3410 will forceably straighten grooves 3320 and 3370 because boss plate 3410 is more rigid than side plates 331 and 3360. Once the lamination is complete and boss plate 3410 is removed, sideplate qroves 3320, 3370 will tend to resume their bowed condition. This will result in stress in the assembly, and a possible length accuracy error. FIGS. 33(b), 33(d) are respectively end views of the structures of FIGS. 33(a), 33(c).

To maintain the straightness accuracy of the grooves 3320 and 3370 and to achieve low cost, other mechanical accuracies of sideplates 3310, 3360 are considerably relaxed, including parallelism of the sides 3330, 3340, 3380, and 3390. After assembly, the head surface is machined from surfaces 3330 and 3380 and therefore these sides do not require initial straightness. The two sides 3340 and 3390 opposite the styli-bearing surface are not critical surfaces. The two reliefs 3301 and 3351, machined into sideplates 3310 and 3360, provide a volume for excess adhesive to flow into during lamination. Grooves 3302, 3303, 3352, and 3353 also stop excess adhesive from spreading lengthwise. The volume of these features and the volume of adhesive applied to the surfaces should be controlled to prevent the adhesive from completely filling these grooves and continuing to spread.

Recesses 3305A, . . . , 3305N are for installation of fasteners such as machine nuts or other such embedded structures useful for mounting the head to an external support.

Holes 3307A, 3307B, 3357A and 3357B in conjunction with holes 382A, 382E, 282C and 382G of spacer 381 (FIG. 30) provide alignment of these three components with respect to the dowels 2820A and 2820B of FIG. 28. Holes 3307A, 3307B, 3357A, 3357B in conjunction with holes 221A, 221D, 221C, and 221F of PC board 223 of FIG. 22 allow later alignment of the half head assemblies.

Reliefs 3315A, 3315B, 3375A, and 3375B provide clearance so that when the sideplates 3310, 3360 are placed in the laminating fixture, the sideplates 3310, 3360 do not interfere with dowels 2820A and 2820B.

Sideplate 3310 has a bead of adhesive applied to its surface 3322, along the center line of surface 3322. The bead of epoxy extends between the adhesive stop grooves 3302 and 3303. Similarly, sideplate 3360 has a bead of adhesive applied to surface 3372 along its center line and extending from adhesive stop groove 3352 to adhesive stop groove 3353. The two sideplates 3310, 3360 are then placed in the laminating fixture on top of the previously laminated spacer/PC board assembly such that the epoxy is facing down and the reliefs 3301 and 3351 face outward. Thus the two previously described straightening grooves 3320 and 3370 are facing up. Initial placement is made so that surfaces 3316A, 3316B, 3376A, and 3376B touch dowels 2820A and 2820B. Placement along the length of the sideplates 3310, 3360 is initially made by visually centering the sideplates 3310, 3360 to the PC board 223.

Boss plate 3410 (FIG. 34(a)) is placed on top of the lamination stack which includes spacer 3081, stylus array PC board 223, and the two side plates 3310 and 3360. Holes 3475A and 3475B allow dowels 2820A and 2820B to align boss plate 3410 to the previously laminated spacer/PC board assembly. Boss plate 3410 includes two short dowel pins 3415A and 3415B which engage holes 3307A and 3357A Of respectively sideplates 3310 and 3360. Boss plate 3410 also includes rubber sheets 3401, 3402, and 3403 along the length of bosses 3425 and 3450. This rubber sheet is of the same material described previously. Bosses 3425, 3450 are each 0.1 inch high and 0.035 inch wide and straight to ±0.002 inch. The height of the two machined bosses 3425, 3450 is such that bosses 3425, 3450 extend outward from surface 3486 past the surface of rubber sheet 3487 by dimension 3499 (0.038 inch) so that when placed on sideplates 3310 and 3360, grooves 3320 and 3370 are engaged along their entire length. When the laminating fixture is torqued down, the rubber 3401, 3402, 3403 is compressed by approximately 0.015 inch. These dimensions insure that the bosses 3425, 3450 do not bottom out in the 0.070 inch deep grooves 3320 and 3370 of sideplates 3310 and 3360. This tight fit of the bosses 3425, 3450 within the grooves of sideplates 3320, 3360 prevents wander of the sideplates 3310, 3360 during lamination. FIG. 34(b) shows a side view of the structure of FIG. 34(a).

Double boss plate 4010 of FIG. 40(a) is placed on top of boss plate 3410, and screws 2840A, . . . , 2840N are tightened down to a torque of 50 in-lbs using a torque wrench as previously described. FIG. 40(b) is an end view of the structure of FIG. 40(a). Double boss plate 4010 insures uniform pressure on sideplates 3310 and 3360. The fixture is then left for approximately 24 hours to allow the adhesive to fully cure.

After curing is complete, screws 2840A, . . . , 2840N are released and double boss plate 4010 and boss plate 3410 are removed. FIG. 41(a) details the lamination consisting of spacer 3081, stylus array PC board 223, and sideplates 3310, 3360. This lamination next is removed from the fixture. Electrical testing of the styli arrays is then performed to assure that no damage occurred during lamination. FIG. 41(b) is an end view of the structure of FIG. 41(a).

If the PC board traces are acceptable (pass the electrical tests), the two halves of the stylus array PC board are separated by cutting along line 4100 (see FIG. 41(a)) between sideplates 3310 and 3360. Sideplates 3310, 3360 are laminated such that there is approximately a, 0.050 inch wide gap 4120, so the cutting process involves only cutting the spacer/stylus array PC board laminate and does not cut the sideplates so long as the cutting method used involves a narrow cutting tool. A solid tungsten carbide saw blade manufactured by Robb Jack Corp. of Mountain View, Calif. was used. The blade is 4 inches in diameter and is 0.0468 inches thick with 72 teeth around the circumference.

The above-mentioned cutting procedure yields two half heads. The final head is made by laminating these two half heads together as described hereinafter.

The two half heads are each next placed in holding fixture 3510 shown in FIG. 35(a). Fixture 3510 includes two boss plates 3520, 3530 each attached to spacer 3540. FIG. 35(b) shows a top view of boss plate 3530; plate 3510 is identical. Boss plates 3520, 3530 each have a boss 3525, 3535 that runs the length of the plates 3520, 3530. The bosses hold the half heads in alignment with each other by gripping the sideplates 3310, 3360. Holes 3550A and 3550B receive dowel pins 3551A and 3551B from spacer 3540. Spacer 3540 spaces apart the boss plates 3520, 3530 by a distance equal to the thickness of the resultant head. The distance is the sum of the thicknesses of the components of the head. Boss plates 3520, 3530 are each held to spacer 3540 by screws inserted into holes 3545A, . . . , 3545N. The spacer 3540 has matching tapped holes to secure boss plates 3520, 3530 to spacer 3540.

FIG. 36 shows boss plates 3620, 3630 in conjunction with half heads 3601, 3602. Boss plates 3620 and 3630 hold half heads 3601, 3602 in alignment along the entire length of heads 3601, 3602. This holding is accomplished by the shape of bosses 3625, 3635 which are triangular in shape and wider at their base by 0.010 inches than the width of grooves 3695, 3690 respectively of half heads 3601, 3602. The height of the triangular bosses 3625, 3635 is smaller than the depth of grooves 3695 and 3690 so the bosses 3625, 3635 do not bottom out in grooves 3695, 3690. The bosses are .050 wide at the base and .050 high and triangular in shape. Vertex angle 3637, 3638 of the boss is 30°. This allows boss plates 3620, 3630 to come in contact with half heads 3601, 3602 along surfaces 3666, 3667. Pressure to accomplish this holding of the sideplates 3615, 3675 by the boss plates 3620, 3630 is provided by screws inserted through holes 3545A, . . . , 3545N (see FIG. 35). When so secured, boss plate assembly 3510 together with the half heads 3601, 3602 forms a temporary head assembly 3699 (see FIG. 36).

This assembly allows removal of the residual connecting PC board 3681, 3671 and spacer material 3651, 3661 and residual epoxy 3616, 3676 from the severed portion of the laminated half heads. The PC board ends 3671, 3681 of respectively PC board 3670, 3680 and the spacer ends 3651 and 3661 of respectively spacer 3650 and 3668 are removed by machining. To do this, head assembly 3699 is placed in an appropriate machine such as a milling machine and the aforementioned ends removed by a carbide cutter.

Without removing half heads 3601, 3602 from head assembly 3699, head assembly 3699 is next sanded and lapped to enable the embedded metal traces to become the styli of the half heads. This process uses 60 micron sandpaper as a first sanding step, 30 micron sandpaper as a second step, and 15 micron lapping film as the final step. The backing surface for the sanding and lapping film at this step in the process is a flat surface such as a surface plate. The resultant head surface will therefore be flat.

Next, the two half heads are removed from the lapping fixture and the integrated circuits and other electronic components are mounted as described above. Once it has been determined that the half heads 3601, 3602 are both fully functional, they are ready for the final lamination.

During the above-described second lamination step, adhesive is prevented from being deposited in the areas beyond adhesive stops 3085A 3085B in spacer 3081 by adhesive stop sideplates 3310 and 3360. A new adhesive stop 4220 (see FIG. 42(a)) is now machined on either end of half heads 3601, 3602 just slightly inward from alignment traces 4230, 4240. If desired, laminate 3670, 3680 and 3650, 3660 can be cut at epoxy stops 3303, and 3353 (shown in FIG. 42(a)) and 3302, 3352 on other end of head (not shown). FIG. 42(b) shows an end view of the structure of FIG. 42(a).

Bottom plate 3710 (see FIG. 37(a)) is installed in laminating fixture 2850 to support stabilizing boss 3720 (see FIG. 43). Plate 3710 is 0.250 inch thick aluminum tooling plate. Grooves 3715, 3716 (see FIG. 37(b) showing an end view of the structure of FIG. 37(a)) are machined to form boss 3720. The width of grooves 3715, 3716 exceeds the width of the sideplate of the half head assemblies, thereby providing clearance for them. Grooves 3715 and 3716 are each 0.85 inch wide. Holes 3750A and 3750B (see FIG. 37) match the placement of diamond pins 2820A and 2820B (see FIG. 28).

Half head 3601 (FIG. 36) is then placed in laminating fixture 2850 such that groove 3370 comes in contact with boss 3720 of bottom plate 3710. Half head 3602 is next prepared by applying an adhesive bead on the previously laminated spacer 3660 from the point on one end of the half head where the newly machined adhesive stop occurs to the same point on the other end of the head and centered along its width. Half head 3602 is next placed in laminating fixture 2850 so that the adhesive bead comes in contact with half head 3601. Holes 3307A and 3307B are placed so that pins 2820A and 2820B protrude through the holes. There is significant movement possible along the length of the head, and both the top half head and the bottom half head are adjusted to be approximately in the center of this adjustment range.

Adjustment plate 3810 (see FIG. 38(a)) is placed on top of the two half heads. Adjustment plate 3810, has a single boss 3820 centered and running the length of plate 3810. Surface 3830 (see FIG. 38(b) showing the structure of FIG. 38(a) in end view) has rubber sheets 3840, 3850 on each side, of the same rubber material described above and used for the same purpose. Screws 2840A, . . . , 2840N are brought down in contact with the top of adjustment plate 3810. At this time no torque is applied to screws 2840A, . . . , 2840N.

On each end of head 3910 (see FIG. 39 and FIG. 43) reticles 2510A and 2510B (see FIG. 25(a)) are placed so that surface 2540 is in contact with the bottom of groove 3716 (see FIG. 37(b)). Surface 2520, which contains the reticle lines and marks, is in contact with surface 3920 of head assembly 3910. On each end of head 3910 a microscope (not shown) is adjusted so the reticle lines and alignment traces can be viewed (see FIG. 25(c)). These alignment traces now appear as styli-like targets and are viewed though the glass substrate of reticles 2510A, 2510B of FIG. 39.

The degree of alignment of either the upper alignment traces corresponding to half head 3602, or the lower alignment traces corresponding to half head 3601 with respect to the reticle lines is effected by adjusting the lateral position of the reticle; the degree of alignment is viewed through the microscope. Each reticle is adjusted so that the alignment traces of the lower half-head 3601 present a "best fit" alignment with the marks on each reticle. Adjustment screws 2816, 2815 (see FIG. 28 and FIG. 39) are now adjusted by pushing on one end or the other of adjustment plate 3810 which is frictionally attached to upper half head 3602, to laterally move the upper half head, which will simultaneously bring the alignment traces into a "best fit" alignment with the marks of the two reticles.

It may be necessary to split the difference between a "best fit" on the left reticle and the "best fit" on the right reticle when the two reticles are correctly adjusted with respect to the bottom target styli. If this accommodation is required, it indicates a mismatch in the overall length of the two half heads. This procedure can reduce by a factor of two the effect such a mismatch would cause in the maximum styli-to-styli mis-registration since the error is centered, and so only half the total error is seen at each end.

Once the two half heads are aligned, a small amount of torque is placed on screws 2840A, . . . , 2840N and the upper half head is eased into contact with the lower half head. It may be necessary to readjust both the reticles to maintain alignment with the lower half head, and it may also be necessary to readjust the upper half head laterally using adjusting screws 2815, 2816 to maintain the "best fit" alignment.

The final torque of 50 in-lbs is set on screws 2840A, . . ., 2840N. The lamination fixture then sits undisturbed for 24 hours until the adhesive is fully cured.

When fully cured, the head is removed from fixture 2850 and a final machining of the head surface gives the head the proper contour. The head is then sanded and lapped to fully form the styli.

The above described methods are used to fabricate the printheads shown in FIGS. 6(a) to 17, as described hereinafter in additional detail.

To make the printhead of FIG. 6(a), the copper and aluminum foil layers on substrate 50 are etched as previously described to define traces as described above. Because only one stylus array is used, no grinding is performed. Once the printed circuit board 50A is fabricated, IC's 51 are mounted thereto and electrically connected using a suitable interconnect technology such as wire bonds or TAB. The assembly is then tested electrically, and then print tested by temporarily attaching together substrates 59A and 59B using temporary adhesive (such as wax) or mechanical means (such as clamps) and contouring the printhead so that it can be placed into a printer. This temporary attachment allows subsequent rework if any failed components are found. Once the print head is tested and burned in, substrates 59A, 59B are permanently laminated to the surface of printed circuit board 50 to form the final print head. The final head profile is machined by any of several well known techniques including milling, grinding and sanding.

In a second approach, the substrate 50 with the copper foil laminated thereto is etched to form traces 55 for the printhead of FIG. 6(a), and substrate 59B is laminated to substrate 50 to form a stable, rigid assembly. This provides extra support during assembly and test.

In a third approach, side plate 59B is laminated to the substrate before the etching step used to form traces 55. This process insures that any length changes which may occur during the photolithography and etching processes are controlled or eliminated by the stabilizing substrate 59B.

For the printhead of FIG. 6(c), side plates 59 are each made of several pieces 59-3, 59-4, the center of which 59-1 is fabricated from a rigid and stable material such as steel plate. These side plates are either fabricated using lamination or by casting a side plate material such as epoxy around the steel. Once fabricated, these additionally stabilized sideplates may be used for the sideplates of any of the embodiments. In addition, threaded holes 4402 or other mounting hardware are provided in one embodiment in the embedded steel plate as shown in FIG. 44(a). FIG. 44(b) shows the structure of FIG. 44(a) in an end view. Shown in these two figures are holes 4403, threads 4402 and plate 4410 in side plate 3310.

For the printhead of FIG. 7, a double sided, precision ground substrate 70 as described above is used. Traces 71, 72 are formed simultaneously and in close registration to each other on both sides of substrate 70. This allows the stylus arrays to be registered by using tooling in conjunction with master artwork. The two separate artwork masters are held in registration by the tooling and both sides of the board are imaged simultaneously. If length errors are introduced by processing they will be canceled out because both arrays will be subject to the same error. The IC's 75, 76 are attached and electrically connected as previously described. The print head is tested electrically and can then be print tested by temporarily affixing side plates 78A, 78B. After the print head is tested, reworked, and electronically burned-in, the side plates are permanently laminated thereto to form the final print head.

An alternate approach for the print head of FIG. 7 is to laminate the sideplates 78A, 78B permanently before attachment of the IC's 75, 76. The approach of mounting the sideplates 78A, 78B before assembling the IC's 75, 76 does have the advantage of a more stable structure for assembly and test. It is also possible to fabricate the head of FIG. 7 by laminating two complete sets of side plates to a substrate that has a double sided exposure of the double trace pattern as shown in FIG. 22. The head lamination is shown in FIG. 45. This would allow testing of each set of traces after lamination of side plate 4504, 4506 to form head 4508 and simultaneous lamination of side plates 4510, 4512 to form head 4514. Head 4508 is seperated from head 4514 by cutting along along line 4518. The heads 4508 and 4514 are further processed as described above.

For the printhead of FIG. 8 there is no need for substrates 80A, 80B to have accurate thickness, so no grinding of the substrates 80A, 80B is necessary. The spacing between adjacent stylus arrays 85A, 85B is provided by the spacer 88 which can either be very accurate as purchased or can be ground or machined to produce good thickness uniformity. Each sideplate/stylus array has good length accuracy, because substrates 85A, 85B are initially thick. Additionally substrates 80A, 80B may have an embedded strengthening member 89A, 89B incorporated in each substrate. As in the previous embodiments, each stylus 85A, 85B must be registered within ±0.0002 inch of its neighbor on the opposite array. In the preferred embodiment, the copper foil is laminated directly upon the thick support substrates 80A and 80B, and then etched to form the traces. The thick support substrates are stable and the dimensional length accuracy of the resulting stylus array is high. The IC's 82A, 82B are electrically connected using TAB bonding 83A, 83B. Each half head then is tested/repaired as described above. After the heads are tested, the spacer 88 is laminated between the two half head assemblies to form a final assembly. Using TAB bonding minimizes the required thickness of the spacer 88. Conventional wirebonding may be utilized, but the spacer thickness will then be required to be thick enough to accommodate the extra bond height.

For the printhead of FIG. 10, substrate 100A is made in the same manner as that of FIG. 6(a). Side plate 101 is laminated to substrate 100A before etching of the traces 108A so that substrate 100A remains stable during processing. After forming the first set of traces 108A, the substrate 100B, with a single copper layer laminated on its face and its thickness accuracy already assured by grinding as described previously, is laminated to substrate 100A. The two substrates 100A, 100B are thus locked together such that no length changes will occur. Traces 108B are then etched by photolithography on substrate 100B. The mask used in this photolithography step is aligned to the traces 108A such that when the traces 108B are etched, they will be in good alignment and registration. Protection such as a layer of photoresist (not shown) covers the traces 108A during the etching of traces 108B. Because the second set of traces 108B is formed in registration to first layer traces 108A they will automatically be registered. ICs 102A, 102B are mounted and the assembly is tested as described previously. After test, rework, and burn-in are performed, sideplate 105 is laminated to the assembly.

Figure 11:
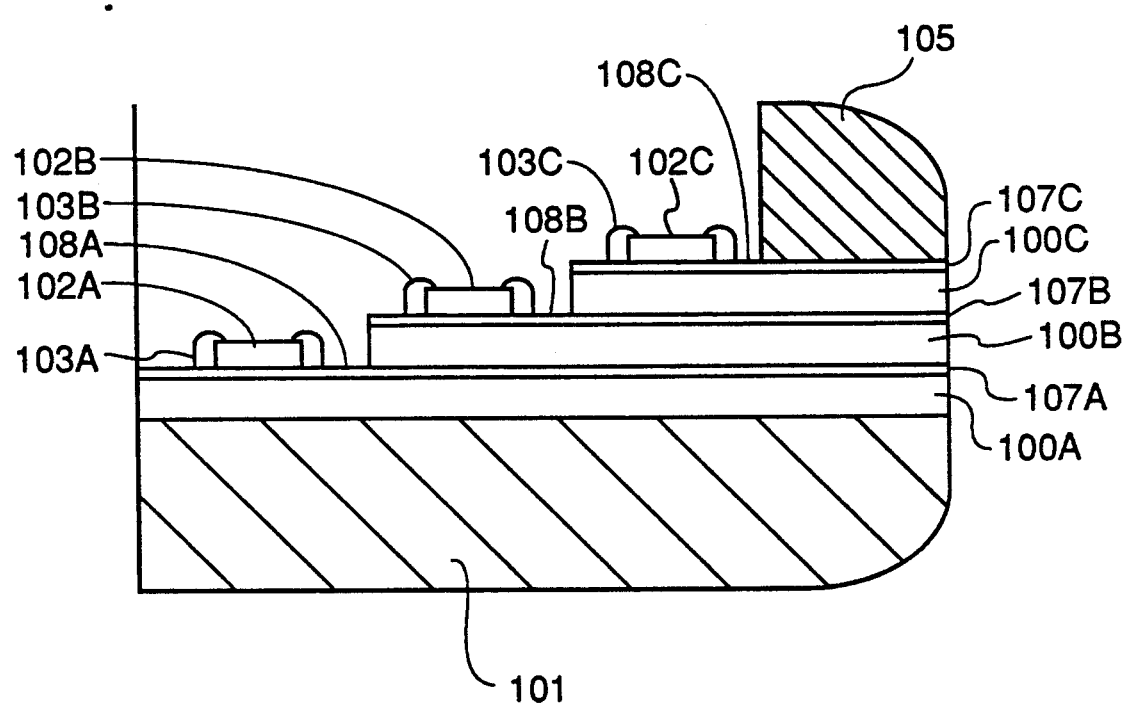

The printhead of FIG. 11 is made similarly as that of FIG. 10, but with three levels of substrates, thus forming a tri-scan head. Similarly additional layers may be added to form quad-scan and higher scan number head assemblies.

The printhead of FIG. 12 is formed by the same method as that of FIG. 10, but with only the traces 108B (no ICs) formed on the second substrate. This method reduces the length of traces 108B. Wire bonding equipment for forming electrical connections 103A, 103B can accommodate different heights of bonds such as used in this embodiment.

In the printhead of FIG. 13, neither of the substrates 112, 114 need to be of accurate thickness so no grinding or other special treatment of the substrates is required. In order to provide length accuracy of the two substrates 112, 114, they are laminated to side plates 136, 138 to stabilize the half head assemblies as described above. In addition, the two trace patterns are formed on the surface of a single substrate (see FIG. 22) opposing each other so that the stylus traces either run into each other to form a single trace or end in close proximity 0.050 inch) to each other as was described above.

One advantage of having the stylus traces run into each other is that both ends of the patterns are used to accommodate bare board test probes. This has the potential advantage that only half the pads need to be probed at each end of the pattern, thus reducing by a factor of two the density of the test probes. After both patterns are etched on the surface of the substrate, two side plates (as shown in FIG. 33) are laminated onto the substrate. After the sideplate adhesive has cured the substrate is cut in half creating two half head assemblies which will match each other in length accuracy as was described above. Next, IC's 116, 118 can be assembled using TAB bonds 121, 123 and the two half head assemblies are tested, print tested, reworked, and burned-in. To complete the print head assembly the two half heads are laminated together with spacer 131 between them. Spacer 131 has accurate thickness accuracy either as purchased or due to additional machining or grinding.

Figure 14:
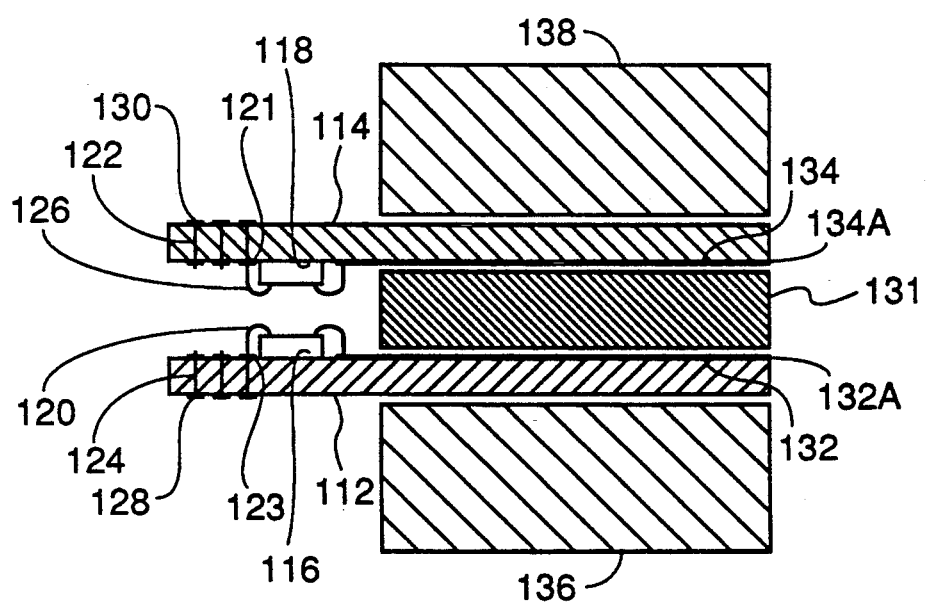
Figure 15:
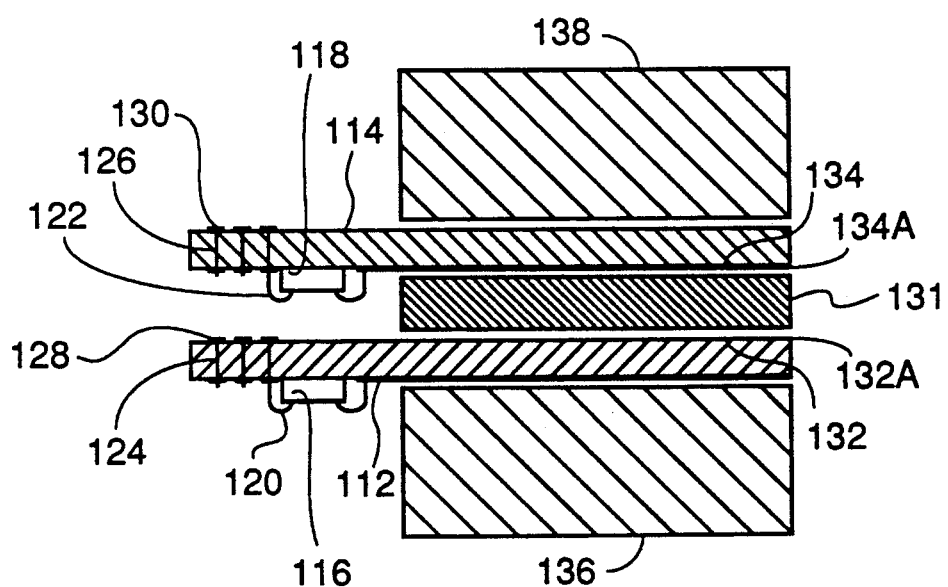

The printhead of FIG. 14 is formed similarly to that of FIG. 13, except that wirebonding provides the electrical connections 120, 122. A thicker spacer 131 accommodates the higher bond heights.

The printhead of FIG. 15 is formed similarly to that of FIG. 10, except that only substrate 128 and spacer 131 need to have accurate thickness accuracy. Each half head is assembled and tested and the two half head assemblies are laminated with spacer 131 interposed between them to form the head assembly.

For the printhead of FIG. 16, substrates 132, 134 and spacer 131 all have accurate thickness achieved by grinding the substrates as previously described. Spacer 131 may be relieved at the end 131B to allow signal lines 130 and 128 to be formed on the backsides of the PC Boards. Otherwise the head is assembled identically to FIG. 13.

The printhead of FIG. 17 is assembled identically to the printhead of FIG. 16 except that no spacer is used. If there are any signal lines or other circuit elements present on the backsides of the substrates, then these elements are essentially co-planar with the substrate and insulated with a thin polymer layer or some other suitable insulator (not shown).

The above description of the invention is illustrative and not limiting. Other embodiments incorporating the principles of the invention will be apparent to those skilled in the art in light of this disclosure and the appended claims.

We claim:

1. A method for making a high resolution electrostatic printhead without multiplexing comprising the steps of:
   providing a substrate material narrow in width;
   grinding the material to a particular thickness;
   laminating a copper foil layer to at least one surface of the material;
   etching the copper foil layer to form conductive traces; and
   attaching integrated circuit die to the material so as to electrically contact the traces.

2. The method of claim 1, wherein the step of grinding is prior to the step of laminating.

3. The method of claim 1, wherein the step of laminating is prior to the step of grinding.

4. The method of claim 1, further comprising the step of laminating a second copper foil layer to the other surface of the material.

5. The method of claim 1, wherein the step of grinding includes holding the material to a flat plate.

6. The method of claim 1 wherein the step of grinding is after the step of etching.

7. The method of claim 4, further comprising the step of etching the second copper foil layer to form traces therein.

8. The method of claim 1, wherein the step of laminating comprises adhering the copper foil layer to the material with an epoxy.

9. The method of claim 1, further comprising the step of laminating a support plate to at least one side of the material.

10. The method of claim 9, wherein the step of laminating is prior to the step of etching.

11. The method of claim 1, further comprising the steps, after the step of attaching, of:
    temporarily mounting the material on a support; and
    testing the integrated circuit die and traces.

12. The method of claim 1, wherein the material is printed circuit board material.

13. The method of claim 1, wherein the step of etching comprises etching two sets of juxtaposed conductive traces, and further comprising the steps of:
    cutting the substrate material into two portions, one set of conductive traces being on each portion; and
    fastening together the two portions stacked one-on-another to form a biscan printhead.

14. The method of claim 13, further comprising the steps of aligning the two portions, prior to the step of fastening, by a transparent reticle.

15. The method of claim 1, further comprising the steps, after the step of grinding, of:
    laminating two spaced-apart support plates to one surface of the material;
    then cutting the material into two portions, the cut being between the two support plates thereby forming two half printheads; and
    then fastening together the two half-heads to form a high resolution printhead.

16. The method of claim 1, wherein in the step of providing, the width of the material is less than about 6 inches.

17. The method of claim 6, wherein in the step of etching, 200 conductive traces are formed per inch of length of the material.

18. A method of making a high resolution electrostatic printhead without multiplexing comprising the steps of:
providing printed circuit board material narrow in width;
holding the material to a flat plate;
grinding the material to a particular thickness while being held on the flat plate;
laminating a copper foil layer to both sides of the material;
etching traces by photolithography in the copper foil layer on at least one side of the material;
attaching integrated circuit die to the material so as to electrically connect the integrated circuit die to the traces; and
laminating a support plate to the material.

19. The method of claim 18, further comprising the step of embedding the integrated circuit die in a protective material after the step of attaching the integrated circuit die.

20. The method of claim 18, wherein the step of laminating a support plate comprises the steps of:
forming a groove in the support plate;
providing a fixture having a boss;
holding the material in the fixture; and
inserting the boss in the groove while laminating the support plate.

21. The method of claim 18, further comprising the step of forming a contour on an edge of the material.

22. A method of forming an electrostatic printhead comprising the steps of:
providing first and second substrates;
laminating a copper foil layer to at least one surface of each substrate;
etching each copper foil layer to form conductive traces;
attaching integrated circuit die to the material so as to electrically connect the traces; and
attaching together the first and second substrates by a spacer having a particular thickness therebetween.

23. A method of making a high resolution non-multiplexed electrostatic printhead comprising the steps of:
providing a substrate material narrow in width;
forming the material to a particular thickness;
then forming the conductive traces on the material;
then laminating two s-aced-apart support plates to one surface of the material;
then cutting the material into two portions, the cut being between the two support plates thereby forming two half printheads; and
then fastening together the two half-heads into one printhead.

* * * * *